(12) United States Patent
Olarig et al.

(10) Patent No.: US 11,860,672 B2
(45) Date of Patent: Jan. 2, 2024

(54) METHOD FOR SUPPORTING ERASURE CODE DATA PROTECTION WITH EMBEDDED PCIE SWITCH INSIDE FPGA+SSD

(71) Applicant: Samsung Electronics Co., Ltd., Suwon-si (KR)

(72) Inventors: Sompong Paul Olarig, Pleasanton, CA (US); Fred Worley, San Jose, CA (US); Oscar P. Pinto, San Jose, CA (US)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 16/260,087

(22) Filed: Jan. 28, 2019

(65) Prior Publication Data

US 2019/0310957 A1 Oct. 10, 2019

Related U.S. Application Data

(63) Continuation-in-part of application No. 16/226,629, filed on Dec. 19, 2018, now Pat. No. 10,838,885, (Continued)

(51) Int. Cl.
*G06F 13/40* (2006.01)
*G06F 13/16* (2006.01)
(Continued)

(52) U.S. Cl.
CPC .......... *G06F 13/1668* (2013.01); *G06F 3/061* (2013.01); *G06F 3/065* (2013.01);
(Continued)

(58) Field of Classification Search
CPC .. G06F 13/4022; G06F 13/1668; G06F 3/061; G06F 3/065; G06F 3/0683; H03M 13/154
(Continued)

(56) References Cited

U.S. PATENT DOCUMENTS 8,417,880 B2 4/2013 Lam et al.
8,543,752 B2 9/2013 Cong et al.
(Continued)

FOREIGN PATENT DOCUMENTS

CN 103262019 A 8/2013
CN 103765370 A 4/2014
(Continued)

OTHER PUBLICATIONS

Chen, Zheng Guo, et al. "Using FPGA to Accelerate Deduplication on High-Performance SSD." Advanced Materials Research, vol. 1042, Trans Tech Publications, Ltd., Oct. 2014, pp. 212-217 (1 page included). Crossref, https://doi.org/10.4028/www.scientific.net/amr.1042.212. (Year: 2014).*

(Continued)

*Primary Examiner* — Farley Abad
*Assistant Examiner* — Brooke J Taylor
(74) *Attorney, Agent, or Firm* — Renaissance IP Law Group LLP

(57) ABSTRACT

A topology is disclosed. The topology may include at least one Non-Volatile Memory Express (NVMe) Solid State Drive (SSD), a Field Programmable Gate Array (FPGA) to implement one or more functions supporting the NVMe SSD, such as data acceleration, data deduplication, data integrity, data encryption, and data compression, and a Peripheral Component Interconnect Express (PCIe) switch. The PCIe switch may communicate with both the FPGA and the NVMe SSD.

28 Claims, 17 Drawing Sheets

Related U.S. Application Data which is a continuation of application No. 16/207,080, filed on Nov. 30, 2018, now Pat. No. 10,635,609.

(60) Provisional application No. 62/745,261, filed on Oct. 12, 2018, provisional application No. 62/638,040, filed on Mar. 2, 2018.

(51) Int. Cl.
- *G06F 13/42* (2006.01)
- *H03M 13/15* (2006.01)
- *G06F 3/06* (2006.01)

(52) U.S. Cl.
CPC ........ *G06F 3/0683* (2013.01); *G06F 13/4022* (2013.01); *G06F 13/4282* (2013.01); *H03M 13/154* (2013.01); *G06F 2213/0026* (2013.01)

(58) Field of Classification Search
USPC .......................................................... 710/5
See application file for complete search history.

(56) References Cited

U.S. PATENT DOCUMENTS

| | | | |
|---|---|---|---|
| 8,560,792 B2 | 10/2013 | Jennas, II et al. | |
| 8,650,359 B2 | 2/2014 | Vaghani et al. | |
| 8,954,657 B1 | 2/2015 | Asnaashari et al. | |
| 8,954,658 B1 | 2/2015 | Asnaashari et al. | |
| 8,966,164 B1 | 2/2015 | Asnaashari et al. | |
| 9,009,397 B1 | 4/2015 | Asnaashari et al. | |
| 9,208,032 B1 | 12/2015 | McAlister et al. | |
| 9,223,734 B2 | 12/2015 | Subramaniyan et al. | |
| 9,298,648 B2 | 3/2016 | Johnson et al. | |
| 9,311,110 B2 | 4/2016 | Tamir et al. | |
| 9,336,173 B1 | 5/2016 | Sodke et al. | |
| 9,477,466 B2 | 10/2016 | Nishimoto et al. | |
| 9,678,842 B2 | 6/2017 | Zhang et al. | |
| 9,712,619 B2 | 7/2017 | Malwankar et al. | |
| 9,792,047 B2 | 10/2017 | Asnaashari et al. | |
| 9,792,073 B2 | 10/2017 | Asnaashari et al. | |
| 9,801,219 B2 | 10/2017 | Sonnino et al. | |
| 9,880,929 B2 | 1/2018 | Roesch | |
| 9,940,280 B1 | 4/2018 | O'Brien et al. | |
| 9,959,062 B1* | 5/2018 | Piszczek | G06F 3/0619 |
| 10,007,443 B1* | 6/2018 | Rajadnya | G06F 3/0613 |
| 10,101,924 B2 | 10/2018 | Asnaashari et al. | |
| 10,255,134 B2 | 4/2019 | Olarig et al. | |
| 10,275,180 B2 | 4/2019 | Ballapuram et al. | |
| 10,382,203 B1 | 8/2019 | Loladia et al. | |
| 10,481,834 B2 | 11/2019 | Olarig et al. | |
| 10,635,609 B2 | 4/2020 | Olarig et al. | |
| 10,956,346 B1* | 3/2021 | Ben-Yehuda | G06F 13/4027 |
| 2005/0066118 A1 | 3/2005 | Perry et al. | |
| 2006/0284982 A1 | 12/2006 | Bigioi et al. | |
| 2009/0037609 A1 | 2/2009 | Riley et al. | |
| 2009/0037617 A1 | 2/2009 | Riley et al. | |
| 2010/0241781 A1 | 9/2010 | Wetzel et al. | |
| 2011/0082949 A1 | 4/2011 | Matthews et al. | |
| 2011/0125615 A1 | 5/2011 | Shirbabadi et al. | |
| 2012/0102580 A1 | 4/2012 | Bealkowski | |
| 2013/0054889 A1 | 2/2013 | Vaghani et al. | |
| 2014/0244843 A1 | 8/2014 | Cao et al. | |
| 2014/0351654 A1 | 11/2014 | Zhang et al. | |
| 2015/0095554 A1 | 4/2015 | Asnaashari et al. | |
| 2015/0095555 A1 | 4/2015 | Asnaashari et al. | |
| 2015/0143038 A1 | 5/2015 | Asnaashari et al. | |
| 2015/0169230 A1 | 6/2015 | Asnaashari et al. | |
| 2015/0169244 A1 | 6/2015 | Asnaashari et al. | |
| 2016/0036623 A1 | 2/2016 | Clarkson | |
| 2016/0062914 A1 | 3/2016 | Um et al. | |
| 2016/0259597 A1* | 9/2016 | Worley | G06F 3/0683 |
| 2017/0031835 A1 | 2/2017 | Serebrin | |
| 2017/0052916 A1 | 2/2017 | Kollu | |
| 2017/0124077 A1 | 5/2017 | Watanabe et al. | |
| 2017/0177222 A1 | 6/2017 | Singh et al. | |
| 2017/0185350 A1 | 6/2017 | Waidhofer et al. | |
| 2017/0322898 A1 | 11/2017 | Lin et al. | |
| 2018/0150256 A1* | 5/2018 | Kumar | G06F 9/4881 |
| 2018/0210785 A1 | 7/2018 | Olarig et al. | |
| 2018/0321876 A1 | 11/2018 | Ballapuram et al. | |
| 2018/0322285 A1 | 11/2018 | Plarig et al. | |
| 2018/0341619 A1* | 11/2018 | Slik | G06F 3/067 |
| 2018/0357018 A1 | 12/2018 | Karr et al. | |
| 2018/0373669 A1 | 12/2018 | Nash et al. | |
| 2019/0005176 A1* | 1/2019 | Illikkal | G06F 30/331 |
| 2019/0042090 A1 | 2/2019 | Raghunath et al. | |
| 2019/0050289 A1 | 2/2019 | Kachare et al. | |
| 2019/0272215 A1 | 9/2019 | Olarig et al. | |
| 2019/0310958 A1 | 10/2019 | Pinto et al. | |
| 2020/0042252 A1 | 2/2020 | Olarig et al. | |
| 2020/0065285 A1* | 2/2020 | Panella | G06F 13/4243 |
| 2020/0379930 A1 | 12/2020 | Brownell et al. | |
| 2022/0365683 A1 | 11/2022 | Olarig et al. | |

FOREIGN PATENT DOCUMENTS

| | | | |
|---|---|---|---|
| CN | 104683430 A | 6/2015 | |
| CN | 105721621 A | 6/2016 | |
| EP | 2711845 A2 | 3/2014 | |
| JP | 2014063497 A | 4/2014 | |
| JP | 2014071478 A | 4/2014 | |
| JP | 2018045688 A | 3/2018 | |
| TW | 201250486 A | 12/2012 | |
| TW | 201823916 A | 7/2018 | |
| WO | WO-2018201249 A1 * | 11/2018 | G06F 15/76 |

OTHER PUBLICATIONS

Comparing and Combining GPU and FPGA Accelerators in an Image Processing Context; Bruno da Silva et al., Erasmus University College, IWT Dept., Brussels, Belgium (Year: 2013).*

Aggarwal, Vaneet et al., Sprout: A functional caching approach to minimize service latency in erasure-coded storage, Jul. 21, 2017, 16 pages.

Halalai, Raluca et al., "Agar: A Caching System for Erasure-Coded Data", 37th IEEE International Conference on Distributed Computing Systems, Jun. 2017, 12 pages.

Office Action for U.S. Appl. No. 16/207,080, dated Jun. 6, 2019.

Sathiamoorthy, Maheswaran, "Dummies Guide to Erasure Coding", Jul. 1, 2012, 5 pages.

Office Action for U.S. Appl. No. 16/226,629, dated Feb. 27, 2020.

Office Action for U.S. Appl. No. 16/435,442, dated Mar. 5, 2020.

Notice of Allowance for U.S. Appl. No. 16/207,080, dated Dec. 17, 2019.

Notice of Allowance for U.S. Appl. No. 16/435,442, dated Dec. 31, 2020.

Final Office Action for U.S. Appl. No. 16/435,442, dated Sep. 17, 2020.

Notice of Allowance for U.S. Appl. No. 16/226,629, dated Jul. 8, 2020.

Office Action for U.S. Appl. No. 17/230,978, dated Apr. 14, 2023.

* cited by examiner

METHOD FOR SUPPORTING ERASURE CODE DATA PROTECTION WITH EMBEDDED PCIE SWITCH INSIDE FPGA+SSD

RELATED APPLICATION DATA

This application is a continuation-in-part of U.S. patent application Ser. No. 16/226,629, filed Dec. 19, 2018, which is a continuation of U.S. patent application Ser. No. 16/207,080, filed Nov. 30, 2018, which claims the benefit of U.S. Provisional Patent Application Serial Nos. 62/745,261, filed Oct. 12, 2018 and 62/638,040, filed Mar. 2, 2018, all of which are incorporated by reference herein for all purposes.

FIELD

The inventive concepts relate generally to computer systems, and more particularly to Erasure Coding within Peripheral Component Interconnect Express (PCIe) switches.

BACKGROUND

Currently, most Non-Volatile Memory Express (NVMe)-based Solid State Drives (SSDs) with Redundant Array of Independent Disks (RAID) protection are done through external PCIe Add-In-Cards (AICs). To optimize bus bandwidth between the host CPU and the AIC RAID controller, the busses usually support X16 PCIe lanes. However, due to physical limitations of the standard form factor of PCIe cards only a small number of U.2 connectors—currently the preferred connector for NVMe SSDs—are supported by each AIC RAID controller: usually just two or four U.2 connectors.

In order to support up to 24 NVMe SSDs inside a 2U chassis, 6 AIC RAID controllers are required, resulting in 6 different RAID domains. This configuration adds cost and complexity to manage the 6 RAID domains. Further, each AIC RAID controller currently costs approximately $400. Hence, the entire RAID solution for even a single 2U chassis exceeds $2,400 just for the AIC RAID controllers, before factoring in the cost of the NVMe SSDs.

NVMe SSD adoption in the enterprise market has been limited due to lack of cost-effective RAID data protection of large data sets. Software RAID solutions are acceptable for relative small sets of data, but not for Big Data.

There are also other problems with using AIC RAID controllers:
1) As noted above, having multiple RAID domains inside the chassis increases the management complexity.
2) As a corollary to the RAID domain management complexity, the chassis does not have a single RAID domain, which would be preferable.
3) The central processing unit (CPU) needs to support a large number of PCIe lanes: 16 PCIe lanes per AIC RAID controller times 6 AIC RAID controllers per chassis=96 PCIe lanes just for the AIC RAID controllers. Only high end and much more expensive CPUs currently support this many PCIe lanes.
4) With each AIC RAID controller potentially drawing 25 Watts, 6 AIC RAID controllers increase the power consumption by up to 150 Watts per chassis.
5) Chassis tend to have only a few PCIe slots, potentially limiting the number of AIC RAID controllers that may be added and indirectly reducing the number of NVMe SSDs that may be subject to RAID protection in the chassis.
6) Software RAID solutions tend to support relatively few RAID levels, and increase the overhead on the CPU.
7) When used over a network, SSD accesses may be slower due to the time required to send data accesses across the network. Further, in some example, networked storage may require software RAID implementations, increasing the overhead on the CPU.

A need remains for a way to support Erasure Coding with large numbers of storage devices without the limitations imposed by AIC RAID controllers and software RAID solutions.

DETAILED DESCRIPTION

Figure 1:
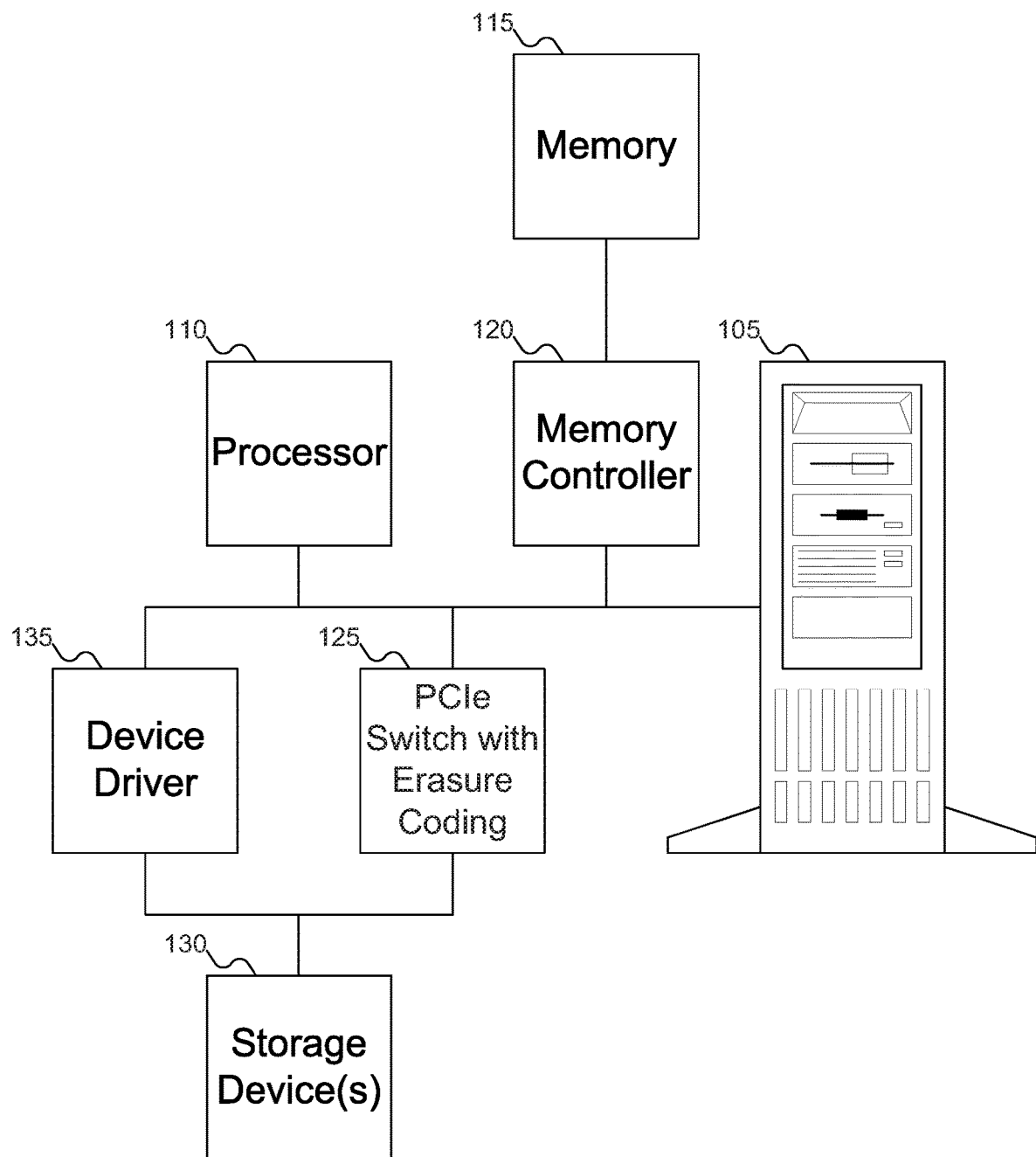
FIG. 1 shows a machine including a Peripheral Component Interconnect Express (PCIe) switch with Look-Aside Erasure Coding logic, according to an embodiment of the inventive concept.

Reference will now be made in detail to embodiments of the inventive concept, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first module could be termed a second module, and, similarly, a second module could be termed a first module, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Field Programmable Gate Arrays (FPGAs) have enough intelligence, computing resources, and high speed Input/Output (I/O) connectivity to perform Redundant Array of Independent Disks (RAID)/Erasure Code parity generation and data discovery when necessary. FPGA+Solid State Drives (SSDs) may require an embedded Peripheral Component Interconnect Express (PCIe) switch to support more co-controllers/processors, such as one or more SSDs, Graphical Processing Units (GPUs), Tensor Processing Units (TPUs) etc. Multiple co-processors also require more channels of NAND flash memory.

Embodiments of the present invention support erasure codes within the PCIe switch inside the FPGA. Embodiments of the inventive concept may also allow users via Baseboard Management Controllers (BMC) to configure the RAID engines (inside FPGA) remotely. These standard interfaces, such as PCIe (used as control plane) or System Management Bus (SMBus), may be used by the users to pre-configure the RAID-on-a-Chip (RoC) or erasure code controller. Being able to configure storage devices in this manner may be useful for users who are leasing the computing resources: when done, the users may want to destroy the data quickly before the next user may use the same computing resources. In this case, the BMC may send erase commands to all embedded PCIe switches inside multiple FPGA+SSDs. Upon receiving the erase command, the FPGA's RoC/erasure code controller will erase both data and parity data specified by the command Logical Block Address (LBA) ranges.

Today, PCIe switches expose virtual switches or grouping where more than one switch is exposed to the admin. These configurations are useful in virtualized environments when network, CPU-GPU, FPGA and storage behind these virtual domains may be grouped. This virtual grouping may be applied to storage by creating RAID sub-groups that are exposed to the user groups for virtualized environments in one embodiment or alternatively used for RAID grouping such as RAID 10, RAID 50, RAID 60, etc. These layered RAID groups create small groups and apply an additional RAID layer on top to create a larger RAID solution. The virtual switches manage the smaller RAID group while the main switch manages the overall RAID configuration.

With the data protection scheme enabled and management being kept closer to the storage units, the solution provides benefits which are great differentiators in the enterprise and data-center environments. Embodiments of the inventive concept offer higher density and performance at lower power consumption.

The solution may consist of one embedded PCIe switch with integrated RoC or Erasure Code controller that is in the data path between the host and the SSDs. The PCIe switch+ RoC component may be managed by the BMC for configuration and control and may expose an interface to software for specific configurations before releasing to the new users.

When operating in Erasure Code/RAID mode, all incoming Non-Volatile Memory Express (NVMe) or NVMe over Fabric (NVMe-oF) traffic to or from the embedded PCIe switch may be snooped by the RoC or Erasure Code controller (which may be termed a Look-Aside RoC or Erasure Code controller). The RoC or Erasure Code controller may determine whether or not the data in the traffic results in a cache hit to its local cache. If there is a cache hit, then there is no need to forward the transaction (read or write) to the appropriate SSD. The requested read data may be provided directly by the RoC's cache. The write data will be updated directly to the RoC's local cache and mark as "modified" or "dirty" data.

For the SSDs, the parity may be distributed among the connected SSDs. For example, if RAID 4 is selected the last SSD may be used for storing the parity only and the other SSDs are used to store the data.

By having an external PCIe switch between host and SSD devices, virtual I/O addresses may be supported. In this case, a primary RoC as part of the host PCIe switch may virtualize all SSDs addresses. In other words, the addresses and devices are not visible to the host operating system (OS). In such embodiments of the inventive concept, peer-to-peer transactions between at least two SSDs who are peers are allowed and supported. This option may enhance some forms of redundancy and/or availability of SSDs by striping across more than one SSD. In this mode, the embedded RoC or Erasure Code Controller within the FPGAs may be disabled (if present). The only RoC/Erasure Code Controller that is enabled is in the host PCIe switch.

If storage devices operate in single device mode, all incoming NVMe/PCIe traffic may be forwarded to the SSD which has the requested data.

If pairing mode is enabled, the RoC/Erasure Code controller may determine whether the requested data's address belongs to its own BAR domain. In this case, the transaction may be completed by the local RoC. For write transactions, a posted write buffer or write cache (using some embedded SRAM or DRAM) may be used. If there is a write cache hit (a previous write has occurred and the data is still stored in the write cache buffer), processing depends on the write cache policy. For example, if the cache policy is write-back, then the write command will be completed and terminated by the RoC cache. If the cache policy is write-through, then the write command will be completed when the write data has been successfully transferred to the drive. In this case, the RoC may terminate the write command to the host as soon as write data has been updated to its local cache successfully.

The RoC may virtualize a bunch of devices that it claims and present them as a single device or fewer devices that are protection against data or device failures. The data protection scheme may be distributed in nature across a bunch of them so that data may be rebuilt from other devices when on any device that has data loss. RAID and Erasure Coding (EC) are commonly adopted data protection using distributed algorithms to protect for such losses.

To virtualize devices under RoC, the devices may be terminated at the RoC and not be visible to the host. That is, the PCIe switch may be connected to all known devices, and the RoC may be connected to the switch. To manage the devices, the RoC may discover and configure the individual devices through the PCIe switch. Alternately, the RoC may be pass-through in default/factory mode and let host software configure the RoC. The host software may be specially tailored to work with the PCIe switch+RoC hardware. Once configured, the RoC may terminate the devices and make them not visible to host.

The PCIe switch+RoC may be configured in many ways for RAID and EC modes. There may be additional PCIe switches downstream to create larger fan-out configurations to support more devices. Additionally, more than one such combination of hardware may be associated together to form a larger setup. For example, 2 PCIe switches+RoC may work together to form alternate configurations. Alternately, these 2 PCIe switches+RoC may work separately.

When the PCIe switches+RoC work separately, each RoC and PCIe switch combination is instantiated as a separate device by the host. The host here may have standard OS drivers that will see all the SSDs virtualized by the RoC. For example, assume there are 6 SSDs populated below the PCIe switch and 1 SSD exposed by the RoC to the host; the second RoC and PCIe switch combination may also expose a similar setup to the host. 2 SSDs being discovered by the host for all RoC controller devices (one for each). Each RoC controller may expose a separate device space for each SSD exposed. All devices backing this exposed SSD and behind it may not be seen by the host. The RoC manages the hardware I/O path through the PCIe switch(es).

This method may be used in an active-passive setup, where, the second controller is a backup path in case the first controller path fails. The host only actively uses the first controller here and no I/O is sent to the second RoC controller. If an active-passive setup is used, the 2 RoC controllers may internally replicate the data. This may be done by the first active controller sending all writes to the second RoC controller as in a RAID 1 data protection setup.

There may be a second active-passive setup, where the second RoC and PCIe switch may not have any of its own SSDs behind it and may just be the backup controller path. In this case, no I/O may be sent between the 2 RoC controllers since they refer to the same set of SSDs. This is a standard active-passive setup.

The SSDs behind each RoC may also not co-ordinate with each other, in which case the 2 SSDs are treated as separate SSDs with no protection shared between them.

In yet another usage, both paths may be used in an active-active setup. This setup may be used for load-balancing purposes. Here, the host may use both paths in a way that a special software layer is used to distribute the I/O workload. The two RoC controllers may co-ordinate their writes between them so as to keep both SSDs in sync. That is, each SSD from each RoC controller may contain identical data as in RAID 1 setup.

In yet another configuration, the 2 RoC controllers communicate in a way that keeps their I/O distributed in a custom setup. Here, only one RoC controller is used by the host: the other RoC controller is connected to the first RoC controller. The first RoC controller may expose one or more virtual NVMe SSDs to the host. The 2 RoC may be setup to divide the odd and even LBA spaces between them. Since NVMe utilizes a pull model for data from the device side, only commands are sent by the host to the SSDs exposed by the first RoC controller. The RoC controller may send a copy of the message to the second RoC controller through its side channel connection. The RoC controllers may be setup to service either odd or even only LBAs, stripes, zones, etc. This setup provides internal load balancing that need not be managed by the host and may be transparently managed by the RoC and PCIe switch combinations. The individual RoC controllers may process only the odd or even LBA ranges and satisfy the request to the host buffers. Since both RoC controllers have access to the host, they may fill in the data for their odd or even pairs.

For example, the host might send a command to read four consecutive LBAs 0-3 to the first RoC controller, which sends a copy to the second RoC controller. The first RoC controller then reads the data for LBAs 0 and 2 from the first two SSDs on its PCIe switch, while the second RoC controller reads the data from LBAs 1 and 3 from the first two SSDs on its PCIe switch. The second RoC controller may then report it has completed its operations to the first RoC controller, which may then report the transaction as complete to the host.

The odd/even LBA/stripe/zones pair is an example that may be applied for other load distribution usages.

Embodiments of the inventive concept may support SSD failure, removal, and hot addition. When an SSD fails to operate normally or is removed from its slot, RoC in the PCIe switch needs to detect that condition. When the PCIe switch detects such a condition, RoC may start a rebuild operation for the failed or removed SSD. RoC may also handle any I/O operations during the rebuilding period by determining data from the associated stripe on priority.

There are at least two methods by which an SSD failure or removal is reported to the RoC in the PCIe switch. In one embodiment of the inventive concept, all the SSDs have Present pins connected to the BMC. When a SSD is pulled out of the chassis, the BMC detects the removal. The BMC then reports the affected slot number to the RoC in the PCIe switch. The BMC may also periodically monitor the health of the SSDs. If the BMC detects any fatal error conditions reported by the SSD, the BMC may decide to take that SSD out of service. The BMC may then report the failed slot number to the RoC so that a new SSD may be rebuilt.

In another embodiment of the inventive concept, the PCIe switch may be capable of supporting hot plug in which all SSDs are connected through PCIe sideband signals and may detect certain error conditions. The PCIe switch may detect when the SSD is pulled out or added in, or the PCIe link to the SSD is no longer up. In such error situations, the RoC in the PCIe switch may isolate the failed SSD or the BMC may do so by disabling the power to the failed drive and immediately start rebuilding of the drive.

When asserted, the Presence (PRSNT #) pin of each U.2 connector may indicate that there is a new device present in the chassis. The signal is connected to either the PCIe switch and/or BMC. The RoC may configure the new drive into its existing domain as appropriate by the current data protection policy.

All incoming traffic from host is required to forward to the snooping P2P and address translation logic (physical to logical). During PCIe enumeration, all configuration cycles from all ports are required to forward to the snooping P2P logic. Depending on the selected mode of operation, the behaviors of the PCIe switch with RoC are defined as follows:

| Command | Normal PCIe switch (RoC disabled) | PCIe switch with RoC enabled |
| --- | --- | --- |
| PCIe enumeration | Normal P2P upstream port to downstream port | Special: the snooping logic may enumerate as a single device. The snooping logic may enumerate the downstream ports based on selected Erasure Code/RAID level |
| PCIe configuration | Normal P2P upstream port to downstream port | Special: the snooping logic/RoC may enumerate as single device. The RoC may enumerate all connected downstream ports based on selected Erasure Code/RAID level. In this case, RoC is the virtual volume manager/controller |
| PCIe Read/Write transactions | Normal | Host communicates with RoC, RoC communicates with SSDs. No direct host-to-SSD communication |
| RAID/Erasure Code induced initialization | N/A | RoC may initialize all participate SSDs and configure RAID/Erasure Coding per user request |

The RoC may also be positioned in-line, between the PCIe switch and the host processor. In such embodiments of the inventive concept, the RoC may be termed a Look-Through RoC. When using a Look-Through RoC, if the PCIe switch operates as a normal PCIe switch, the RoC is disabled and become a re-timer for all ports. In this case, all upstream ports are allowed to connect as in the normal use case.

If RoC is enabled, a small number of non-transparent bridge (NTB) ports are connected to the host. In this case, the RoC may virtualize incoming address to logical address per the selected RAID or Erasure Coding levels.

Regardless of whether the RoC is a Look-Aside RoC or a Look-Through RoC, all incoming read/write memory requests may be checked against the RoC's local cache to determine a cache hit or miss. If there is a cache hit, then the requested read data may be provided by the RoC local cache memory instead of the SSD. For a memory write hit, the write data may be updated to the cache memory immediately. The same write data may be updated to the SSD at later time. This implementation may lower the overall latency for memory writes, therefore improving the system performance.

If there is a cache miss, the RoC controller may determine which SSD is the right drive to access the data.

To address a PCIe device, it must be enabled by being mapped into the system's I/O port address space or memory-mapped address space. The system's firmware, device drivers, or the operating system program the Base Address Registers (BARs) to inform the device of its address mapping by writing configuration commands to the PCI controller. Because all PCIe devices are in an inactive state upon system reset, they will have no addresses assigned to them by which the operating system or device drivers may communicate with them. Either the BIOS or the operating system geographically addresses the PCIe slots (for example, the first PCIe slot, the second PCIe slot, or the third PCIe slot, etc., on the motherboard) through the PCIe controller using the per slot IDSEL (Initialization Device Select) signals.

PCI BAR Bits

| Bits | Description | Values |
| --- | --- | --- |
| For all PCI BARs | | |
| 0 | Region Type | 0 = Memory |
| | | 1 = I/O (deprecated) |
| For Memory BARs | | |
| 2-1 | Locatable | 0 = any 32-bit |
| | | 1 = <1 MiB |
| | | 2 = any 64-bit |
| 3 | Prefetchable | 0 = no |
| | | 1 = yes |
| 31-4 | Base Address | 16-byte aligned |
| For I/O BARs (Deprecated) | | |
| 1 | Reserved | |
| 31-2 | Base Address | 4-byte aligned |

Since there is no direct method for the BIOS or operating system to determine which PCIe slots have devices installed (nor to determine which functions the device implements) the PCI bus(es) are enumerated. Bus enumeration may be performed by attempting to read the vendor ID and device ID (VID/DID) register for each combination of bus number and device number at the device's function 15. Note that the device number, which is different from DID, is merely a device's sequential number on that bus. Moreover, after a new bridge is detected, a new bus number is defined, and device enumeration restarts at device number zero.

If no response is received from the device's function 15, the bus master may perform an abort and returns an all-bits-on value (FFFFFFFF in hexadecimal), which is an invalid VID/DID value. In this manner, a device driver may tell that the specified combination bus/device_number/function (B/D/F) is not present. So, when a read to a function ID of zero for a given bus/device causes the master (initiator) to abort, the device driver may conclude that no working device exists on that bus (devices are required to implement function number zero). In this case, reads to the remaining functions numbers (1-7) are not necessary as they also will not exist.

When a read to a specified B/D/F combination for the vendor ID register succeeds, a device driver knows that the device exists. The device driver may write all ones to its BARs and reads back the device's requested memory size in an encoded form. The design implies that all address space sizes are a power of two and are naturally aligned.

At this point, the BIOS or operating system may program the memory-mapped and I/O port addresses into the device's BAR configuration register. These addresses stay valid as long as the system remains turned on. Upon power-off, all these settings are lost and the procedure is repeated next time the system is powered back on. Since this entire process is fully automated, the user is spared the task of configuring any newly added hardware manually by changing DIP switches on the cards themselves. This automatic device discovery and address space assignment is how plug and play is implemented.

If a PCIe-to-PCIe bridge is found, the system may assign the secondary PCI bus beyond the bridge a bus number other than zero, and then enumerate the devices on that secondary bus. If more PCIe bridges are found, the discovery may continue recursively until all possible domain/bus/device combinations are scanned.

Each non-bridge PCIe device function may implement up to 6 BARs, each of which may respond to different addresses in I/O port and memory-mapped address space. Each BAR describes a region.

A PCIe device may also have an option ROM which may contain driver code or configuration information.

A BMC may directly configure the RoC setup. The BMC may have a hard-coded path where a specific data protection scheme is to be applied or a configurable setup. The latter may expose an interface to this configuration as a BIOS option or additionally to software through a hardware exposed interface. The hard-coded scheme may be built into the BIOS firmware and may still provide an option to enable/disable protection.

To handle a device failure, the BMC through the control path may detect when a drive goes bad or is removed. The BMC may also determine that a device is expected to go bad soon via Self-Monitoring Analysis and Reporting Technology (SMART). The BMC in these cases may reconfigure the RoC hardware to enable failed scenarios or to warn a user about the situation. The BMC only gets in the control path and not the data path. When a new drive is inserted, the BMC may again intervene and configure the new drive as part of the protected group(s) or initiate a rebuild operation. RoC hardware may handle the actual rebuild, recovery paths in this setup to provide as minimum as possible a performance impact while providing lower latencies in the data access paths.

FIG. 1 shows a machine including a Peripheral Component Interconnect Express (PCIe) switch with Look-Aside Erasure Coding logic, according to an embodiment of the inventive concept. In FIG. 1, machine 105 is shown. Machine 105 may include processor 110. Processor 110 may be any variety of processor: for example, an Intel Xeon, Celeron, Itanium, or Atom processor, an AMD Opteron processor, an ARM processor, etc. While FIG. 1 shows a single processor 110 in machine 105, machine 105 may include any number of processors, each of which may be single core or multi-core processors, and may be mixed in any desired combination.

Machine 105 may also include memory 115, which may be managed by memory controller 120. Memory 115 may be any variety of memory, such as flash memory, Dynamic Random Access Memory (DRAM), Static Random Access Memory (SRAM), Persistent Random Access Memory, Ferroelectric Random Access Memory (FRAM), or Non-Volatile Random Access Memory (NVRAM), such as Magnetoresistive Random Access Memory (MRAM) etc. Memory 115 may also be any desired combination of different memory types.

Machine 105 may also include Peripheral Component Interconnect Express (PCIe) switch with Look-Aside Erasure Coding logic 125. PCIe switch 125 may be any desired PCIe switch that supports Look-Aside Erasure Coding logic.

Machine 105 may also include storage device 130, which may be controlled by device driver 135. Storage device 130 may be any desires form of storage device capable of communicating with PCIe switch 125. For example, storage device 130 may be a Non-Volatile Memory Express (NVMe) Solid State Drive (SSD).

Although FIG. 1 depicts machine 105 as a server (which could be either a standalone or a rack server), embodiments of the inventive concept may include machine 105 of any desired type without limitation. For example, machine 105 could be replaced with a desktop or a laptop computer or any other machine that may benefit from embodiments of the inventive concept. Machine 105 may also include specialized portable computing machines, tablet computers, smartphones, and other computing machines.

Figure 2:
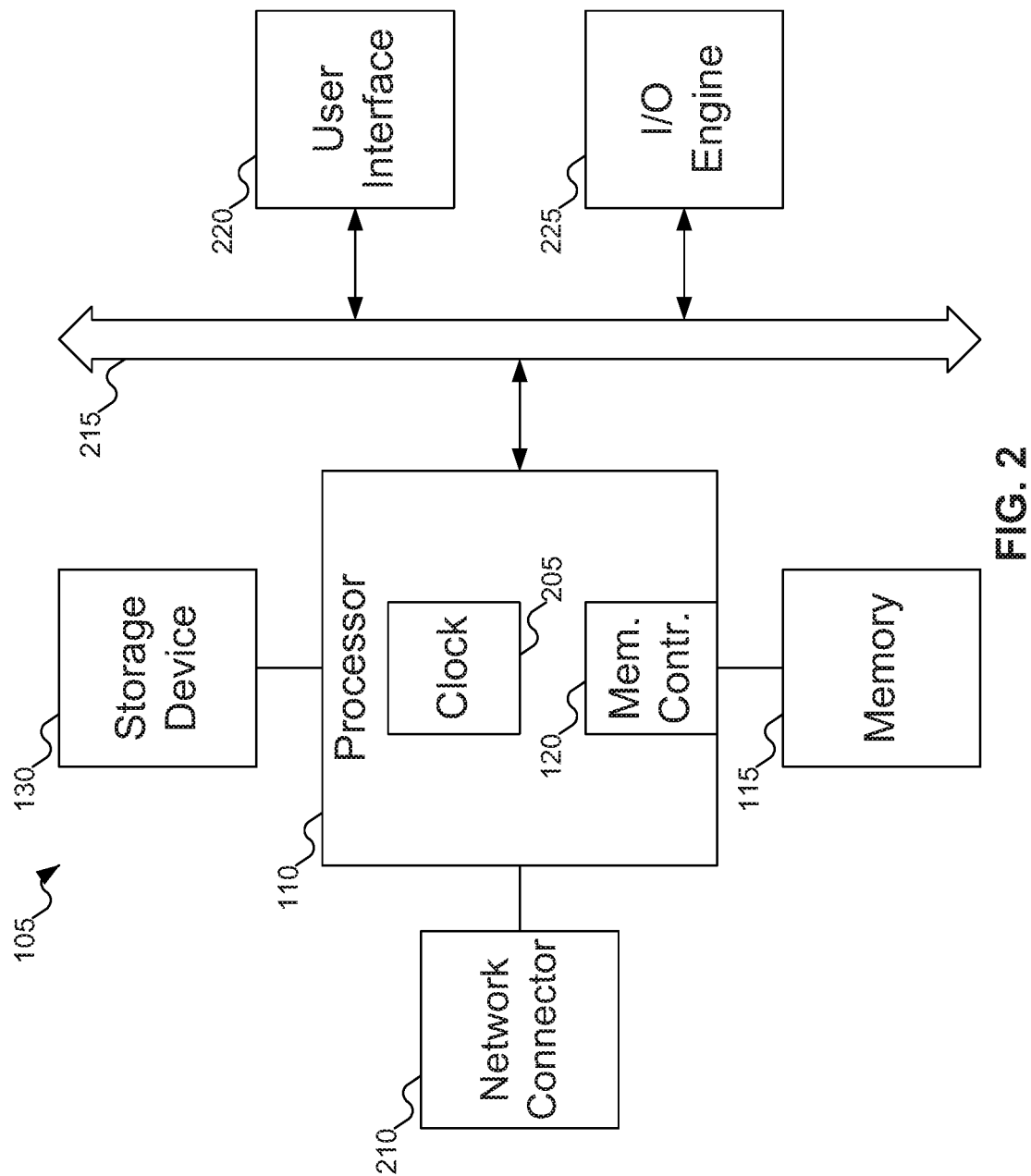
FIG. 2 shows additional details of the machine of FIG. 1.

FIG. 2 shows additional details of the machine of FIG. 1. In FIG. 2, typically, machine 105 includes one or more processors 110, which may include memory controllers 120 and clocks 205, which may be used to coordinate the operations of the components of device 105. Processors 110 may also be coupled to memories 115, which may include random access memory (RAM), read-only memory (ROM), or other state preserving media, as examples. Processors 110 may also be coupled to storage devices 130, and to network connector 210, which may be, for example, an Ethernet connector or a wireless connector. Processors 110 may also be connected to buses 215, to which may be attached user interfaces 220 and Input/Output interface ports that may be managed using Input/Output engines 225, among other components.

Figure 3:
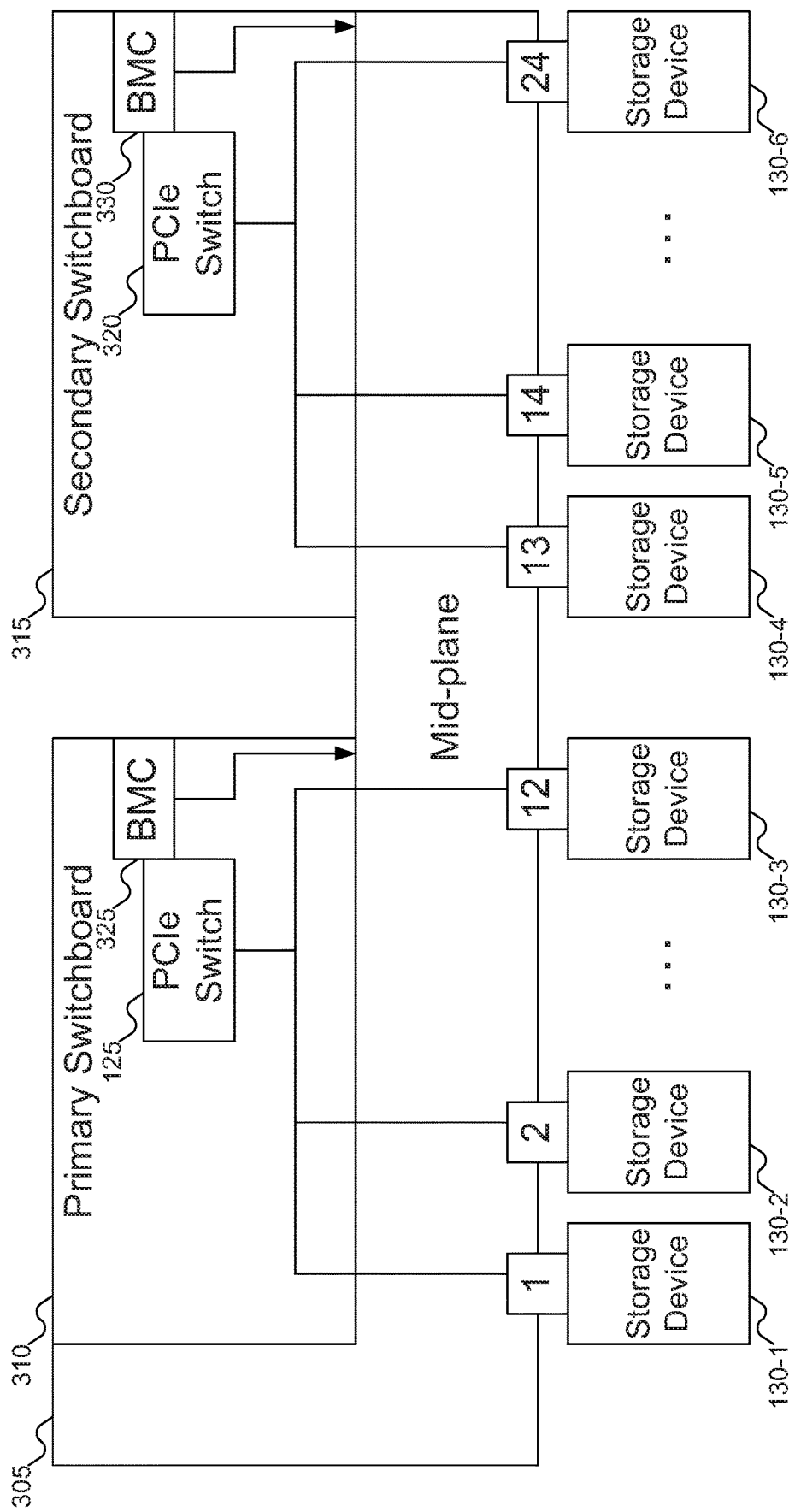
FIG. 3 shows additional details of the machine of FIG. 1, including switchboards and a mid-plane connecting the PCIe switch with Look-Aside Erasure Coding logic of FIG. 1 to storage devices.

FIG. 3 shows additional details of machine 105 of FIG. 1, including switchboards and a mid-plane connecting PCIe switch with Look-Aside Erasure Coding logic 125 of FIG. 1 to storage devices. In FIG. 3, machine 105 may include mid-plane 305 and switchboards 310 and 315. Switchboards 310 and 315 may each include PCIe switches with Look-Aside Erasure Coding logic 125 and 320 and Baseboard Management Controllers 325 and 330, respectively. (Switchboards 310 and 315 may also include additional components not shown in FIG. 3: FIG. 3 focuses on the elements most pertinent to embodiments of the inventive concept.)

In some embodiments of the inventive concept, each PCIe switch with Look-Aside Erasure Coding logic 125 and 320 may support up to 96 total PCIe lanes. Using U.2 connectors to connect PCIe switches with Look-Aside Erasure Coding logic 125 and 320 to storage devices 130-1 through 130-6, each U.2 connector supports up to 4 PCIe lanes per device. Using two X4 lanes (one X4 lane for each direction of communication), this means that each PCIe switch may support up to 96÷8=12 devices. Thus, FIG. 3 shows 12 storage devices 130-1 through 130-3 communicating with PCIe switch with Look-Aside Erasure Coding logic 125, and 12 storage devices 130-4 through 130-6 communicating with PCIe switch with Look-Aside Erasure Coding logic 320. But the number of storage devices communicating with PCIe switches with Look-Aside Erasure Coding logic 125 and 320 is bounded only by the number of PCIe lanes offered by PCIe switches with Look-Aside Erasure Coding logic 125 and 320 and the number of PCIe lanes used by each storage device 130-1 through 130-6.

In some embodiments of the inventive concept, PCIe switches with Look-Aside Erasure Coding logic 125 and 320 may be implemented using custom circuitry. In other embodiments of the inventive concept, PCIe switches with Look-Aside Erasure Coding logic 125 and 320 may be implemented using a Field Programmable Gate Array (FPGA) or an Application-Specific Integrated Circuit (ASIC), suitably programmed.

BMCs 325 and 330 may be used to configure storage devices 130-1 through 130-6. For example, BMCs 325 and 330 may initialize storage devices 130-1 through 130-6, erasing any data present on storage devices 130-1 through 130-6: at start-up, when storage devices 130-1 through 130-6 are added to an Erasure Coding scheme, or both. Alternatively, this functionality may be supported by a processor (either processor 110 of FIG. 1 or by a local processor(s) present but not shown on switchboards 310 and 315). BMCs 325 and 330 (or processor 110 of FIG. 1 or local processor(s) present but not shown on switchboards 310 and 315) may also be responsible for the initial configuration of the Look-Aside Erasure Coding logic of PCIe switches with Look-Aside Erasure Coding logic 125 and 320.

FIG. 3 shows an example full setup of data protection with two PCIe switches with Look-Aside Erasure Coding logic 125 and 320: BMCs 325 and 330 may directly configure the Look-Aside Erasure Coding logic. BMCs 325 and 330 may have a hard-coded path where a specific data protection scheme is applied, or a configurable setup. The latter may expose an interface to this configuration as a Basic Input/Output System (BIOS) option or additional software through a hardware exposed interface. The hard-coded scheme may be built into the BIOS firmware and may still provide an option to enable/disable protection.

In case a storage device fails, BMCs 325 and 330 may detect when a storage device goes bad or is removed through a control path. BMCs 325 and 330 may then reconfigure the Look-Aside Erasure Coding logic to enable failed scenarios. BMCs 325 and 330 may connect to the control path but not the data path. Similarly, when a new storage device is inserted, BMCs 325 and 330 may intervene and configure the new storage device as part of an established group or initiate a rebuild operation. The Look-Aside Erasure Coding logic may handle the actual rebuild; recovery paths in this setup should ideally minimize the performance impact to data accesses as well as reconstruct data on the rebuild storage device from the remaining storage devices.

At this point, it is worthwhile to define the term "Erasure Coding". Erasure Coding is intended to describe any desired approach for encoding data on multiple storage devices. At least two storage devices or at least two portions of a storage device (for example, a single shell or housing containing two or more NAND flash channels) may be required for Erasure Coding, since if only one storage device is being used the data may be stored using conventional data access techniques appropriate for the storage device. In other words, Erasure Coding is defined to mean approaches to storing data across two or more storage devices, two or more portions of a single storage device, or any combination thereof, in a manner that uses the storage devices more efficiently and/or provides for data redundancy.

A Redundant Array of Independent Disks (RAID) represents a subset of Erasure Coding; or put another way, RAID levels represent specific implementations of various Erasure Coding schemes. However, there may be other Erasure Coding schemes that may be defined beyond conventional RAID levels.

Often, implementing Erasure Coding (or RAID) uses two or more physically distinct storage devices. But in some embodiments of the inventive concept, a single shell or housing may include multiple portions of storage devices that may be treated as separate storage devices for Erasure Coding purposes. For example, a single NVMe SSD shell or housing might include multiple NAND flash channels. Each NAND flash channel may be thought of as a separate storage device for Erasure Coding purposes, with data striped (or other encoded) across the various NAND flash channels. This, in some embodiments of the inventive concept, it may be possible to implement Erasure Coding using a single storage device. Further, it may be possible for PCIe switch with Look-Aside Erasure Coding logic 125 to support Error Correcting Codes (either built into PCIe switch with Look-Aside Erasure Coding logic 125 somewhere or via an additional logic) or other functionalities that may be used with a single storage device.

Figure 4:
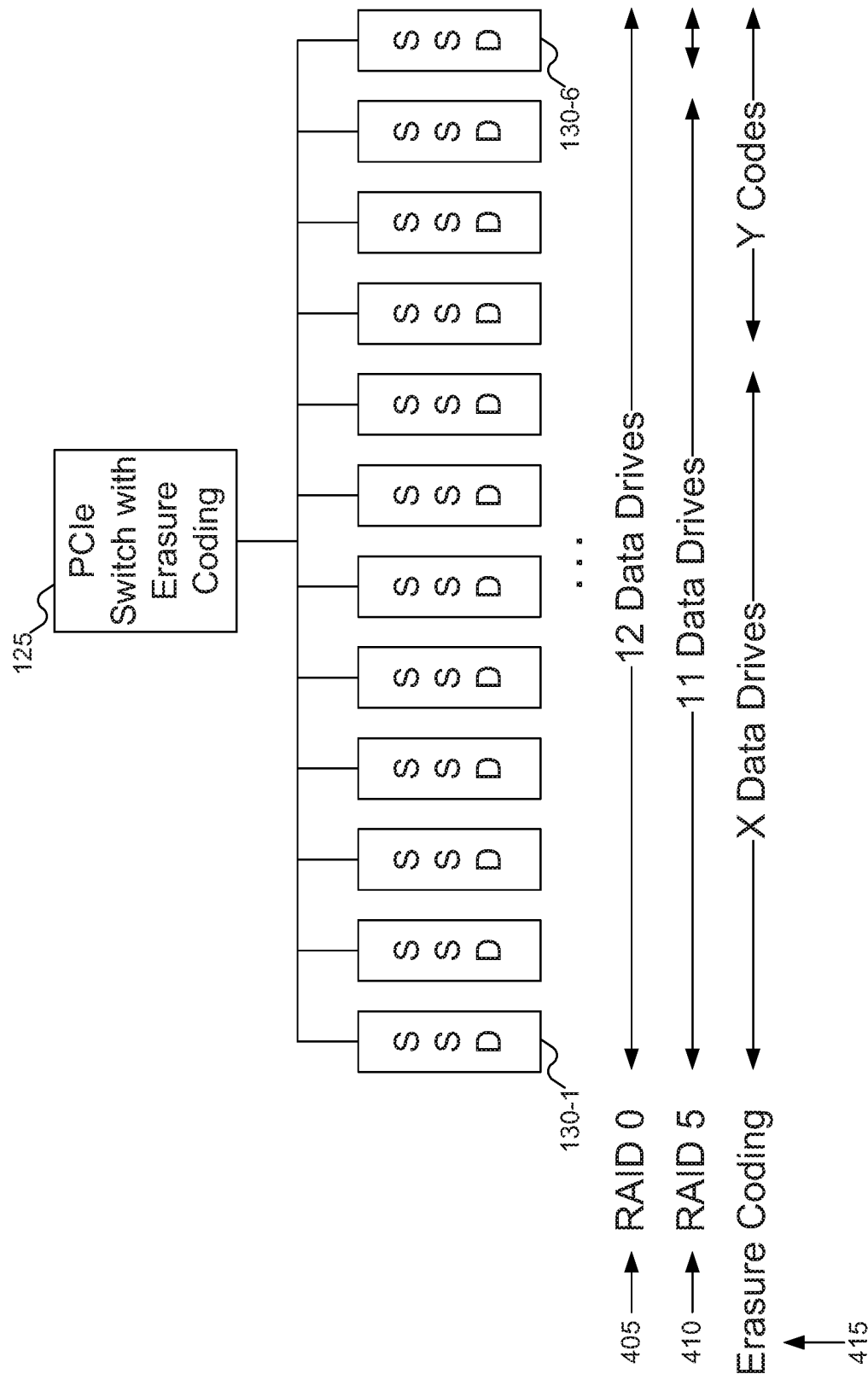
FIG. 4 shows the storage devices of FIG. 3 used to achieve different Erasure Coding schemes.

FIG. 4 shows storage devices 130-1 through 130-6 of FIG. 3 used to achieve different Erasure Coding schemes. In FIG. 4, storage devices 130-1 through 130-6 may be used in a RAID 0 configuration, as shown in Erasure Coding scheme 405. RAID 0 stripes data across the various storage devices. That is, the data is divided into logical units appropriate to the storage devices, and each logical unit is written to different storage devices up to the number of storage devices in the array; after all storage devices have one logical unit of data written on them, data is written again on the first storage device, and so on.

RAID 0 provides advantages over using a single storage device in isolation, or even of an unorganized group of disks (such as Just a Bunch of Disks (JBOD) or Just a Bunch of Flash (JBOF)). Because data is stored on multiple storage devices, data may be read and written faster, with each storage device operating in parallel. Thus, for example, by dividing data across 12 storage devices 130-1 through 130-6 as shown in FIG. 4, each storage device 130-1 through 130-6 only needs to read or write one twelfth of the overall data, which is faster than reading or writing the entirety of the data. Overall capacity of the array may be calculated as the number of storage devices in the array multiplied by the capacity of the smallest storage device in the array. So in FIG. 4, as the array includes 12 storage devices for data, the overall capacity of the array is 12 times the capacity of the smallest storage device in the array.

The downside to RAID 0 is that there is protection against a storage device failing: if any storage device in the array fails, data is lost. In fact, RAID 0 might be considered riskier than JBOD or JBOF: by striping the data across multiple storage devices, all the data is lost if any individual storage device fails. (In contrast, with JBOD or JBOF, files are typically written to only one storage device. So while the failure of a single storage device in a JBOD or JBOF setup may result in some data loss, not all data is necessarily lost.)

RAID 0 does not include any redundancy, and so technically is not a Redundant Array of Independent Disks. But RAID 0 is traditionally considered a RAID level, and RAID 0 certainly may be considered an Erasure Coding scheme.

Erasure Coding scheme 410 shows RAID 5, which is a common RAID scheme. In RAID 5, a parity block may be calculated for data stored on the other storage devices for that stripe. Thus, in FIG. 4, as the RAID 5 array includes a total of 12 storage devices, 11 storage devices are used as data drives, and 1 storage device is used as a parity drive. (In RAID 5, the parity data is not limited to the parity drive, but is distributed across the storage devices like any data. RAID 4, which is not used much anymore, stores all the parity information on a single drive.). The overall capacity of the array, where there are n storage devices in the array, may be calculated as n−1 times the capacity of the smallest storage device. Because each stripe includes one parity block, Erasure Coding scheme 410 may tolerate the failure of up to one storage device and still be able to access all the data (data on the failed storage device may be recovered using the data on the functional storage devices in combination with the parity block).

Note that RAID 5 offers less overall storage than RAID 0, but provides some protection against storage device failure. This is an important trade-off in deciding among RAID levels: the relative importance of overall storage capacity and redundancy.

Other RAID levels, not shown in FIG. 4, may also be used as Erasure Coding schemes. For example, RAID 6 uses two storage devices to store parity information, reducing the overall storage capacity to n−2 times the capacity of the smallest storage device, but tolerating up to two storage device failures at the same time. Hybrid schemes are also possible: for example, RAID 0+1, RAID 1+0, RAID 5+0, RAID 6+0, and other RAID schemes are all possible, each offering varying overall storage capacities and tolerances for storage device failures. For example, five of storage devices 130-1 through 130-6 might be used to form one RAID 5 array, five more of storage devices 130-1 through 130-6 might be used to form a second RAID 5 array, and those two groups, combined with the remaining two storage devices, might be used to form a larger RAID 5 array. Or, storage devices 130-1 through 130-6 might be divided into two groups, each group implementing a RAID 0 array, with the two groups acting as a RAID 1 larger array (thereby implementing a RAID 0+1 setup). It should be noted that RAID and erasure coding techniques use fixed or rotating codes and the above fixed code/parity drive notation is for illustration purposes only.

Erasure Coding scheme 415 represents the more general description, applicable to all RAID levels and to any other desired Erasure Coding schemes. Given an array of storage devices 130-1 through 130-6, these storage devices may be divided into two groups: one group used to store data, the other group used to store codes. The codes may be parity information or any other desired coding information that permits recovery of missing data from a subset of the data in the data group and some coding in the coding group. As shown in FIG. 4, Erasure Coding scheme 415 may include up to X data storage devices and Y code storage devices. It is expected that, given any combination of X storage devices from the array, it is possible to access or reconstruct the data from all X data storage devices. Thus, Erasure Coding scheme 415 may generally tolerate up to Y storage device failures in the array and still be able to access all the data stored in the array. In terms of capacity, the overall capacity of Erasure Coding scheme 415 is X times the capacity of the smallest storage device.

Note that in the discussion above, the overall capacity of any Erasure Coding scheme is described relative to the "capacity of the smallest storage device". For some Erasure Coding schemes, it may be possible for the storage devices to have varying capacities and still be fully utilized. But some Erasure Coding schemes, such as RAID 0 or RAID 1, expect all the storage devices to have the same capacity and will discard any capacity larger storage devices might include. Thus, the phrase "capacity of the smallest storage device" should be understood to be a relative phrase, and the overall capacity offered by an array using any particular Erasure Coding scheme may be greater than the formulas described above.

Returning to FIG. 3, regardless of the particular Erasure Coding scheme used, the Look-Aside Erasure Coding logic of PCIe switches 125 and 320 effectively create a new storage device out of physical storage devices 130-1 through 130-6. This new storage device may be thought of as a virtual storage device, as the storage device presented by the Erasure Coding scheme does not physically exist. And since this virtual storage device uses physical storage devices 130-1 through 130-6, physical storage devices 130-1 through 130-6 should be hidden from the host. After all, it would be problematic for the host to attempt to directly access the blocks on storage devices 130-1 through 130-6 when the data stored thereon may have been encoded in a way the host does not know about.

To support the use of this virtual storage device, PCIe switches with Look-Aside Erasure Coding logic 125 and/or 320 may inform processor 110 of FIG. 1 of the capacity of the virtual storage device. For example, if storage devices 130-1 through 130-6 include five NVMe SSDs, each storing 1 TB of data (for mathematical simplicity, 1 TB is considered to be $2^{40}$ bytes, rather than $10^{12}$ bytes), and the Erasure Coding scheme implements a RAID 5 array, the effective storage capacity of the virtual storage device is 4 TB. (Other implementations of Erasure Coding, using fewer or more storage devices, which may store less or more than 1 TB each, may result in virtual storage devices with different capacities.) PCIe switches with Look-Aside Erasure Coding logic 125 and/or 320 may notify processor 110 that they connect to a virtual storage device offering a total of 4 TB (or $2^{42}$ bytes) of storage capacity. Processor 110 of FIG. 1 may then write data to blocks in this virtual storage device, and the Look-Aside Erasure Coding logic may handle the actual storage of the data, as described further with reference to FIG. 5 below. For example, if blocks on the NVMe SSDs are 4 KB each in size, processor 110 may request that data be written to logical blocks numbered between 0 and $2^{30}-1$.

Alternatively, PCIe switches with Look-Aside Erasure Coding logic 125 and/or 320 may request of block of host memory addresses from processor 110 of FIG. 1, representing a method for communicating with the virtual storage device. When processor 110 of FIG. 1 wants to read or write data, a transmission may be sent to PCIe switches with Look-Aside Erasure Coding logic 125 and/or 320 including the appropriate address within the block of host memory addresses. This block of host memory addresses should be at least as large as the virtual storage device implemented using the Erasure Coding scheme (and may be larger than the initial capacity of the virtual storage device, if it is expected that additional storage devices may be added to the Erasure Coding scheme during use).

Figure 5:
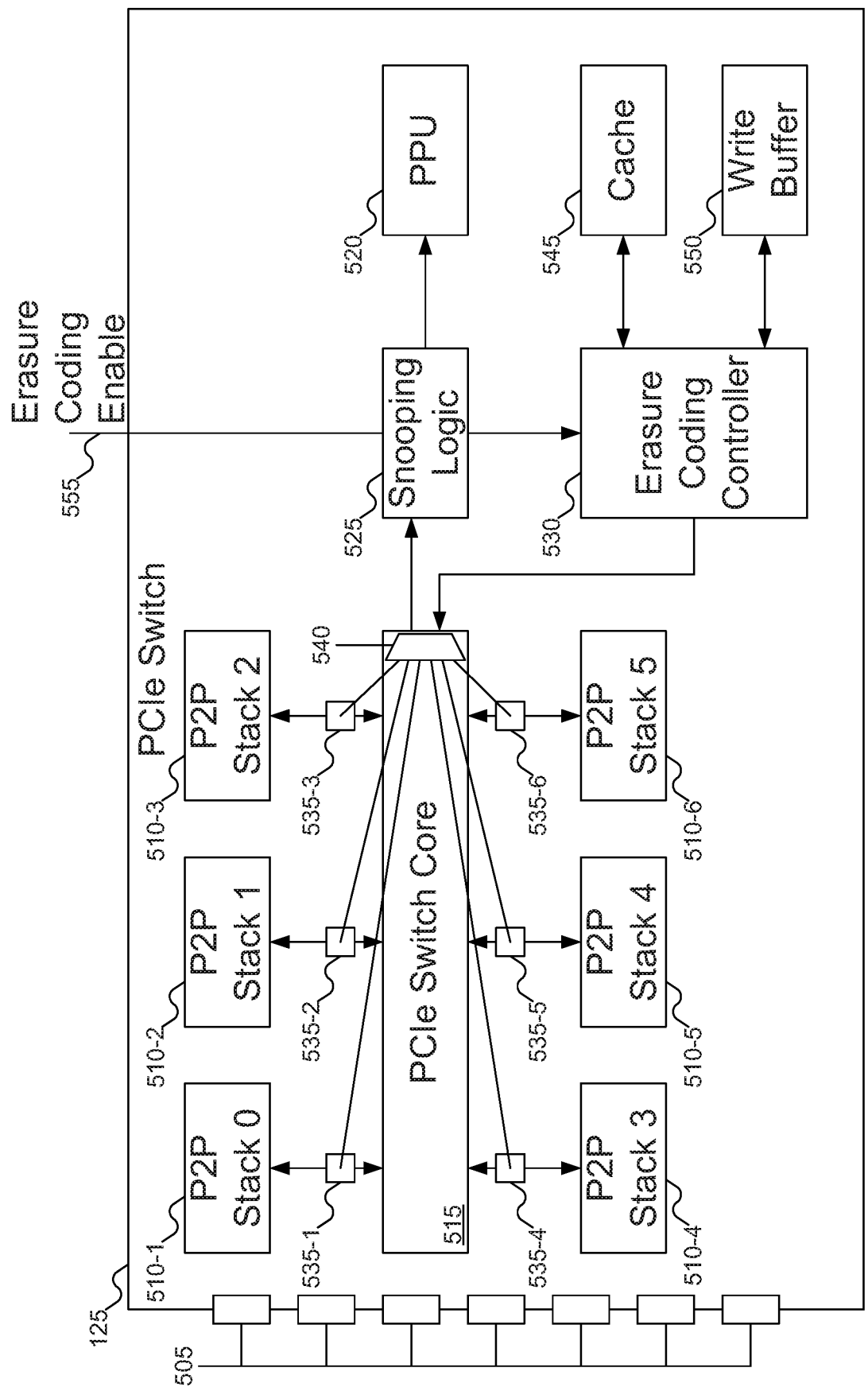
FIG. 5 shows details of the PCIe switch with Look-Aside Erasure Coding logic of FIG. 1.

FIG. 5 shows details of PCIe switch with Look-Aside Erasure Coding logic 125 of FIG. 1. In FIG. 5, PCIe switch with Look-Aside Erasure Coding logic 125 may include various components, such as connectors 505, PCIe-to-PCIe stacks 510-1 through 510-6, PCIe switch core 515, and Power Processing Unit (PPU) 520. Connectors 505 enable PCIe switch with Look-Aside Erasure Coding logic 125 to communicate with various other components in machine 105 of FIG. 1, such as processor 110 of FIG. 1 and storage devices 130-1 through 130-6 of FIG. 3. One or more of connectors 505 may be termed an "external" connector, in that it connects to upstream components (such as processor 110 of FIG. 1); the remaining connectors 505 may be termed internal or downstream "connectors", as they connect to downstream devices (such as storage devices 130-1 through 130-6 of FIG. 3). PCIe-to-PCIe stacks 510-1 through 510-3 permit the exchange of data between PCIe devices. For example, storage device 130-1 of FIG. 3 might send data to storage device 130-3 of FIG. 3. Or, processor 110 of FIG. 1 might be requesting one or more of storage devices 130-1 through 130-6 of FIG. 3 to perform a read or write request. PCIe-to-PCIe stacks 510-1 through 510-6 may include buffers to temporarily store data: for example, if the destination device for a particular transmission is currently busy, a buffer in PCIe-to-PCIe stacks 510-1 through 510-6 may store the transmission until the destination device is free. PPU 520 may act as a configuration center, handling any configuration requests for PCIe switch with Look-Aside Erasure Coding logic 125. While FIG. 5 shows six PCIe-to-PCIe stacks 510-1 through 510-6, embodiments of the inventive concept may include any number of PCIe-to-PCIe stacks. PCIe switch core 515 operates to route data from one PCIe port to another.

Before getting in to the operation of snooping logic 525 and Erasure Coding Controller 530, it is helpful to understand that there are at least two different "addresses" used for data stored on storage devices 130-1 through 130-6 of FIG. 3. On any storage device, data is written to a particular address associated with the hardware structure: this address may be thought of as a "physical" address: in the context of an NVMe SSD, the "physical" address is typically referred to as a Physical Block Address (PBA).

Flash memory, as used in NVMe SSDs, does not typically allow for data to be overwritten in place. Instead, when data needs to be overwritten, the old data is invalidated and the new data is written to a new block somewhere else on the NVMe SSD. Thus, the PBA where data associated with a particular data structure (be it file, object, or any other data structure) is written may change over time.

In addition, there are other reasons for relocating data in flash memory. Data is typically erased from flash memory in units larger than those used when writing data to flash memory. If there is valid data stored somewhere in the unit to be erased, that valid data must be written somewhere else in the flash memory before the unit may be erased. This erasure process is typically referred to as Garbage Collection, and the process of copying valid data out of the unit to be erased is referred to as Programming. And Wear Levelling (a process that attempts to keep the cells in flash memory used roughly equally) may also relocate data within flash memory.

The host could be notified each time a particular data block is moved and informed of the new storage location of the data. But notifying the host in such a manner places a significant burden on the host. Thus, most flash memory devices notify the host of a Logical Block Address (LBA) where the data is stored, and maintain a table that maps the LBA to the PBA (often in the Flash Translation Layer (FTL)). Then, any time the data in question is moved to a new PBA, the flash memory may update the LBA-to-PBA mapping table in the FTL, rather than notifying the host of the new address. Thus, for each storage device, there may be both a PBA and an LBA associated with the data.

Adding the concept of the virtual storage device, as presented by the Look-Aside Erasure Coding logic, introduces yet another level to this structure. Recall the example presented above with reference to FIG. 3, where the Erasure Coding scheme includes five 1 TB NVMe SSDs, each NVMe SSD using blocks that are 4 KB in size. Each NVMe SSD may include LBAs that are numbered from 0 to $2^{28}-1$. But the virtual storage device, as presented to the host, includes LBAs that are numbered from 0 to $2^{30}-1$.

Thus, the LBA range as seen by the host may represent a combination of multiple LBA ranges for various storage devices. To distinguish between the LBA range used by the host and the LBA ranges of the individual storage devices, the LBA used by the host may be referred to as the "host LBA", the "global LBA", or the "operating system (O/S)-aware LBA", whereas the LBA used by the storage device may be referred to as the "device LBA", the "local LBA", or the "LBA behind RoC". The host LBA range may be divided among the various storage devices in any manner desired. For example, the host LBA range may be divided into contiguous blocks, with each individual block assigned to a specific storage device. Using such a scheme, host LBAs 0 to $2^{28}-1$ may be mapped to device LBAs 0 to $2^{28}-1$ for storage device 130-1, host LBAs $2^{28}$ to $2^{29}-1$ may be mapped to device LBAs 0 to $2^{28}-1$ for storage device 130-2, and so on. Alternatively, individual bits in the host LBA may be used to determine the appropriate storage device and device LBA storing that data: for example, using the low order bits in the host LBA to identify the device, and stripping off those bits to produce the device LBA used by the storage device. But regardless of how host LBAs are mapped to device LBAs, there may be two, three, or potentially even more different addresses representing where data is stored.

There is, of course, no requirement that the storage devices be homogeneous: they may have different sizes and therefore different numbers of LBAs: they may even be of different device types, mixing SSDs and hard disk drives, for example.

Note that for simplicity of description, the term "device LBA" may be used even if the address provided to the storage device is not a logical block address (for example, a hard disk drive). If the "device LBA" is the actual address where the data is stored on the storage device, then the storage devices might not map the device LBA to a different address before accessing the data.

Returning now to FIG. 5, snooping logic 525 and Erasure Coding Controller 530 act as the Look-Aside Erasure Coding logic of PCIe switch with Look-Aside Erasure Coding logic 125. Snooping logic 525 may "snoop" (for example, by intercepting the request before it is delivered to its destination) a transmission and determine the appropriate destination using capture interfaces 535-1 through 535-6, which may be passed to snooping logic 525 via multiplexer 540. As discussed above, processor 110 only "sees" a virtual storage device of a given capacity (or a block of host memory addresses of a particular size), and issues commands to read or write data based on host LBAs (associated with the virtual storage device). Snooping logic 525 may translate these host LBAs into device LBAs on one or more specific physical storage devices and change the transmissions to direct the requests accordingly. Snooping logic 525 may manage this translation in any desired manner. For example, snooping logic 525 may include a table that maps a first range of host LBAs to storage device 130-1 of FIG. 3, a second range of host LBAs to storage device 130-2 of FIG. 3, and so on, with the device LBA depending on factors that may relate to how the Look-Aside Erasure Coding logic operates: for example, the Erasure Coding scheme itself (such as the RAID level), the stripe size, the number of storage devices, and so on. Or, snooping logic 525 may use particular bits in the host LBA to decide which of storage devices 130-1 through 130-6 of FIG. 3 store the data in question: for example, if the array includes only two storage devices, snooping logic 525 might use the low order bit (or some other bit in the logical block address) to determine whether the data is to be written to the first or second storage device. (Obviously, as more storage devices are included in the array, more bits may be used, with appropriate care taken to ensure that no logical block addresses include a combination of bits that "identifies" a non-existent storage device. For example, FIG. 3 shows a total of 24 storage devices 130-1 through 130-6, which may use bits values 00000 through 10111; bit values between 11000 and 11111 should be avoided.) Embodiments of the inventive concept may use any other desired approach to map logical block addresses as received from the host to block addresses on the (appropriate) storage devices.

As an example, consider processor 110 of FIG. 1 sending a write request with enough data to fill an entire stripe across all of storage devices 130-1 through 130-6 (after factoring in Erasure Coding). Snooping logic 525 may break the data into separate logical units, and Erasure Coding Controller 530, as discussed below, may provide or modify the data. Snooping logic 525 may then generate one transmission destined for each of storage devices 130-1 through 130-6, with appropriate data.

Note that when snooping logic 525 replaces the original host LBA with a device LBA appropriate to the storage device in question, that device LBA does not have to be a physical block address. Put another way, the device LBA used by snooping logic may itself be another logical block address. Such a structure enables the physical storage device to continue to manage its own data storage as appropriate. For example, if the physical storage device is an NVMe SSD, the SSD may move data around to perform garbage collection or wear leveling, using its Flash Translation Layer to manage the association of the provided device LBA with a PBA on one of the NAND flash memory chips. Such operations may happen without the knowledge of snooping logic 525. But if the storage device in question does not relocate data unless instructed to do so by the host, the device LBA provided by snooping logic 525 may be a physical address on the storage device.

As noted above, Erasure Coding Controller 530 may implement the Erasure Coding scheme. Depending on the Erasure Coding scheme, Erasure Coding Controller 530 may simply generate appropriate parity data (for example, when using a RAID 5 or RAID 6 Erasure Coding scheme), leaving the original data (as provided by processor 110 of FIG. 1) untouched. But in some embodiments of the inventive concept, Erasure Coding Controller 530 may modify the original data as well. For example, Erasure Coding Controller 530 might implement an Error Correcting Code on the original data, so that blocks as stored on individual storage devices 130-1 through 130-6 of FIG. 3 may be properly read even in case of an error. Or, Erasure Coding Controller 530 might encrypt data written to storage devices 130-1 through 130-6 of FIG. 3, making the data written to storage devices 130-1 through 130-6 of FIG. 3 unreadable without the encryption key—or worse, leading to Erasure Coding Controller 530 to think that storage devices 130-1 through 130-6 are corrupted if processor 110 of FIG. 1 were to write data directly. Or, Erasure Coding Controller may introduce parity information (or information of analogous types) into the data written into each of storage devices 130-1 through 130-6 of FIG. 3. The specific operations on the data, as performed by Erasure Coding Controller 530, depend on the Erasure Coding scheme being used.

Snooping logic 525 and Erasure Coding Controller 530 may be implemented in any desired manner. For example, snooping logic 525 and Erasure Coding Controller 530 may be implemented using processors with appropriate software stored thereon. But since PCIe switches are generally implemented as hardware circuitry (which typically is faster than software running on a processor for a device such as a PCIe switch that generally does not need to implement a large number of functions), snooping logic 525 and Erasure Coding Controller 530 may be implemented using appropriate circuitry. This circuitry may include an appropriately programmed FPGA, an ASIC, or any other desired hardware implementation.

In the most basic embodiments, the Look-Aside Erasure Coding logic may be implemented using only snooping logic 525 and Erasure Coding Controller 530. But including cache 545 and/or write buffer 550 in the Look-Aside Erasure Coding logic may offer significant benefits.

Cache 545 may store a subset of the data stored in the virtual storage device. In general, cache 545 is smaller in capacity than the overall virtual storage device, but faster to access. Thus, by storing some data in cache 545, cache hits to cache 545 may result in a faster performance for the virtual storage device than accessing the data from the underlying physical storage device. For example, cache 545 may store the most recently accessed data from the virtual storage device, using any desired algorithm to identify data for replacement as it grows stale (such as Least Recently Used or Least Frequently Used algorithms). Cache 545 may be implemented using any desired memory structure, such as DRAM, SRAM, MRAM, or any other desired memory structure. Cache 545 may even be implemented using memory structures that are faster than conventional memory, such as may be used in L1 or L2 caches in a processor. Finally, although cache 545 is shown as part of PCIe switch with Look-Aside Erasure Coding logic 125, cache 545 may also be stored in memory 115 of FIG. 1 and accessed therefrom by PCIe switch with Look-Aside Erasure Coding logic 125.

Write buffer 550 provides a mechanism to expedite write requests. The time required to perform a write operation to a virtual storage device that uses Erasure Coding to span multiple physical storage devices may be slower than a similar write request to a single physical storage device. Performing the write operation may involve reading data from other storage devices in the same block, after which the new data may be merged, then the merged data may be written back to the appropriate storage devices. Performing the merge may also involve calculating parity or other code information. And if the underlying physical storage devices are busy performing other operations (for example, processing read requests), the write request may also be delayed. Delaying the software running on processor 110 of FIG. 1 while waiting for a write request to complete may be undesirable. Therefore, instead of blocking the software running on processor 110 of FIG. 1, write buffer 550 may store the data temporarily until the writes to the underlying physical storage devices complete, while snooping logic 525 may inform the software running on processor 110 of FIG. 1 that the write request has already completed. This approach is similar to a write-through cache policy, as compared with a write-back cache policy where the write operation completes before the software running on processor 110 is informed that the write has completed. Like cache 430, write buffer 550 may be implemented using any desired memory structure, such as DRAM, SRAM, MRAM, or L1 or L2 cache structures, among other possibilities.

As part of performing a write operation, the Look-Aside Erasure Coding logic may check to see if any of the data needed to complete the write operation is currently in cache 545. For example, when processor 110 of FIG. 1 sends a write request to the virtual storage device, the Erasure Coding scheme may require that the entire stripe be read to calculate the parity or other code information. If some (or all) of that data is resident in cache 545, the data may be accessed from cache 545 rather than by reading the data from the underlying physical storage devices. In addition, the cache policy may suggest that the data to be written should also be cached in cache 545, in case that data may be requested again in the near term.

While FIG. 5 shows cache 545 and write buffer 550 as separate elements, embodiments of the inventive concept may combine the two into a single element (which may be termed just "cache"). In such an embodiment of the inventive concept, the cache may include bits that indicate whether the data stored thereon is "clean" or "dirty". Data that is "clean" represents data that has only been read but not modified since it was last written to the underlying physical storage device; data that is "dirty" has been modified since it was last written to the underlying physical storage devices. If the cache includes data that is "dirty", then the Look-Aside Erasure Coding logic may need to write the "dirty" data back to the underlying storage devices when the data is removed from the cache per the cache policy. In addition, embodiments of the inventive concept may include cache 545, write buffer 550, both (separately or combined into a single element), or neither.

As discussed above, the Look-Aside Erasure Coding logic in PCIe switch with Look-Aside Erasure Coding logic 125 may "create" a virtual storage device from the underlying physical storage devices, and that it would be problematic if processor 110 of FIG. 1 were to gain direct access to physical storage devices 130-1 through 130-6 of FIG. 3. Thus, when machine 105 of FIG. 1 initially boots (i.e., starts up or powers up) and attempts to enumerate the various PCIe devices that are accessible, PCIe switch with Look-Aside Erasure Coding logic 125 may determine that it is to use the Look-Aside Erasure Coding logic with its attached storage devices. In that case, PCIe switch with Look-Aside Erasure Coding logic 125 should prevent enumeration of any PCIe devices downstream from PCIe switch with Look-Aside Erasure Coding logic 125. By preventing such enumeration, PCIe switch with Look-Aside Erasure Coding logic 125 may "create" the virtual storage device without concern that processor 110 of FIG. 1 may be able to directly access the data on storage devices 130-1 through 130-6 of FIG. 3 (which could corrupt the data used in the Erasure Coding scheme). But as discussed below with reference to FIGS. 9-10, there may be situations in which PCIe switch with Look-Aside Erasure Coding logic 125 should permit downstream enumeration of PCIe devices.

Snooping logic 525 may also pass configuration commands to PPU 520. As such, snooping logic 525 may also operate as a PCIe-to-PCIe stack for purposes of connecting PCIe switch core 515 with PPU 520.

Finally, snooping logic 525 may receive Erasure Coding Enable signal 555 (perhaps via a pin on PCIe switch with Look-Aside Erasure Coding logic 125) from processor 110 of FIG. 1. Erasure Coding Enable signal 555 may be used to enable to disable the Erasure Coding logic in PCIe switch with Look-Aside Erasure Coding logic 125

Figure 6:
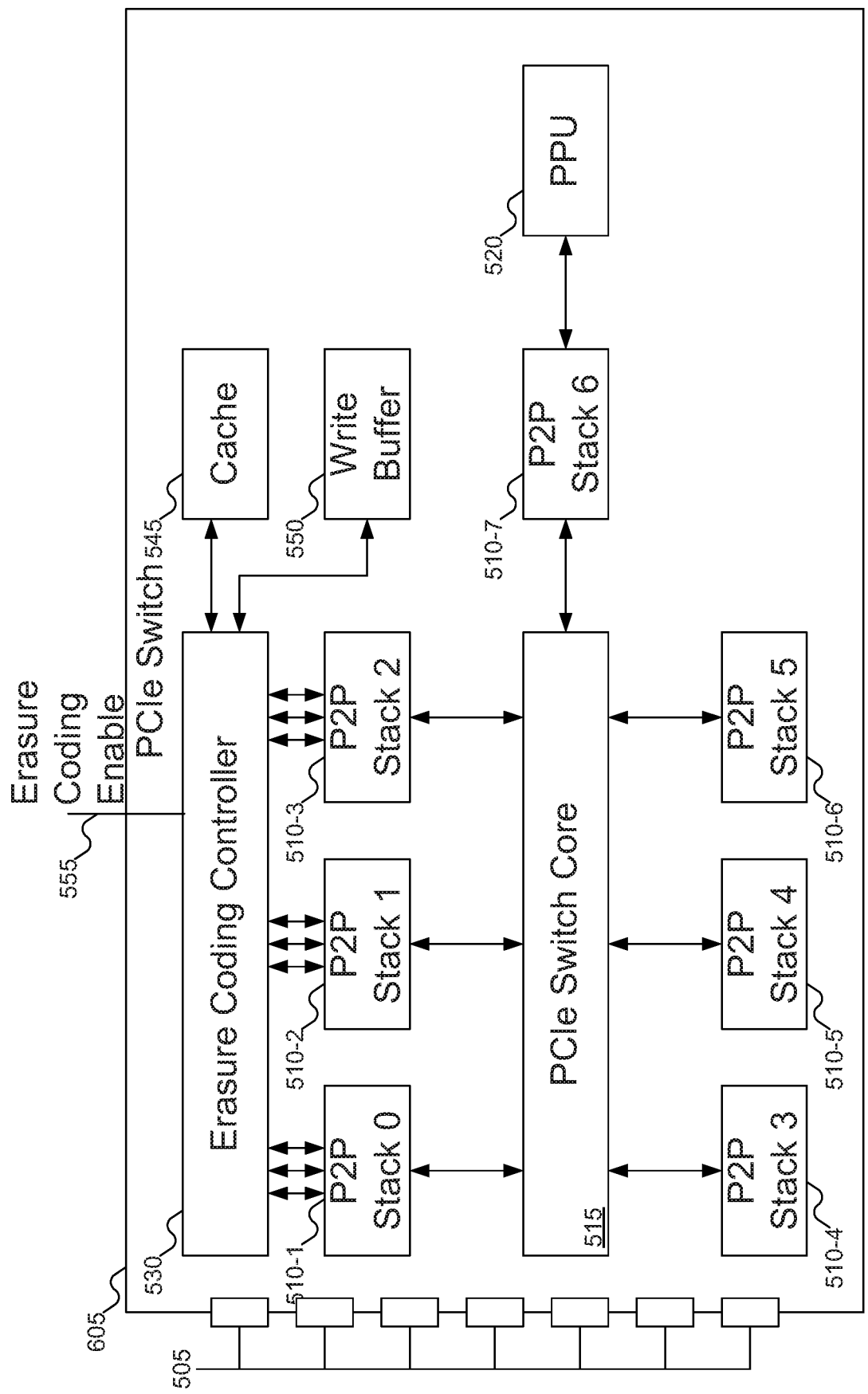
FIG. 6 shows details of a PCIe switch with Look-Through Erasure Coding logic according to another embodiment of the inventive concept.

FIG. 6 shows details of a PCIe switch with Look-Through Erasure Coding logic according to another embodiment of the inventive concept. As may be seen by comparing FIGS. 5 and 6, in PCIe switch with Look-Aside Erasure Coding logic 125 of FIG. 5 with PCIe switch with Look-Through Erasure Coding logic 605 of FIG. 6, the primary difference between a Look-Aside Erasure Coding logic and a Look-Through Erasure Coding logic is where the Erasure Coding logic is placed. In PCIe switch with Look-Aside Erasure Coding logic 125 of FIG. 5, the Erasure Coding logic is to the "side" of the PCIe switch, whereas in PCIe switch with Look-Through Erasure Coding logic 605 of FIG. 6 the Erasure Coding logic is "inline" with the PCIe switch.

There are technical advantages and disadvantages to using a Look-Aside Erasure Coding logic compared with a Look-Through Erasure Coding logic. The Look-Aside Erasure Coding logic of FIG. 5 is a more complicated implementation, since snooping logic 525 is needed to intercept and manage redirection of data from the host. In contrast, the Look-Through Erasure Coding logic of FIG. 6 is simpler to implement, since all data between the host and storage devices 130-1 through 130-6 of FIG. 3 pass through Erasure Coding Controller 530. On the other hand, when the Erasure Coding logic is disabled, the inclusion of the Look-Aside Erasure Coding logic does not introduce an additional latency to the operation of PCIe switch 125. In contrast, the Look-Through Erasure Coding logic of FIG. 6 may act as a PCIe endpoint. The Look-Through Erasure Coding logic of FIG. 6 may buffer data between the host and storage devices 130-1 through 130-6 of FIG. 3, which may increase the latency of communications. In the Look-Through Erasure Coding logic of FIG. 6, Erasure Coding Controller 530 also may include elements such as a Frame Buffer, a Route Table, a Port Arbitration logic, and a Scheduler (not shown in FIG. 6): elements typically included within PCIe switch core 515.

In addition, typically a PCIe switch uses the same number of ports for upstream (to the host) and downstream (to the storage devices and other connected devices) traffic. For example, if PCIe switch 605 includes a total of 96 ports, typically 48 are used for upstream traffic and 48 are used for downstream traffic. But where the Look-Through Erasure Coding logic of FIG. 6 is enabled, Erasure Coding Controller 530 may virtualize all the downstream devices. In such a situation, typically only 16 or perhaps 32 upstream ports are needed for communicating with the host. If PCIe switch 605 includes more ports more than 32 or 64 ports, the additional ports may be used to connect additional downstream devices, which may be used to increase the capacity of the virtual storage device. To this end, Erasure Coding Controller 530 of FIG. 6 may use non-transparent bridge (NTB) ports to communicate with the host.

FIG. 6 shows PCIe switch 605 as including the Look-Through Erasure Coding logic. But embodiments of the inventive concept may separate the Look-Through Erasure Coding logic from PCIe switch 605. For example, the Look-Through Erasure Coding logic may be implemented as a separate component from PCIe switch 605 using an FPGA or ASIC.

But while there are implementational and technical differences between a Look-Aside Erasure Coding logic as shown in FIG. 5 and a Look-Through Erasure Coding logic as shown in FIG. 6, functionally both Erasure Coding logics achieve similar results. Therefore, a Look-Aside Erasure Coding logic as shown in FIG. 5 and a Look-Through Erasure Coding logic as shown in FIG. 6 may be interchanged as desired. Any reference in this document to a Look-Aside Erasure Coding logic is intended to encompass a Look-Through Erasure Coding logic as well.

FIGS. 7-10 show various topologies for using PCIe switch with Look-Aside Erasure Coding logic 125 of FIG. 1. But regardless of the topology in use, the operation of PCIe switch with Look-Aside Erasure Coding logic 125 of FIG. 1 is the same: to offer both connectivity to the various attached storage devices and to support Erasure Coding across those storage devices.

Figures 7, 8:
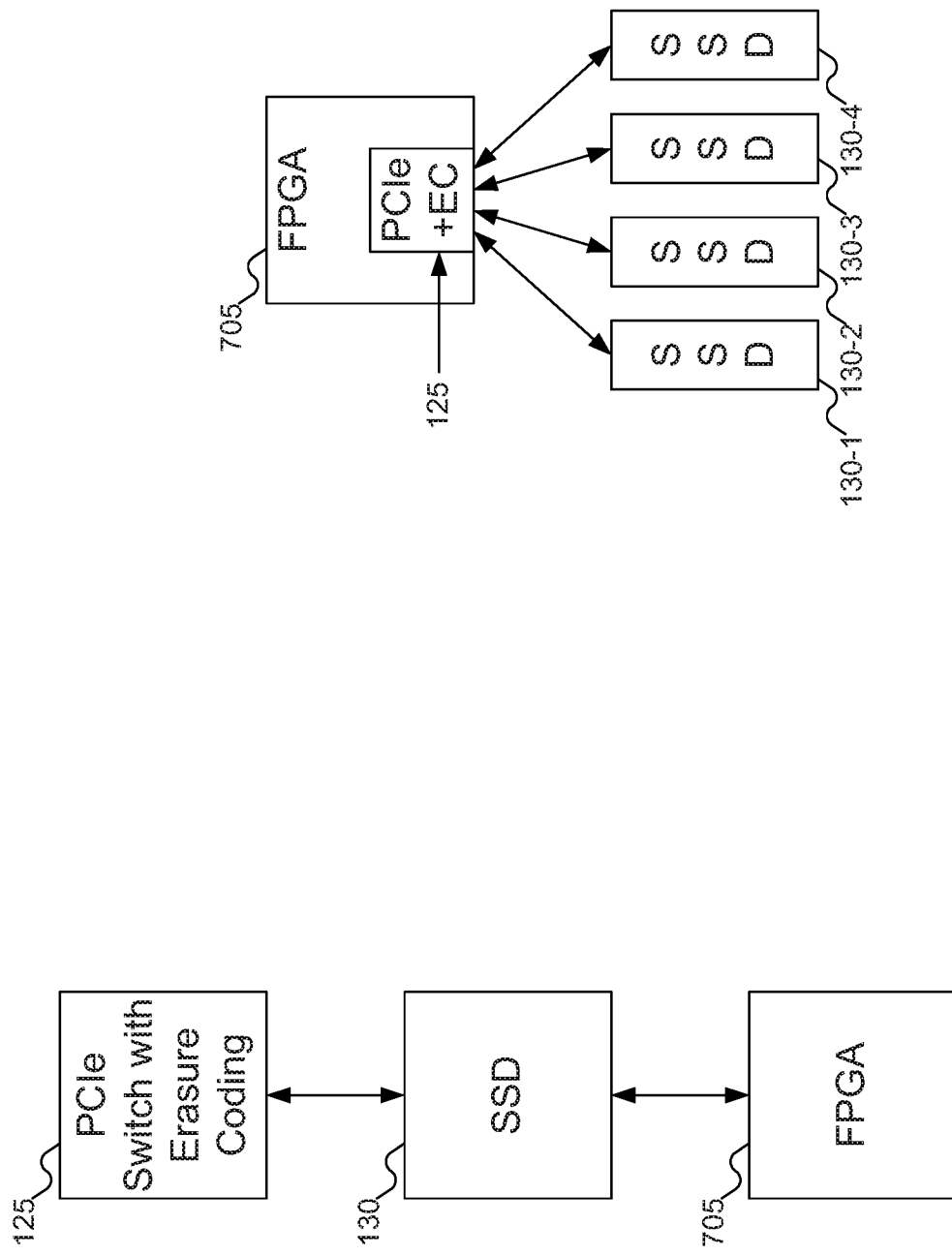
FIG. 7 shows a first topology for using the PCIe switch with Look-Aside Erasure Coding logic of FIG. 1, according to one embodiment of the inventive concept.
FIG. 8 shows a second topology for using the PCIe switch with Look-Aside Erasure Coding logic of FIG. 1, according to another embodiment of the inventive concept.

FIG. 7 shows a first topology for using PCIe switch with Look-Aside Erasure Coding logic 125 of FIG. 1, according to one embodiment of the inventive concept. In FIG. 7, PCIe switch with Look-Aside Erasure Coding logic 125 is shown, which may be implemented as a separate component of machine 105 of FIG. 1. That is, PCIe switch with Look-Aside Erasure Coding logic 125 may be manufactured and sold separately from any other components, such as processor 110 of FIG. 1 or storage device 130.

PCIe switch with Look-Aside Erasure Coding logic 125 may be connected to storage device 130. In FIG. 7, PCIe switch with Look-Aside Erasure Coding logic 125 is shown connected to only a single storage device, which may not support Erasure Coding: Erasure Coding requires at least two storage devices or at least two portions of a storage device to perform striping, chunking, grouping, and using parity or code information. But even with a single storage device PCIe switch with Look-Aside Erasure Coding logic 125 may offer some advantages. For example, PCIe switch with Look-Aside Erasure Coding logic 125 may support using Error Correcting Codes with storage device 130, or encrypting the data stored on storage device 130 if those services are not offered natively by storage device 130.

Storage device 130 may also be connected to FPGA 705. FPGA 705 may support acceleration. In short, there may be situations where data may need to be processed and then discarded. To load all that data into processor 110 of FIG. 1 to perform the processing may be expensive and time-consuming: the computations may be more easily performed closer to the data. FPGA 705 may support performing such calculations closer to the storage, avoiding the need for the data to be loaded into processor 110 of FIG. 1 to perform the computations: this concept is termed "acceleration". FPGA-based acceleration is discussed more in U.S. patent application Ser. No. 16/122,865, filed Sep. 5, 2018, which claims the benefit of U.S. Provisional Patent Application Ser. No. 62/642,568, filed Mar. 13, 2018, U.S. Provisional Patent Application Ser. No. 62/641,267, filed Mar. 9, 2018, and U.S. Provisional Patent Application Ser. No. 62/638,904, filed Mar. 5, 2018, all of which are hereby incorporated by reference, as well as U.S. patent application Ser. No. 16/124,179, filed Sep. 6, 2018, U.S. patent application Ser. No. 16/124,182, filed Sep. 6, 2018, and U.S. patent application Ser. No. 16/124,183, filed Sep. 6, 2018, all of which are continuations of U.S. patent application Ser. No. 16/122,865, filed Sep. 5, 2018 and are hereby incorporated by reference. Because the objective in acceleration is to handle the data without transferring the data to processor 110 of FIG. 1, FIG. 7 shows FPGA 705 closer to storage device 130. Note, however, that the particular arrangement shown in FIG. 7 is not required: FPGA 705 might be located between PCIe switch with Look-Aside Erasure Coding logic 125 and storage device 130.

Aside from data acceleration, FPGA 705 may offer other functionalities to support storage device 130. For example, FPGA 705 may implement data deduplication functions on storage device 130, to attempt to reduce the number of times the same data is stored on storage device 130. FPGA 705 may determine whether a particular datum is stored more than once on storage device 130, establish associations between the various Logical Block Addresses (or other information used by the host to identify the datum) and where the datum is stored on storage device 130, and delete the additional copies.

Alternatively, FPGA 705 may implement data integrity functions on storage device 130, such as adding Error Correcting Codes, to protect against data loss through errors in the operation of storage device 130, or T10DIF (Data Integrity Field) using Cyclic Redundancy Correction (CRC) for end-to-end protection. In this manner, FPGA 705 may be able to detect when there is an error writing or reading the datum on storage device 130 or for data in transit and recover the original data. Note that FPGA 705 may implement data integrity functionality without the host being aware that data integrity functionality is being provided: the host may only see the datum itself and not any of the Error Correcting Codes.

Alternatively, FPGA 705 may implement data encryption functions on storage device 130, to protect against unauthorized parties being able to access data on storage device 130: without the appropriate encryption key being provided, the data returned from FPGA 705 may be meaningless to the requestor. The host may provide the encryption key to be used when writing and reading the data. Or, FPGA 705 may perform data encryption and decryption automatically: FPGA 705 may store the encryption keys (and may even generate them on behalf of the host), and determine the appropriate encryption key to use based on who is requesting the data.

Alternatively, FPGA 705 may implement data compression functions on storage device 130, to reduce the amount of space required to store data on storage device 130. When writing data to storage device 130, FPGA 705 may implement a function that compresses the data provided by the host into a smaller amount of storage, then stores the compressed data (along with any information needed to recover the original data when reading the data from storage device 130). When reading data from storage device 130, FPGA 705 may read the compressed data (along with any information needed to recover the original data from the compressed data) and remove the compression to recover the original data.

Any desired implementations of data deduplication, data integrity, data encryption, and data compression may be used. Embodiments of the inventive concept are not limited to a particular implementation of any of these functions.

FPGA 705 may also implement any combination of functions on storage device 130 as desired. For example, FPGA 705 may implement both data compression and data integrity (since data compression may increase the sensitivity of data to errors: a single error in the data as stored on storage device 130 may result in large amounts of data being unusable). Or FPGA 705 may implement both data encryption and data compression (to protect the data while using as little storage for the data as possible). Other combinations of two or more functions may also be offered by FPGA 705.

In terms of overall operation, when implementing any of these functionalities, FPGA 705 may read the data from an appropriate source. Note that while the term "source" is a singular noun, embodiments of the inventive concept may read data from multiple sources (such as multiple storage devices), if appropriate. FPGA 705 may then perform the appropriate operations on the data: data acceleration, data integration, data encryption, and/or data compression. FPGA 705 may then take an appropriate action with the results of the operation: for example, sending the results to host 105 of FIG. 1, or writing the data to storage device 130.

While the functionalities above are described with reference to FPGA 705 of FIG. 7, embodiments of the inventive concept may include these functionalities anywhere in the system that includes an FPGA. Further, embodiments of the inventive concept may have the FPGA 705 access data from a "distant" storage device. For example, return momentarily to FIG. 3, and assume that storage device 130-1 includes an FPGA similar to FPGA 705, but storage device 130-2 lacks such a storage device. The FPGA included in storage device 130-1 may be used to apply its functionalities to storage device 130-2 by sending requests to storage device 130-2. For example, if the FPGA in storage device 130-1 offers data acceleration, the FPGA in storage device 130-1 may send requests to read data from storage device 130-2, perform the appropriate acceleration, then send the results to an appropriate destination (such as host 105 of FIG. 1).

In FIG. 7 (and in the topologies shown in FIGS. 8-10 below), PCIe switch with Look-Aside Erasure Coding logic 125 may be attached to devices that do not qualify for Erasure Coding. For example, PCIe switch with Look-Aside Erasure Coding logic 125 may be attached to other storage devices that have built-in Erasure Coding functionality, or devices that are not storage devices, such as FPGA 705 of FIG. 7 or a Graphics Processing Unit (GPU). All such devices may be described as devices that do not qualify for Erasure Coding (or at least, for Erasure Coding by PCIe switch with Look-Aside Erasure Coding logic 125).

When PCIe switch with Look-Aside Erasure Coding logic 125 is connected to devices that do not qualify for Erasure Coding, the system has various alternative approaches that may be used. In one embodiment of the inventive concept, the inclusion of any devices that do not qualify for Erasure Coding may result in the Look-Aside Erasure Coding logic of PCIe switch with Look-Aside Erasure Coding logic 125 being disabled. Thus, if, for example, PCIe switch with Look-Aside Erasure Coding logic 125 were connected to FPGA 705 of FIG. 7, or a GPU, or a storage device with native Erasure Coding logic, then none of the storage devices connected to PCIe switch with Look-Aside Erasure Coding logic 125 may be used with Erasure Coding. Note that the decision to disable the Look-Aside Erasure Coding logic of PCIe switch with Look-Aside Erasure Coding logic 125 does not necessarily translate to other PCIe switches with Look-Aside Erasure Coding logic in the same or other chassis. For example, FIG. 3 shows two PCIe switches with Look-Aside Erasure Coding logic 125 and 320, one of which may have the Look-Aside Erasure Coding logic enabled and the other may have the Look-Aside Erasure Coding logic disabled.)

Another embodiment of the inventive concept may disable the devices that do not qualify for Erasure Coding, treating them as though they were not connected to PCIe switch with Look-Aside Erasure Coding logic 125 at all. In this embodiment of the inventive concept, PCIe switch with Look-Aside Erasure Coding logic 125 may enable the Look-Aside Erasure Coding logic for storage device 130 and any other storage devices that qualify for Erasure Coding may be disabled, as though they were not connected to PCIe switch with Look-Aside Erasure Coding logic 125.

In yet another embodiment of the inventive concept, PCIe switch with Look-Aside Erasure Coding logic 125 may enable the Look-Aside Erasure Coding logic for storage devices that may be covered by the Look-Aside Erasure Coding logic, but still enable other devices that do not qualify for Erasure Coding to be accessed. This embodiment of the inventive concept is the most complicated implementation: PCIe switch with Look-Aside Erasure Coding logic 125 needs to determine which devices qualify for Erasure Coding and which do not, then analyze traffic to determine whether the traffic is destined for the virtual storage device (in which case the traffic is intercepted by the Look-Aside Erasure Coding logic) or not (in which case the traffic is delivered to its original destination).

In embodiments of the inventive concept where machine 105 ends up not offering the full functionality of the installed devices—namely, the embodiments of the inventive concept where Erasure Coding is disabled due to the presence of devices that do not qualify for Erasure Coding, or such devices are disabled by PCIe switch with Look-Aside Erasure Coding logic 125—machine 105 may notify a user of this fact. This notification may be provided by processor 110 of FIG. 1, BMC 325 of FIG. 3, or PCIe switch with Look-Aside Erasure Coding logic 125. Aside from informing the user that some functionality has been disabled, the notification may also inform the user how to reconfigure machine 105 to permit added functionality. For example, the notification may suggest that devices that do not qualify for Erasure Coding be connected to particular slots in mid-plane 305 of FIG. 3—perhaps those slots connected to PCIe switch with Look-Aside Erasure Coding logic 320—and storage devices that do qualify for Erasure Coding be connected to other slots, such as those connected to PCIe switch with Look-Aside Erasure Coding logic 125. In this manner, at least some storage devices that qualify for Erasure Coding may benefit from the Erasure Coding scheme, without blocking access to other devices that do not qualify for Erasure Coding.

FIG. 8 shows a second topology for using PCIe switch with Look-Aside Erasure Coding logic 125 of FIG. 1, according to another embodiment of the inventive concept. In FIG. 8, PCIe switch with Look-Aside Erasure Coding logic 125 may be located within FPGA 705: that is, FPGA 705 may also implement PCIe switch with Look-Aside Erasure Coding logic 125. FPGA 705 and PCIe switch with Look-Aside Erasure Coding logic 125 may then be connected to storage devices 130-1 through 130-4. While FIG. 8 shows FPGA 705 and PCIe switch with Look-Aside Erasure Coding logic 125 connected to four storage devices 130-1 through 130-4, embodiments of the inventive concept may include any number of storage devices 130-1 through 130-6.

Typically, the topology shown in FIG. 8 may be implemented within a single shell or housing, containing all of the components shown (SSDs 130-1 through 130-4 may be separate flash memories, rather than self-contained SSDs). That is, rather than being sold as separate components, the entire structure shown in FIG. 8 may be sold as a single unit. But embodiments of the inventive concept may also include a riser card connecting to machine 105 of FIG. 1 (perhaps to mid-plane 305 of FIG. 3) on one end and with connectors, such as U.2, M.3, or SFF-TA-1008 connectors on the other end to connect to storage devices 130-1 through 130-4. And while FIG. 8 shows PCIe switch with Look-Aside Erasure Coding logic 125 as part of FPGA 705, PCIe switch with Look-Aside Erasure Coding logic 125 may also be implemented as part of a Smart SSD.

Figure 9:
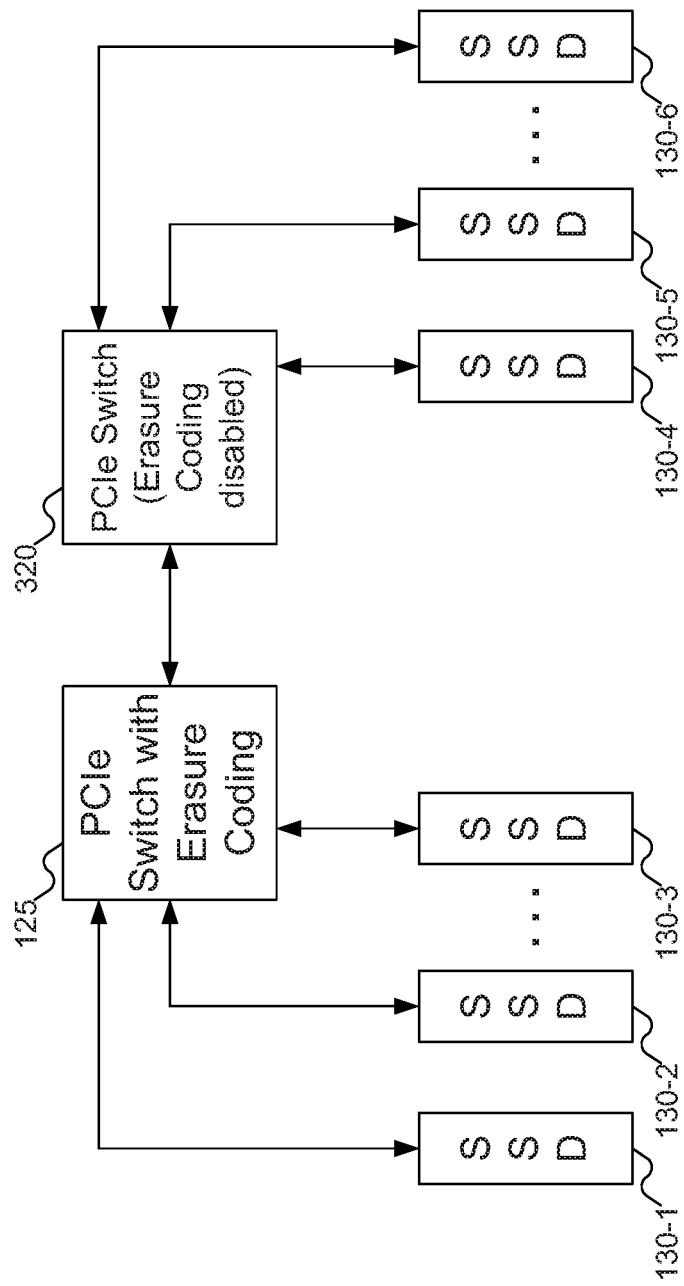
FIG. 9 shows a third topology for using the PCIe switch with Look-Aside Erasure Coding logic of FIG. 1, according to yet another embodiment of the inventive concept.

FIG. 9 shows a third topology for using PCIe switch with Look-Aside Erasure Coding logic 125 of FIG. 1, according to yet another embodiment of the inventive concept. In FIG. 9, two PCIe switches with Look-Aside Erasure Coding logic 125 and 320 are shown, between them connecting up to 24 storage devices 130-1 through 130-6. As described above with reference to FIG. 3, each PCIe switch with Look-Aside Erasure Coding logic 125 and 320 may include 96 PCIe lanes, with four PCIe lanes used in each direction to communicate with one of storage devices 130-1 through 130-6: each PCIe switch with Look-Aside Erasure Coding logic 125 and 320 may then support up to 12 storage devices. To support Erasure Coding across storage devices supported by multiple PCIe switches with Look-Aside Erasure Coding logic 125 and 320, one PCIe switch with Look-Aside Erasure Coding logic may be designated to be responsible for the Erasure Coding across all the devices, and may have the Look-Aside Erasure Coding logic enabled. The other PCIe switch with Look-Aside Erasure Coding logic 320 may operate purely as a PCIe switch, with the Look-Aside Erasure Coding logic disabled. The choice as to which PCIe switch should be selected to handle Erasure Coding may be done in any desired manner: for example, the two PCIe switches may negotiate this between themselves, or the PCIe switch that is enumerated first may be designated to handle Erasure Coding. The PCIe switch selected to handle Erasure Coding may then report the virtual storage device (spanning both PCIe switches), whereas the PCIe switch that does not handle Erasure Coding may report no downstream devices (to prevent processor 110 of FIG. 1 from attempting to access storage devices that are part of the Erasure Coding scheme).

Note that while PCIe switches with Look-Aside Erasure Coding logic 125 and 320 may both be in the same chassis, PCIe switches with Look-Aside Erasure Coding logic 125 and 320 may be in different chassis. That is, the Erasure Coding scheme may span storage devices across multiple chassis. All that is required is that the PCIe switches in the various chassis be able to negotiate with each other where the storage devices that are to be part of the Erasure Coding scheme are located. Nor are embodiments of the inventive concept limited to two PCIe switches with Look-Aside Erasure Coding logic 125 and 320: the storage devices included in the Erasure Coding scheme may be connected to any number of PCIe switches with Look-Aside Erasure Coding logic 125 and 320.

Host LBAs may be split across PCIe switches with Look-Aside Erasure Coding logic 125 and 320 in any desired manner. For example, the least significant bit in the host LBA may be used to identify which PCIe switch with Look-Aside Erasure Coding logic 125 or 320 includes the storage device storing the data with that host LBA. With more than two PCIe switches with Look-Aside Erasure Coding logic, multiple bits may be used to determine which PCIe switch with Look-Aside Erasure Coding logic manages the storage device storing the data. Once the appropriate PCIe switch with Look-Aside Erasure Coding logic has been identified (and snooping logic 525 of FIG. 5 has modified the transmission), the transmission may be routed to the appropriate PCIe switch with Look-Aside Erasure Coding logic (assuming that the transmission is not destined for a storage device connected to the PCIe switch with Look-Aside Erasure Coding logic with the Look-Aside Erasure Coding logic enabled).

In another embodiment of the inventive concept, rather than having a single PCIe switch with Look-Aside Erasure Coding logic be responsible for virtualizing all storage devices connected to both PCIe switches with Look-Aside Erasure Coding logic, each PCIe switch with Look-Aside Erasure Coding logic may create a separate virtual storage device (with a separate Erasure Coding domain). In this manner, different Erasure Coding domains may be created for different customers, but with smaller capacities.

FIG. 9 may also represent another embodiment of the inventive concept. Although FIG. 9 implies that only storage devices 130-1 through 130-6 are connected to PCIe switches with Look-Aside Erasure Coding logic 125 and 320, and that all storage devices 130-1 through 130-6 may be used with the Erasure Coding scheme, as discussed above embodiments of the inventive concept are not so limited: PCIe switches with Look-Aside Erasure Coding logic 125 and 320 may have devices that do not qualify for Erasure Coding connected to them. Such devices may be grouped under a single PCIe switch with Look-Aside Erasure Coding logic, with storage devices that qualify for Erasure Coding grouped under a different PCIe switch with Look-Aside Erasure Coding logic 125. In this manner, the optimal functionality of machine 105 of FIG. 1 may be achieved, with one (or some) PCIe switch with Look-Aside Erasure Coding logic enabling the Look-Aside Erasure Coding logic and one (or some) PCIe switch with Look-Aside Erasure Coding logic disabling the Look-Aside Erasure Coding logic.

Figure 10:
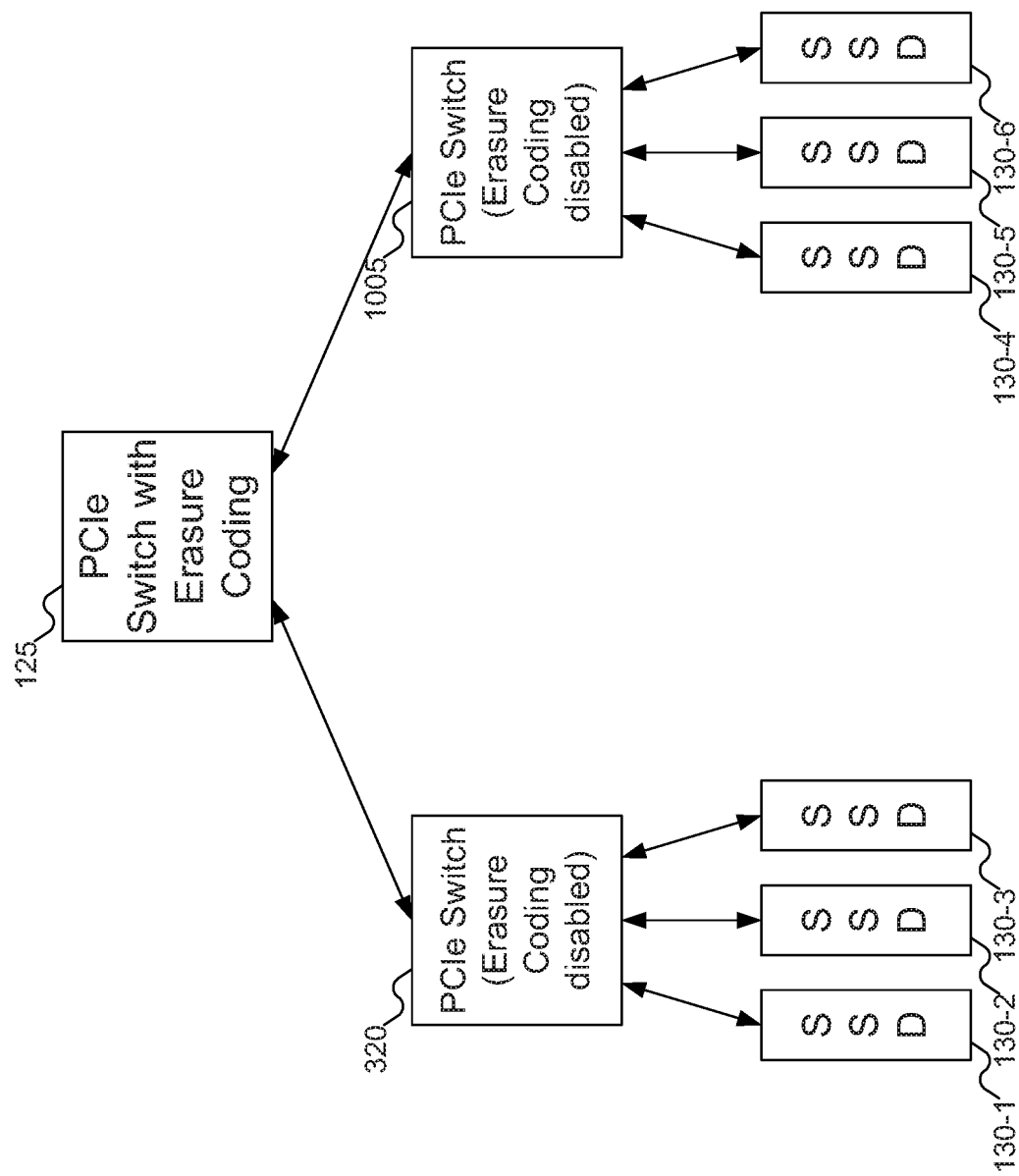
FIG. 10 shows a fourth topology for using the PCIe switch with Look-Aside Erasure Coding logic of FIG. 1, according to yet another embodiment of the inventive concept.

FIG. 10 shows a fourth topology for using PCIe switch with Look-Aside Erasure Coding logic 125 of FIG. 1, according to yet another embodiment of the inventive concept. In FIG. 10, as compared with FIG. 9, PCIe switches with Look-Aside Erasure Coding logic 125, 320, and 1005 may be structured in a hierarchy. PCIe switch with Look-Aside Erasure Coding logic 125, at the top of the hierarchy, may manage Erasure Coding for all storage devices beneath PCIe switch with Look-Aside Erasure Coding logic 125 in the hierarchy, and so may have the Look-Aside Erasure Coding logic enabled. PCIe switches with Look-Aside Erasure Coding logic 320 and 1005, on the other hand, may have their Look-Aside Erasure Coding logics disabled (since their storage devices are managed by the Look-Aside Erasure Coding logic of PCIe switch with Look-Aside Erasure Coding logic 125).

While FIG. 10 shows three PCIe switches with Look-Aside Erasure Coding logic 125, 320, and 1005 structured in a two-tier hierarchy, embodiments of the inventive concept are not limited in the number of PCIe switches included or in their hierarchical arrangement. Embodiments of the inventive concept may therefore support any number of PCIe switches with Look-Aside Erasure Coding logic, arranged in any desired hierarchy.

The embodiments of the inventive concept described above with reference to FIGS. 1-10 focus on single-port storage devices. But embodiments of the inventive concept may extend to dual-port storage devices, where one (or more) storage devices communicates with multiple PCIe switches with Look-Aside Erasure Coding logic. In such embodiments of the inventive concept, if PCIe switch with Look-Aside Erasure Coding logic 125 of FIG. 3 is unable communicate with the dual-port storage device, PCIe switch with Look-Aside Erasure Coding logic 125 may send a transmission to PCIe switch with Look-Aside Erasure Coding logic 320 to attempt to communicate with the storage device. PCIe switch with Look-Aside Erasure Coding logic 320 effectively acts as a bridge to let PCIe switch with Look-Aside Erasure Coding logic 125 communicate with the storage device.

Embodiments of the inventive concept may also support detecting and handling a storage device failure. For example, consider again FIG. 4, and assume that storage device 130-1 fails. Storage device 130-1 may fail for any number of reasons: a power surge might have damaged the electronics, the wiring (inside storage device 130-1 or in the connection between storage device 130-1 and PCIe switch with Look-Aside Erasure Coding logic 125) may have failed, storage device 130-1 may have detected too many errors and shut itself down, or storage device 130-1 may have failed for other reasons. Storage device 130-1 may also have been removed from its slot by the user (perhaps to replace it with a newer, more reliable, or larger storage device). Whatever the reason, storage device 130-1 may become unavailable.

PCIe switch with Look-Aside Erasure Coding logic 125 may detect the failure of storage device 130-1 via a Presence pin on the connector to storage device 130-1. If storage device 130-1 is removed from the chassis, or if storage device 130-1 has shut down, it may no longer assert its presence via the Presence pin on the connector, which may trigger an interrupt in PCIe switch with Look-Aside Erasure Coding logic 125. Alternatively, PCIe switch with Look-Aside Erasure Coding logic 125 (or BMC 325 of FIG. 3) may send occasional messages to storage device 130-1 to check that it is still active (a process sometimes called a "heartbeat"): if storage device 130-1 does not respond to such messages, PCIe switch with Look-Aside Erasure Coding logic 125 or BMC 325 of FIG. 3 may conclude that storage device 130-1 has failed.

If and when storage device 130-1 fails, PCIe switch with Look-Aside Erasure Coding logic 125 may manage the situation by accessing any data that would normally be requested from storage device 130-1 using other means. For example, if there is a mirror of storage device 130-1, PCIe switch with Look-Aside Erasure Coding logic 125 may request the data from the mirror of storage device 130-1. Or, PCIe switch with Look-Aside Erasure Coding logic 125 may request the rest of the stripe containing the desired data from the other storage devices in the array, and use the Erasure Coding information to reconstruct the data from storage device 130-1. There may be other mechanisms by which PCIe switch with Look-Aside Erasure Coding logic 125 may access the data that was stored on failed storage device 130-1.

Embodiments of the inventive concept may also support detecting and handling the insertion of a new storage device into the array. As with detecting the failure of storage devices, PCIe switch with Look-Aside Erasure Coding logic 125 (or BMC 325 of FIG. 3) may detect the insertion of a new storage device via the Presence pin on the connector (as with detecting a failed storage device, detecting a new storage device using the Presence pin may trigger an interrupt in PCIe switch with Look-Aside Erasure Coding logic 125), by occasionally pinging devices to see what is connected, or any other desired mechanism. When a new storage device is detected, PCIe switch with Look-Aside Erasure Coding logic 125 may add that new storage device to the array. Adding a new storage device to the array does not necessarily involve changing the Erasure Coding scheme: such a change might require changing all the data stored on the storage devices. (For example, consider a change from RAID 5 to RAID 6: each stripe would now need two parity blocks, which would need to be rotated across the storage devices, requiring large amounts of data to be computed and moved.) But adding a new storage device to an existing Erasure Coding scheme may not require moving large amounts of data around. So while adding a new storage device may not increase the array's tolerance for storage device failures, adding a new storage device may still increase the capacity of the virtual storage device.

If there had been a failed storage device in the array, the insertion of the new storage device may be used to rebuild the failed storage device. Erasure Coding Controller 530 of FIG. 5 may compute the data that was stored on the failed storage device, and store that data in the appropriate block addresses on the replacement storage device. For example, original data that was on the failed storage device may be computed from the data on the other storage devices (both original data and parity or code information); parity or code information stored on the failed storage device may be recomputed from the original data on the other storage devices. (Of course, if the failed storage device was mirrored, Erasure Coding Controller 530 of FIG. 5 may simply instruct that the data be copied from the mirror onto the replacement storage device.)

Rebuilding a failed storage device may be a time-consuming process. In some embodiments of the inventive concept rebuilding may occur as soon as the replacement storage device is installed. In other embodiments of the inventive concept, to the extent that the storage device may be rebuilt in slack periods of time, Erasure Coding Controller 530 of FIG. 5 may do so. If the virtual storage device is busy, however, Erasure Coding Controller 530 of FIG. 5 may defer rebuilding the replacement storage device until a slack time occurs, and may reconstruct data from the failed storage device on an as-needed basis based on requests from processor 110 of FIG. 1. (Such rebuilt data may, of course, be written to the replacement storage device without waiting for the complete rebuild, thereby avoiding the need to re-compute that data again later.)

Embodiments of the inventive concept may also support initialization of storage devices. When a new storage device is added to the array—either as a replacement storage device for a failed storage device, or to increase the capacity of the virtual storage device—the new storage device may be initialized. Initialization may include preparing the storage device for the Erasure Coding scheme.

Initialization of the new storage device may also involve erasing existing data from the new storage device. For example, consider the situation where a particular storage device was leased to a customer. That customer's lease has ended, and the storage device may be repurposed to a new customer. But the storage device may still have data from the original customer stored thereon. To avoid a later customer gaining access to an earlier customer's data, the data on the storage device may be erased using any desired mechanism. For example, tables storing information about where data was stored may be erased. Or the data itself may be overwritten with new data (to prevent later attempts to recover any information that might have been deleted): the new data may use patterns designed to help ensure the original data may not be recovered. For example, the U.S. Department of Defense (DOD) has released standards for how to erase data to prevent recovery: these standards may be used to erase old data on the storage device before it is repurposed for a new client.

Initialization may not be limited to when a new storage device is hot-added to an existing array. Initialization may also occur when the storage device, or PCIe switch with Look-Aside Erasure Coding logic 125, or machine 105 of FIG. 1 as a whole, initially powers up.

Figure 11A:
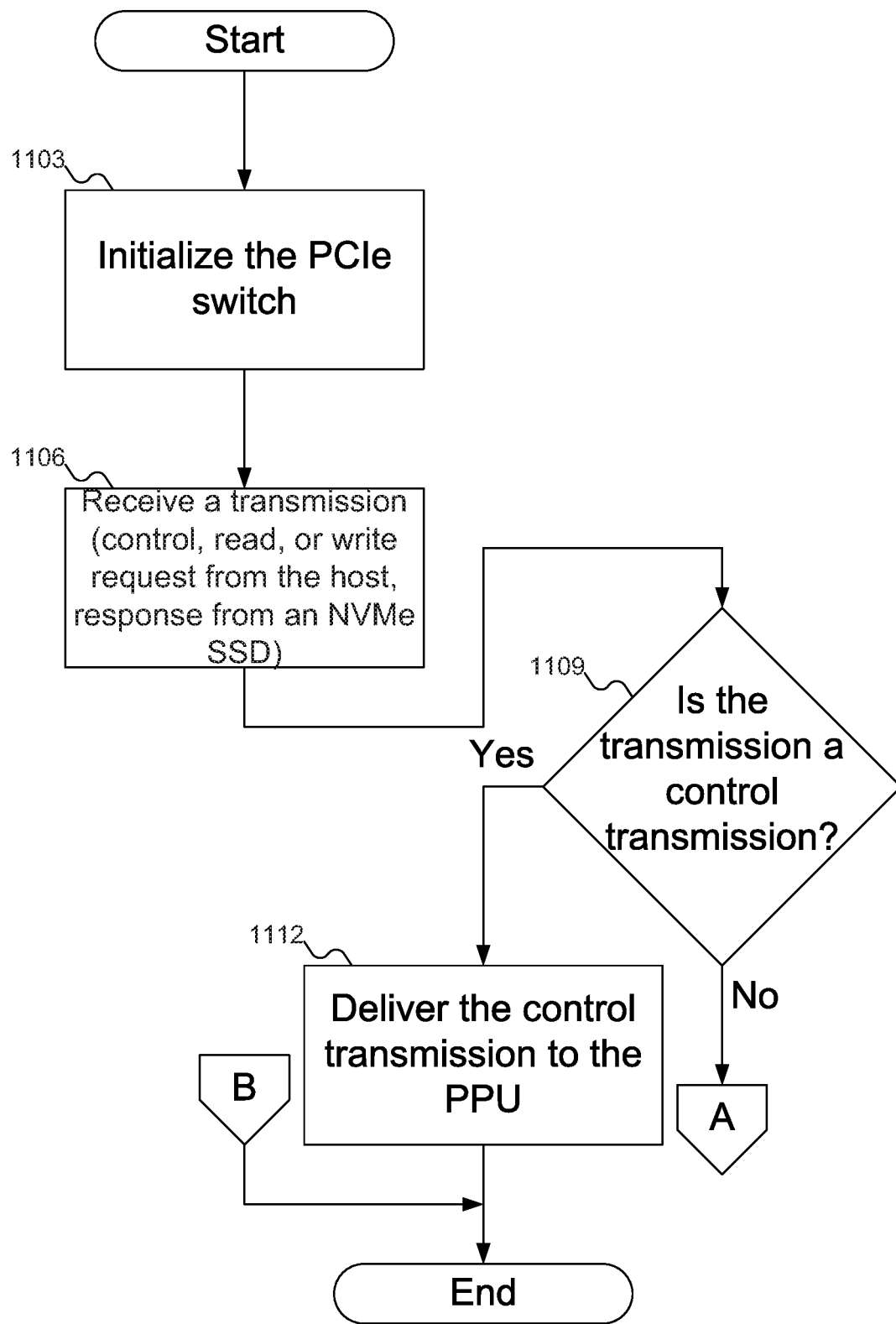
FIGS. 11A-11D show a flowchart of an example procedure for the PCIe switch with Look-Aside Erasure Coding logic of FIG. 1 to support an Erasure Coding scheme, according to an embodiment of the inventive concept.
Figure 11B:
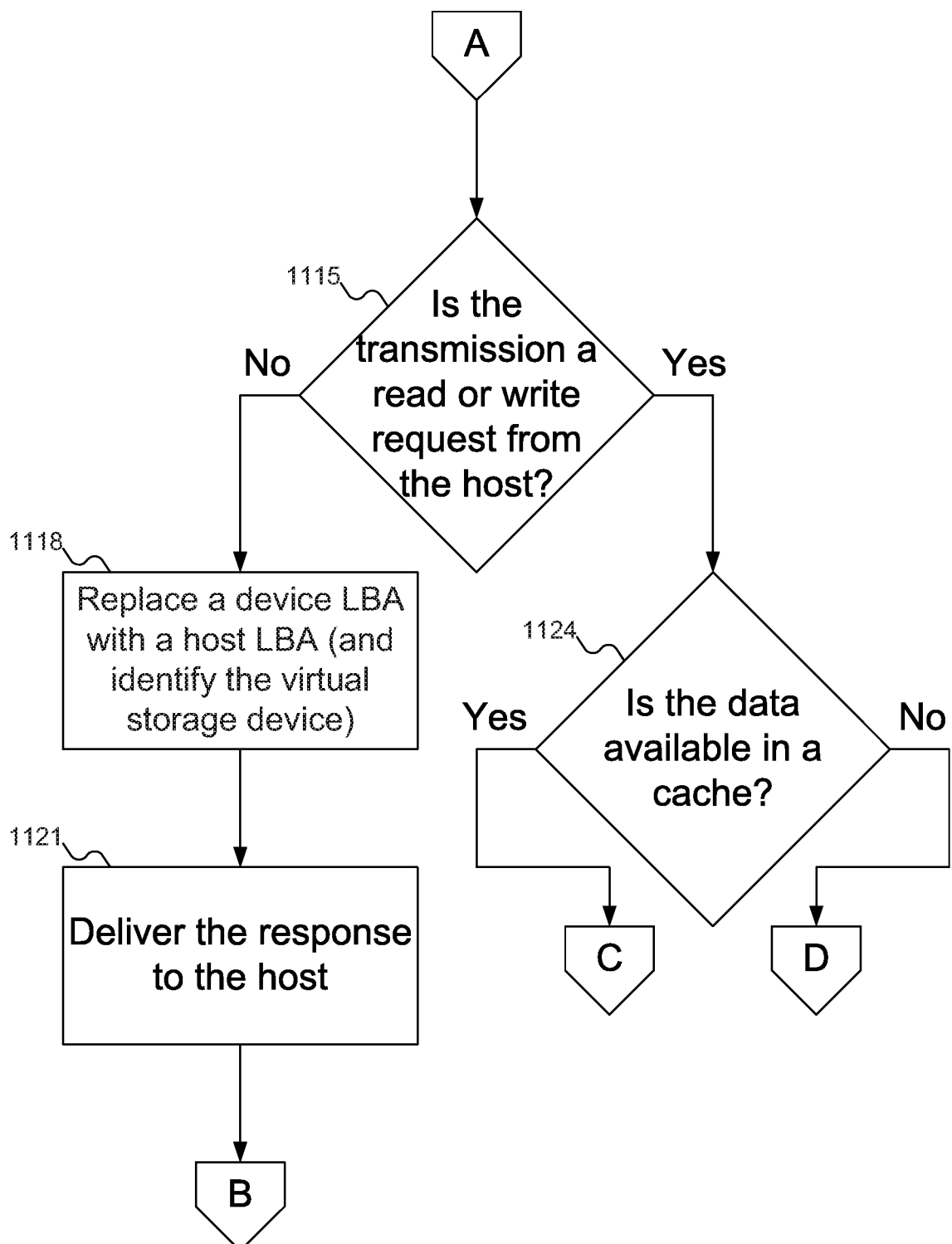
Figure 11C:
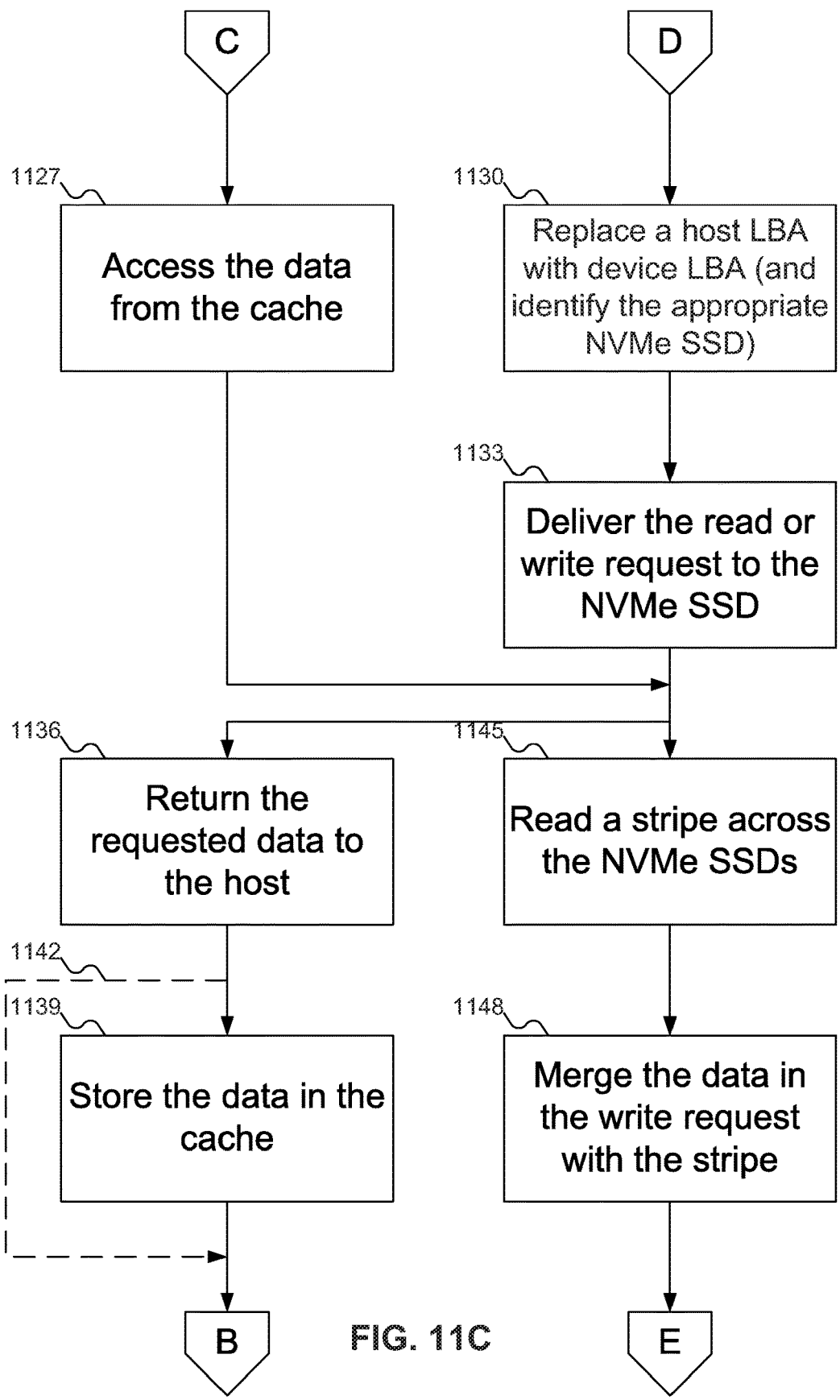
Figure 11D:
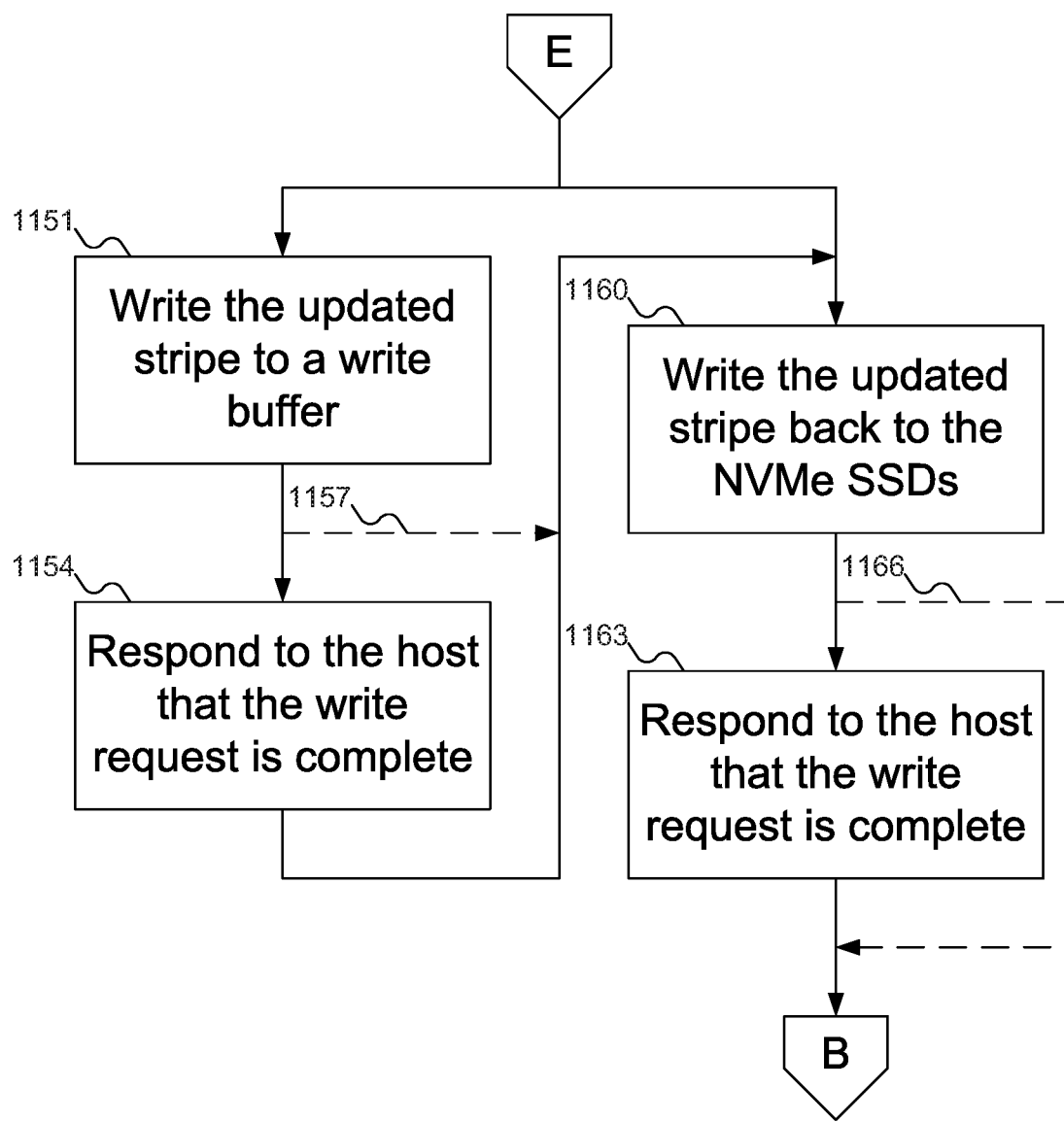

FIGS. 11A-11D show a flowchart of an example procedure for PCIe switch with Look-Aside Erasure Coding logic 125 of FIG. 1 to support Erasure Coding schemes 405, 410, and 415 of FIG. 4, according to an embodiment of the inventive concept. In FIG. 11A, at block 1103, PCIe switch with Look-Aside Erasure Coding logic 125 of FIG. 3 may be initialized, perhaps by BMC 325 of FIG. 3 or processor 110 of FIG. 1. At block 1106, PCIe switch with Look-Aside Erasure Coding logic 125 of FIG. 3 may receive a transmission. This transmission may be a read or write request from processor 110 of FIG. 1, a control transmission from processor 110 of FIG. 1 or BMC 325 of FIG. 3, or a transmission sent by storage device 130-1 through 130-6 of FIG. 3 in response to a read or write request from processor 110 of FIG. 1

At block 1109, snooping logic 525 of FIG. 5 may determine whether the transmission is a control transmission from processor 110 of FIG. 1. If so, then at block 1112 PCIe switch with Look-Aside Erasure Coding logic 125 of FIG. 3 may deliver the control transmission to PPU 520 of FIG. 5, after which processing ends.

If the transmission was not a control transmission from processor 110 of FIG. 1, then at block 1115 (FIG. 11B) snooping logic 525 of FIG. 5 may determine if the transmission is a read or write request from the host. If not, then at block 1118 snooping logic 525 of FIG. 5 may replace a device LBA in the transmission with a host LBA appropriate to the host. Snooping logic 525 of FIG. 5 may also modify the transmission to imply that the transmission is from the virtual storage device rather than the physical storage device that stored the actual data. At block 1121 PCIe switch with Look-Aside Erasure Coding logic 125 of FIG. 3 may deliver the transmission to processor 110 of FIG. 1, after which processing ends.

On the other hand, if the transmission is a read or write request from processor 110 of FIG. 1, then at block 1124 snooping logic 525 of FIG. 5 may determine if the data in question is available in either cache 545 of FIG. 5 or write buffer 550 of FIG. 5. If the data is available in cache 545 of FIG. 5 or write buffer 550 of FIG. 5, then at block 1127 (FIG. 11C) Erasure Coding Controller 530 of FIG. 5 may access the data from the appropriate location.

If the data is not available in cache 545 of FIG. 5 or write buffer 550 of FIG. 5, then at block 1130 snooping logic 525 of FIG. 5 may modify the transmission to replace the host LBA provided by the host with device LBA from which the storage device should read the data. Snooping logic 525 of FIG. 5 may also modify the transmission to identify the appropriate storage device to receive the transmission. Then, at block 1133, snooping logic 525 may deliver the transmission to the appropriate storage device.

Regardless of whether the data in question was accessible from a cache or read from the storage device, at this point PCIe switch with Look-Aside Erasure Coding logic 125 of FIG. 3 has the needed data. At this point, processing may diverge. If the transmission was a read request from processor 110 of FIG. 1, then at block 1136 PCIe switch with Look-Aside Erasure Coding logic 125 of FIG. 3 may return the data to processor 110 of FIG. 1. Snooping logic 525 of FIG. 1 may also store the data in cache 545 of FIG. 5, as shown in block 1139; block 1139 is optional and may be omitted as shown by dashed line 1142. At this point, processing ends.

On the other hand, if the transmission from processor 110 of FIG. 1 was a write request, then at block 1145 Erasure Coding Controller 530 of FIG. 5 may read a stripe across storage devices 130-1 through 130-6 of FIG. 3. Block 1145 is effectively a restatement of blocks 1127, 1130, and 1133 and may not be needed; block 1145 is included in FIG. 11C to emphasize that writing data to the virtual storage device may involve reading data from the entire stripe across storage devices 130-1 through 130-6. At block 1148, Erasure Coding Controller 530 of FIG. 5 may merge the data received from processor 110 of FIG. 1 with the data stripe accessed from the cache or from storage devices 130-1 through 130-6.

At this point, processing again may diverge depending on whether or not PCIe switch with Look-Aside Erasure Coding logic 125 of FIG. 3 includes write buffer 550 of FIG. 5. If PCIe switch with Look-Aside Erasure Coding logic 125 of FIG. 3 includes write buffer 550 of FIG. 5, then at block 1151 (FIG. 11D) Erasure Coding Controller 530 of FIG. 5 may write the merged data stripe to write buffer 550 of FIG. 5 (marking that data as dirty and in need of flushing to storage devices 130-1 through 130-6). Then at block 1154 PCIe switch with Look-Aside Erasure Coding logic 125 of FIG. 3 may report to processor 110 of FIG. 1 that the write request is complete. Note that block 1154 is appropriate if write buffer 550 of FIG. 5 uses a write-back cache policy; if write buffer 550 of FIG. 5 uses a write-through cache policy, then block 1154 may be omitted, as shown by dashed line 1157.

Eventually, either because PCIe switch with Look-Aside Erasure Coding logic 125 of FIG. 3 does not include write buffer 550 of FIG. 5 or because the data in write buffer 550 of FIG. 5 is to be flushed to storage devices 130-1 through 130-6 of FIG. 3, at block 1160 Erasure Coding Controller 530 of FIG. 5 may write the updated stripe back to storage devices 130-1 through 130-6 of FIG. 3. Then, at block 1163 PCIe switch with Look-Aside Erasure Coding logic 125 of FIG. 3 may report to processor 110 of FIG. 1 that the write request is complete. Note that if the merged data had been stored in write buffer 550 of FIG. 5 and write buffer 550 of FIG. 5 uses a write-back cache policy, block 1163 is not necessary: PCIe switch with Look-Aside Erasure Coding logic 125 of FIG. 3 has already reported the write request as complete (at block 1154). In this situation, block 1163 may be omitted, as shown by dashed line 1166. At this point, processing ends.

Figure 12A:
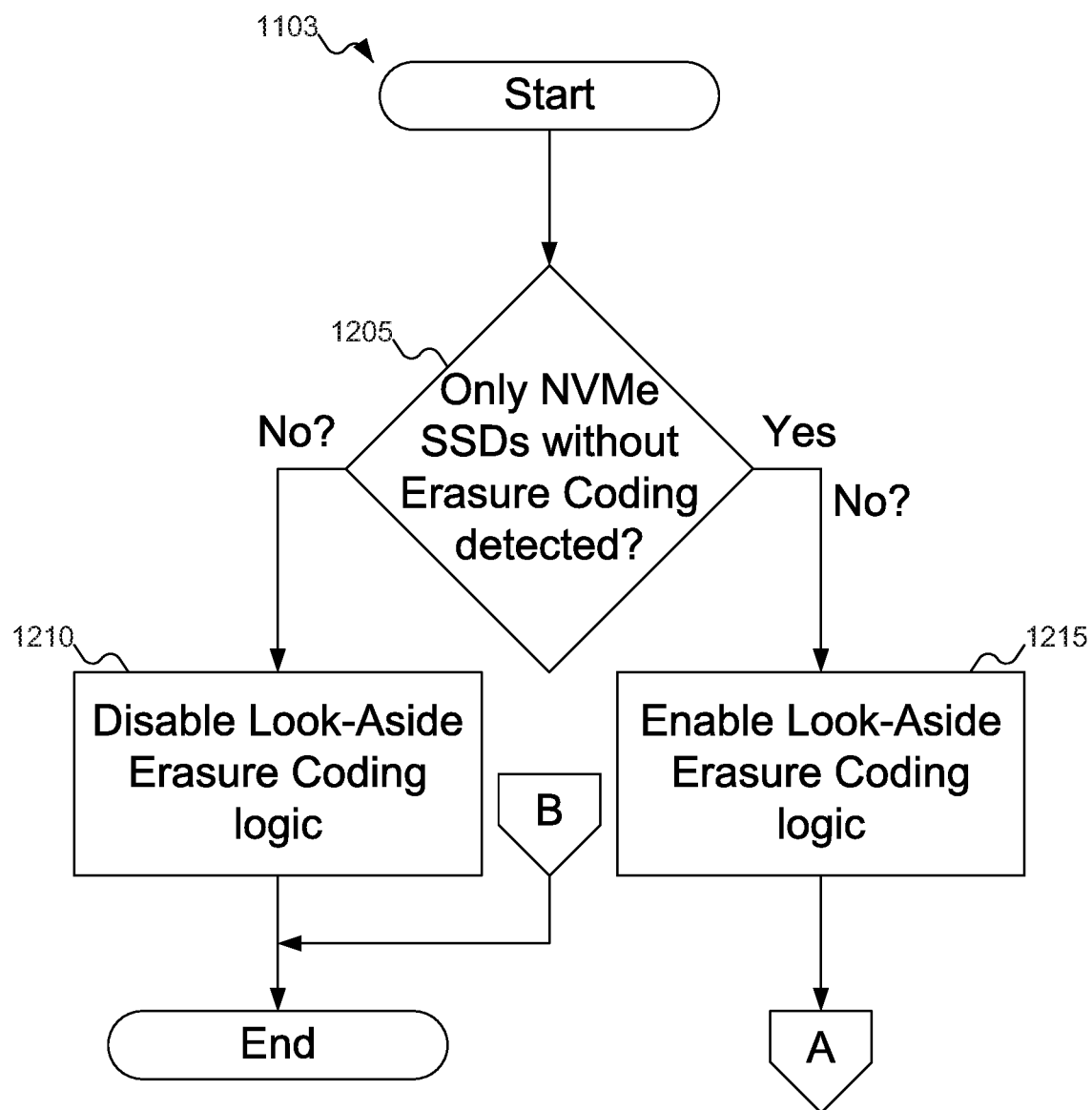
FIGS. 12A-12B shows a of an example procedure for the PCIe switch with Look-Aside Erasure Coding logic of FIG. 1 to perform initialization, according to an embodiment of the inventive concept.
Figure 12B:
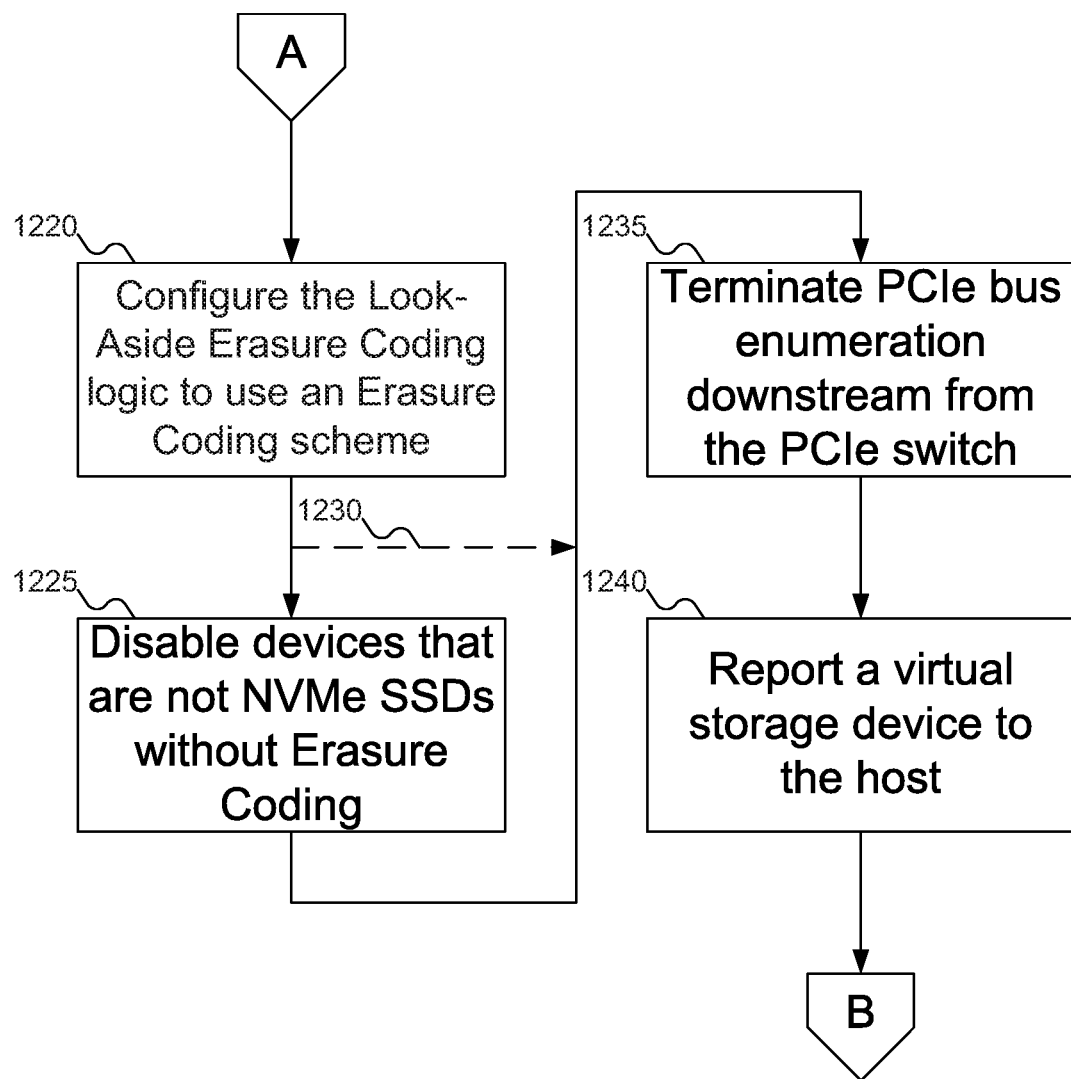

FIGS. 12A-12B shows a of an example procedure for PCIe switch with Look-Aside Erasure Coding logic 125 of FIG. 1 to perform initialization, according to an embodiment of the inventive concept. In FIG. 12A, at block 1205, PCIe switch with Look-Aside Erasure Coding logic 125 of FIG. 3 determines whether the devices connected to PCIe switch with Look-Aside Erasure Coding logic 125 of FIG. 3 are only storage devices and may have Erasure Coding managed by PCIe switch with Look-Aside Erasure Coding logic 125 of FIG. 3. If there is a device connected to PCIe switch with Look-Aside Erasure Coding logic 125 of FIG. 3 that is not a storage device, or is a storage device that may not have Erasure Coding managed by PCIe switch with Look-Aside Erasure Coding logic 125 of FIG. 3, then in some embodiments of the inventive concept, at block 1210, PCIe switch with Look-Aside Erasure Coding logic 125 of FIG. 3 may disable the Look-Aside Erasure Coding logic, after which processing ends.

But in other embodiments of the inventive concept, PCIe switch with Look-Aside Erasure Coding logic 125 of FIG. 3 may manage Erasure Coding even if there are devices connected to PCIe switch with Look-Aside Erasure Coding logic 125 of FIG. 3 that do not qualify for Erasure Coding. In these embodiments of the inventive concept, or if only storage devices that qualify for Erasure Coding are connected to PCIe switch with Look-Aside Erasure Coding logic 125 of FIG. 3, at block 1215 PCIe switch with Look-Aside Erasure Coding logic 125 of FIG. 3 may enable the Look-Aside Erasure Coding logic. Then, at block 1220 (FIG. 12B), PCIe switch with Look-Aside Erasure Coding logic 125 of FIG. 3 may be configured to use an Erasure Coding scheme (perhaps by BMC 325 of FIG. 3 or processor 110 of FIG. 1).

At block 1225, PCIe switch with Look-Aside Erasure Coding logic 125 of FIG. 3 may disable devices that do not qualify for Erasure Coding. Note that block 1225 is optional, as shown by dashed line 1230: there might not be any devices connected to PCIe switch with Look-Aside Erasure Coding logic 125 of FIG. 3 that do not qualify for Erasure Coding, or PCIe switch with Look-Aside Erasure Coding logic 125 of FIG. 3 might permit processor 110 of FIG. 1 to access those devices that do not qualify for Erasure Coding despite using Erasure Coding for other devices.

At block 1235, PCIe switch with Look-Aside Erasure Coding logic 125 of FIG. 3 may terminate enumeration downstream from PCIe switch with Look-Aside Erasure Coding logic 125 of FIG. 3 for any devices that are subject to Erasure Coding. At block 1240, PCIe switch with Look-Aside Erasure Coding logic 125 of FIG. 3 may report a virtual storage device to processor 110 of FIG. 1 based on storage devices 130-1 through 130-6 of FIG. 3 being subject to Erasure Coding. PCIe switch with Look-Aside Erasure Coding logic 125 of FIG. 3 may also report any other PCIe devices that may be enumerated to processor 110 of FIG. 1. At this point, processing ends.

Figure 13:
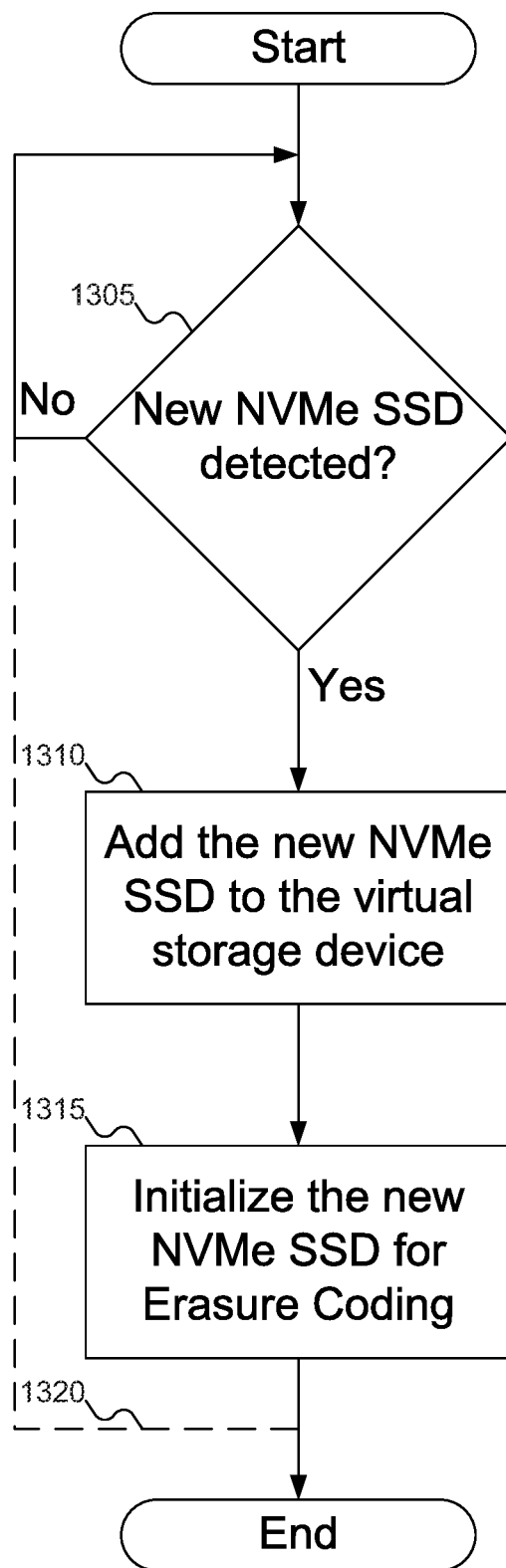
FIG. 13 shows a flowchart of an example procedure for the PCIe switch with Look-Aside Erasure Coding logic of FIG. 1 to incorporate a new storage device into the Erasure Coding scheme, according to an embodiment of the inventive concept.

FIG. 13 shows a flowchart of an example procedure for PCIe switch with Look-Aside Erasure Coding logic 125 of FIG. 1 to incorporate a new storage device into Erasure Coding schemes 405, 410, and 415 of FIG. 4, according to an embodiment of the inventive concept. In FIG. 13, at block 1305, PCIe switch with Look-Aside Erasure Coding logic 125 of FIG. 3 (or BMC 325 of FIG. 3) may check for a new storage device. If a new storage device is detected, then at block 1310, Erasure Coding Controller 530 of FIG. 5 may add the new storage device to the array behind the virtual storage device. Finally, at block 1315, PCIe switch with Look-Aside Erasure Coding logic 125 of FIG. 3 (or BMC 325 of FIG. 5, or processor 110 of FIG. 1) may initialize the new storage device. At this point, processing may end, or may return to block 1305 to check for additional new storage devices, as shown by dashed line 1320.

Figure 14:
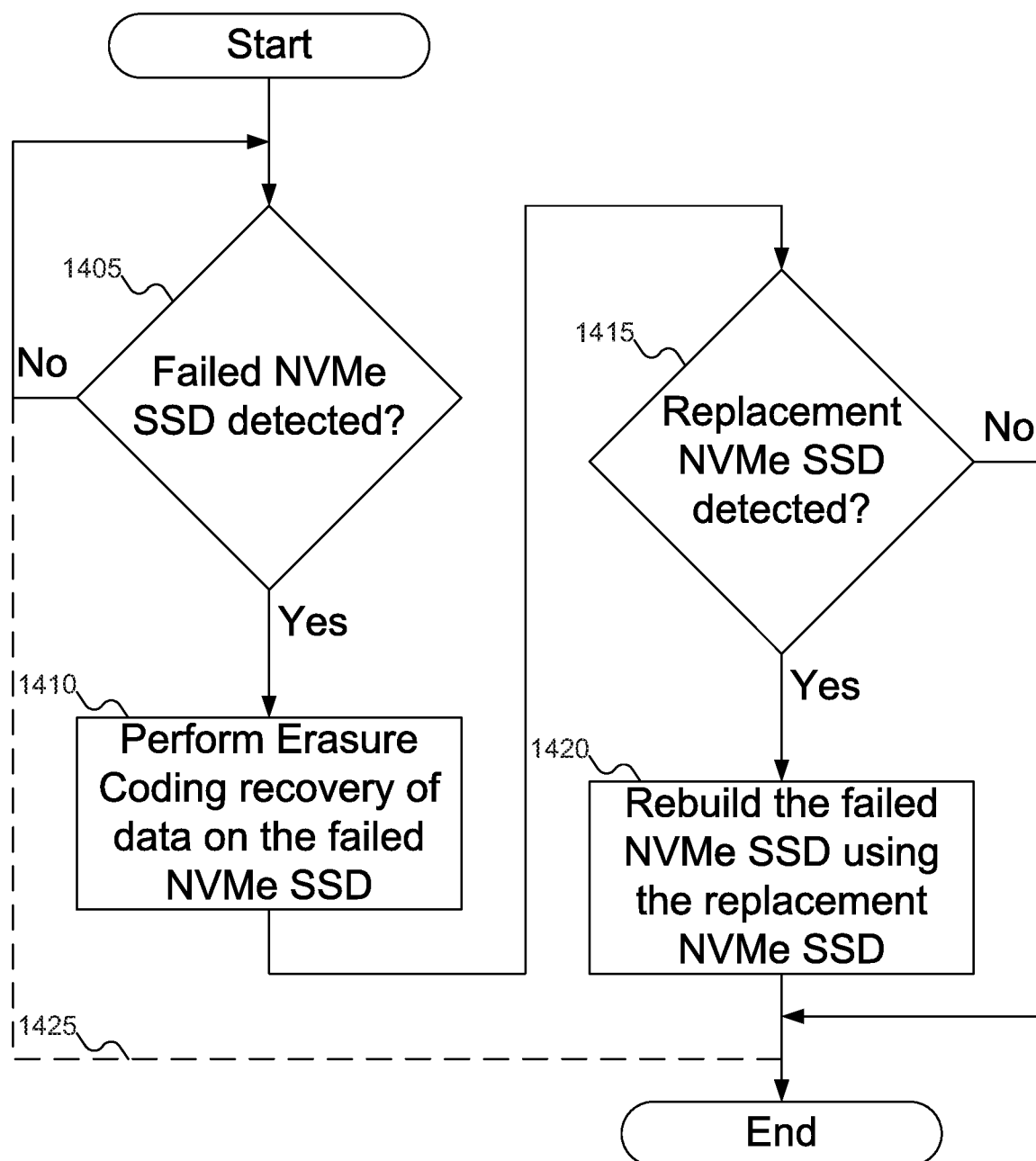
FIG. 14 shows a flowchart of an example procedure for the PCIe switch with Look-Aside Erasure Coding logic of FIG. 1 to handle a failed storage device, according to an embodiment of the inventive concept.

FIG. 14 shows a flowchart of an example procedure for PCIe switch with Look-Aside Erasure Coding logic 125 of FIG. 1 to handle a failed storage device, according to an embodiment of the inventive concept. In FIG. 14, at block 1405, PCIe switch with Look-Aside Erasure Coding logic 125 of FIG. 3 (or BMC 325 of FIG. 3) may check for a failed (or removed) storage device. If a failed storage device is detected, then at block 1410, Erasure Coding Controller 530 of FIG. 5 may perform Erasure Coding recovery of data that had been stored on the failed storage device, as read requests arrive that would have accessed data from the failed storage device. This Erasure Coding recovery may involve reading data from the stripe including the requested data from other storage devices and computing the requested data from the rest of the data in the stripe.

At block 1415, PCIe switch with Look-Aside Erasure Coding logic 125 of FIG. 3 (or BMC 325 of FIG. 3) may determine whether a replacement storage device has been added to the array behind the virtual storage device. If so, then at block 1420 Erasure Coding Controller 530 of FIG. 5 may rebuild the failed storage device using the replacement storage device. At this point, processing may end, or may return to block 1405 to check for additional new storage devices, as shown by dashed line 1425.

In FIGS. 11A-14, some embodiments of the inventive concept are shown. But a person skilled in the art will recognize that other embodiments of the inventive concept are also possible, by changing the order of the blocks, by omitting blocks, or by including links not shown in the drawings. All such variations of the flowcharts are considered to be embodiments of the inventive concept, whether expressly described or not.

Embodiments of the inventive concept offer technical advantages over the prior art. Using a PCIe switch with Look-Aside Erasure Coding logic moves Erasure Coding closer to the storage devices, which reduces the time required to move data around. Moving Erasure Coding off of the processor reduces the load on the processor, permitting the processor to execute more instructions for applications.

By using a configurable Erasure Coding Controller, any desired Erasure Coding scheme may be used, rather than the limited set of schemes supported by hardware and software Erasure Coding vendors. By placing the Erasure Coding Controller with the PCIe switch, the need for expensive RAID add-in cards is avoided, and larger arrays may be used, even spanning multiple chassis.

The following discussion is intended to provide a brief, general description of a suitable machine or machines in which certain aspects of the inventive concept may be implemented. The machine or machines may be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines may include embedded controllers, such as programmable or non-programmable logic devices or arrays, Application Specific Integrated Circuits (ASICs), embedded computers, smart cards, and the like. The machine or machines may utilize one or more connections to one or more remote machines, such as through a network interface, modem, or other communicative coupling. Machines may be interconnected by way of a physical and/or logical network, such as an intranet, the Internet, local area networks, wide area networks, etc. One skilled in the art will appreciate that network communication may utilize various wired and/or wireless short range or long range carriers and protocols, including radio frequency (RF), satellite, microwave, Institute of Electrical and Electronics Engineers (IEEE) 802.11, Bluetooth®, optical, infrared, cable, laser, etc.

Embodiments of the present inventive concept may be described by reference to or in conjunction with associated data including functions, procedures, data structures, application programs, etc. which when accessed by a machine results in the machine performing tasks or defining abstract data types or low-level hardware contexts. Associated data may be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data may be delivered over transmission environments, including the physical and/or logical network, in the form of packets, serial data, parallel data, propagated signals, etc., and may be used in a compressed or encrypted format. Associated data may be used in a distributed environment, and stored locally and/or remotely for machine access.

Embodiments of the inventive concept may include a tangible, non-transitory machine-readable medium comprising instructions executable by one or more processors, the instructions comprising instructions to perform the elements of the inventive concepts as described herein.

The various operations of methods described above may be performed by any suitable means capable of performing the operations, such as various hardware and/or software component(s), circuits, and/or module(s). The software may comprise an ordered listing of executable instructions for implementing logical functions, and may be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

Having described and illustrated the principles of the inventive concept with reference to illustrated embodiments, it will be recognized that the illustrated embodiments may be modified in arrangement and detail without departing from such principles, and may be combined in any desired manner. And, although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms may reference the same or different embodiments that are combinable into other embodiments.

The foregoing illustrative embodiments are not to be construed as limiting the inventive concept thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this inventive concept as defined in the claims.

Embodiments of the inventive concept may extend to the following statements, without limitation:

Statement 1. An embodiment of the inventive concept includes a Peripheral Component Interconnect Express (PCIe) switch with Erasure Coding logic, comprising:
an external connector to enable the PCIe switch to communicate with a processor;
at least one connector to enable the PCIe switch to communicate with at least one storage device;
a Power Processing Unit (PPU) to handle configuration of the PCIe switch;
an Erasure Coding Controller including circuitry to apply an Erasure Coding scheme to data stored on the at least one storage device; and
a snooping logic including circuitry to intercept a data transmission received at the PCIe switch and modify the data transmission responsive to the Erasure Coding scheme.

Statement 2. An embodiment of the inventive concept includes the PCIe switch with Erasure Coding logic according to statement 1, wherein the Erasure Coding logic is comprising at least one of a Look-Aside Erasure Coding logic and a Look-Through Erasure Coding logic.

Statement 3. An embodiment of the inventive concept includes the PCIe switch with Erasure Coding logic according to statement 1, wherein the at least one storage device include at least one Non-Volatile Memory Express (NVMe) Solid State Drive (SSD).

Statement 4. An embodiment of the inventive concept includes the PCIe switch with Erasure Coding logic according to statement 3, wherein the snooping logic is operative to intercept a control transmission received at the PCIe switch and forward the control transmission to the PPU.

Statement 5. An embodiment of the inventive concept includes the PCIe switch with Erasure Coding logic according to statement 3, wherein the snooping logic is operative to intercept the data transmission received at the PCIe switch from a host and replace a host Logical Block Address (LBA) used by the host in the data transmission with a device LBA used by the at least one NVMe SSD.

Statement 6. An embodiment of the inventive concept includes the PCIe switch with Erasure Coding logic according to statement 5, wherein the snooping logic is further operative to direct the data transmission to the at least one NVMe SSD.

Statement 7. An embodiment of the inventive concept includes the PCIe switch with Erasure Coding logic according to statement 3, wherein the snooping logic is operative to intercept the data transmission received at the PCIe switch from one of the at least one NVMe SSD and replace a device LBA used by the one of the at least one NVMe SSD in the data transmission with a host LBA used by a host.

Statement 8. An embodiment of the inventive concept includes the PCIe switch with Erasure Coding logic according to statement 3, further comprising a cache.

Statement 9. An embodiment of the inventive concept includes the PCIe switch with Erasure Coding logic according to statement 8, wherein the snooping logic is operative to return a response to the data transmission from a host based at least in part on a data requested in the data transmission is present in the cache.

Statement 10. An embodiment of the inventive concept includes the PCIe switch with Erasure Coding logic according to statement 3, wherein:
the PCIe switch is located in a chassis; and
the chassis includes a memory used as an external cache by the Erasure Coding Controller.

Statement 11. An embodiment of the inventive concept includes the PCIe switch with Erasure Coding logic according to statement 3, further comprising a write buffer.

Statement 12. An embodiment of the inventive concept includes the PCIe switch with Erasure Coding logic according to statement 11, wherein:
the data transmission includes a write operation from a host; and
the Erasure Coding Controller is operative to complete the write operation after sending a response to the data transmission to the host.

Statement 13. An embodiment of the inventive concept includes the PCIe switch with Erasure Coding logic according to statement 11, wherein the Erasure Coding Controller is operative to store a data in the write operation in the write buffer.

Statement 14. An embodiment of the inventive concept includes the PCIe switch with Erasure Coding logic according to statement 3, wherein the PCIe switch is operative to enable the Erasure Coding Controller and the snooping logic based at least in part on all of the at least one NVMe SSD may be used with the Erasure Coding Controller.

Statement 15. An embodiment of the inventive concept includes the PCIe switch with Erasure Coding logic according to statement 3, wherein the PCIe switch is operative to disable the Erasure Coding Controller and the snooping logic based at least in part on the at least one NVMe SSD includes built-in Erasure Coding functionality.

Statement 16. An embodiment of the inventive concept includes the PCIe switch with Erasure Coding logic according to statement 15, wherein the PCIe switch is operative to inform a user that the Erasure Coding Controller and the snooping logic are disabled based at least in part on the at least one NVMe SSD includes built-in Erasure Coding functionality.

Statement 17. An embodiment of the inventive concept includes the PCIe switch with Erasure Coding logic according to statement 3, wherein the PCIe switch is operative to disable the Erasure Coding Controller and the snooping logic based at least in part on at least one non-storage device being connected to the PCIe switch using the at least one connector.

Statement 18. An embodiment of the inventive concept includes the PCIe switch with Erasure Coding logic according to statement 17, wherein the PCIe switch is operative to inform a user that the Erasure Coding Controller and the snooping logic are disabled based at least in part on the at least one non-storage device being connected to the PCIe switch using the at least one connector.

Statement 19. An embodiment of the inventive concept includes the PCIe switch with Erasure Coding logic according to statement 3, wherein the PCIe switch is operative to enable the Erasure Coding Controller and the snooping logic with the at least one NVMe SSD and block access to a non-storage device connected to the PCIe switch using the at least one connector.

Statement 20. An embodiment of the inventive concept includes the PCIe switch with Erasure Coding logic according to statement 19, wherein the PCIe switch is operative to inform a user that access to the non-storage device connected to the PCIe switch is blocked.

Statement 21. An embodiment of the inventive concept includes the PCIe switch with Erasure Coding logic according to statement 3, wherein the PCIe switch is operative to use the Erasure Coding Controller and the snooping logic to manage the Erasure Coding scheme on at least one additional NVMe SSD connected to a second PCIe switch.

Statement 22. An embodiment of the inventive concept includes the PCIe switch with Erasure Coding logic according to statement 21, wherein the second PCIe switch is operative to disable a second Erasure Coding Controller and second snooping logic in the second PCIe switch.

Statement 23. An embodiment of the inventive concept includes the PCIe switch with Erasure Coding logic according to statement 22, wherein:
the PCIe switch is located in a first chassis; and
the second PCIe switch is located in a second chassis.

Statement 24. An embodiment of the inventive concept includes the PCIe switch with Erasure Coding logic according to statement 3, wherein the PCIe switch is implemented using a Field Programmable Gate Array (FPGA).

Statement 25. An embodiment of the inventive concept includes the PCIe switch with Erasure Coding logic according to statement 3, wherein:
the at least one NVMe SSD includes at least two NVMe SSDs; and
the PCIe switch and the at least two NVMe SSDs are internal to a common housing.

Statement 26. An embodiment of the inventive concept includes the PCIe switch with Erasure Coding logic according to statement 3, wherein the PCIe switch and the at least one NVMe SSD are in separate housings.

Statement 27. An embodiment of the inventive concept includes the PCIe switch with Erasure Coding logic according to statement 3, wherein:
the PCIe switch is operative to detect a failed NVMe SSD of the at least one NVMe SSD; and
the Erasure Coding Controller is operative to handle the data transmission to account for the failed NVMe SSD.

Statement 28. An embodiment of the inventive concept includes the PCIe switch with Erasure Coding logic according to statement 27, wherein the Erasure Coding Controller is operative to perform Erasure Coding recovery of data stored on the failed NVMe SSD.

Statement 29. An embodiment of the inventive concept includes the PCIe switch with Erasure Coding logic according to statement 28, wherein the Erasure Coding Controller is operative to rebuild a replacement NVMe SSD for the failed NVMe SSD.

Statement 30. An embodiment of the inventive concept includes the PCIe switch with Erasure Coding logic according to statement 3, wherein:
the PCIe switch is operative to detect a new NVMe SSD; and
the Erasure Coding Controller is operative to use the new NVMe SSD as part of the Erasure Coding scheme.

Statement 31. An embodiment of the inventive concept includes the PCIe switch with Erasure Coding logic according to statement 30, wherein the Erasure Coding Controller is operative to perform capacity addition using the new NVMe SSD.

Statement 32. An embodiment of the inventive concept includes the PCIe switch with Erasure Coding logic according to statement 30, wherein the PCIe switch is operative to detect the new NVMe SSD connected to one of the at least one connector.

Statement 33. An embodiment of the inventive concept includes the PCIe switch with Erasure Coding logic according to statement 30, wherein the PCIe switch is operative to detect the new NVMe SSD via a message from a second PCIe switch.

Statement 34. An embodiment of the inventive concept includes the PCIe switch with Erasure Coding logic according to statement 33, wherein the new NVMe SSD is connected to a second connector on the second PCIe switch.

Statement 35. An embodiment of the inventive concept includes the PCIe switch with Erasure Coding logic according to statement 3, wherein the at least one connector include a presence pin to detect both a failed NVMe SSD and a new NVMe SSD.

Statement 36. An embodiment of the inventive concept includes the PCIe switch with Erasure Coding logic according to statement 3, wherein the PCIe switch is operative to present itself as a single device to a host and to prevent downstream PCIe bus enumeration of the at least one NVMe SSD.

Statement 37. An embodiment of the inventive concept includes the PCIe switch with Erasure Coding logic according to statement 36, wherein the PCIe switch is further operative to prevent downstream PCIe bus enumeration of a second PCIe switch downstream from the PCIe switch.

Statement 38. An embodiment of the inventive concept includes the PCIe switch with Erasure Coding logic according to statement 36, wherein the PCIe switch is operative to virtualize the at least one NVMe SSD.

Statement 39. An embodiment of the inventive concept includes the PCIe switch with Erasure Coding logic according to statement 3, wherein the Erasure Coding Controller is operative to initialize a new NVMe SSD connected to one of the at least one connector.

Statement 40. An embodiment of the inventive concept includes the PCIe switch with Erasure Coding logic according to statement 39, wherein the Erasure Coding Controller is operative to initialize the new NVMe SSD after a hot insertion event.

Statement 41. An embodiment of the inventive concept includes the PCIe switch with Erasure Coding logic according to statement 39, wherein the Erasure Coding Controller is further operative to initialize the at least one NVMe SSD at startup.

Statement 42. An embodiment of the inventive concept includes the PCIe switch with Erasure Coding logic according to statement 3, wherein the PCIe switch is part of a system including a Baseboard Management Controller (BMC) operative to initialize a new NVMe SSD connected to one of the at least one connector.

Statement 43. An embodiment of the inventive concept includes the PCIe switch with Erasure Coding logic according to statement 42, wherein the BMC is operative to initialize the at least one NVMe SSD at startup.

Statement 44. An embodiment of the inventive concept includes the PCIe switch with Erasure Coding logic according to statement 3, wherein the Erasure Coding Controller includes a stripe manager to stripe data across the at least one NVMe SSD.

Statement 45. An embodiment of the inventive concept includes a method, comprising:

receiving a transmission at a Peripheral Component Interconnect Express (PCIe) switch with Erasure Coding logic;

processing the transmission using a snooping logic in the Erasure Coding logic; and delivering the transmission to its destination by the PCIe switch.

Statement 46. An embodiment of the inventive concept includes the method according to statement 45, wherein the Erasure Coding logic is comprising at least one of a Look-Aside Erasure Coding logic and a Look-Through Erasure Coding logic.

Statement 47. An embodiment of the inventive concept includes the method according to statement 45, wherein:

processing the transmission using a snooping logic in the Erasure Coding logic includes determining that the transmission includes a control transmission by the snooping logic; and delivering the transmission to its destination by the PCIe switch includes delivering the transmission to a Power Processing Unit (PPU).

Statement 48. An embodiment of the inventive concept includes the method according to statement 45, wherein processing the transmission using a snooping logic in the Erasure Coding logic includes processing the transmission using the snooping logic based at least in part on the Erasure Coding logic being active.

Statement 49. An embodiment of the inventive concept includes the method according to statement 45, wherein:

receiving a transmission at a Peripheral Component Interconnect Express (PCIe) switch with Erasure Coding logic includes receiving a read request from a host;

processing the transmission using a snooping logic in the Erasure Coding logic includes replacing a host Logical Block Address (LBA) with a device LBA in the read request; and delivering the transmission to its destination by the PCIe switch includes delivering the read request to a Non-Volatile Memory Express (NVMe) Solid State Drive (SSD).

Statement 50. An embodiment of the inventive concept includes the method according to statement 49, wherein processing the transmission using a snooping logic in the Erasure Coding logic further includes identifying the NVMe SSD to which the read request should be delivered.

Statement 51. An embodiment of the inventive concept includes the method according to statement 49, wherein:

processing the transmission using a snooping logic in the Erasure Coding logic further includes accessing a data requested by the host in the read request from a cache based at least in part on the data being resident in the cache;

replacing a host Logical Block Address (LBA) with a device LBA in the read request includes replacing the host LBA with the device LBA in the read request based at least in part on the data not being resident in the cache; and delivering the transmission to its destination by the PCIe switch includes delivering the read request to an NVMe SSD based at least in part on the data not being resident in the cache.

Statement 52. An embodiment of the inventive concept includes the method according to statement 45, wherein:

receiving a transmission at a Peripheral Component Interconnect Express (PCIe) switch with Erasure Coding logic includes receiving a write request from a host;

processing the transmission using a snooping logic in the Erasure Coding logic includes replacing a host LBA with a device LBA in the write request; and delivering the transmission to its destination by the PCIe switch includes delivering the write request to an NVMe SSD.

Statement 53. An embodiment of the inventive concept includes the method according to statement 52, wherein processing the transmission using a snooping logic in the Erasure Coding logic further includes identifying the NVMe SSD to which the write request should be delivered.

Statement 54. An embodiment of the inventive concept includes the method according to statement 52, further comprising:

reading a stripe of blocks from at least one NVMe SSD;

merging data in the write request with the stripe of blocks to form an updated stripe of blocks; and writing the updated stripe of blocks to the at least one NVMe SSD.

Statement 55. An embodiment of the inventive concept includes the method according to statement 54, wherein merging data in the write request includes computing additional data to write to the at least one NVMe SSD in addition to the data in the write request.

Statement 56. An embodiment of the inventive concept includes the method according to statement 54, wherein:

the method further comprises reading the stripe of blocks from a cache based at least in part on the stripe of blocks being resident in the cache; and reading a stripe of blocks from at least one NVMe SSD includes reading a stripe of blocks from the at least one NVMe SSD based at least in part on the stripe of blocks not being resident in the cache.

Statement 57. An embodiment of the inventive concept includes the method according to statement 54, wherein writing the updated stripe of blocks to the at least one NVMe SSD includes writing the updated stripe of blocks to a write buffer.

Statement 58. An embodiment of the inventive concept includes the method according to statement 57, further comprising responding to the host that the write has completed after the updated stripe of blocks is written to the write buffer and before the updated stripe of blocks is written to the at least one NVMe SSD.

Statement 59. An embodiment of the inventive concept includes the method according to statement 45, wherein:

receiving a transmission at a Peripheral Component Interconnect Express (PCIe) switch with Erasure Coding logic includes receiving a response from an NVMe SSD;

processing the transmission using a snooping logic in the Erasure Coding logic includes replacing a device LBA in the response with a host LBA; and delivering the transmission to its destination by the PCIe switch includes delivering the response to a host.

Statement 60. An embodiment of the inventive concept includes the method according to statement 59, wherein processing the transmission using a snooping logic in the Erasure Coding logic further includes replacing an identifier of the NVMe SSD with an identifier of a virtual storage device.

Statement 61. An embodiment of the inventive concept includes the method according to statement 45, wherein delivering the transmission to its destination by the PCIe switch includes delivering the transmission to a second PCIe switch to which an NVMe SSD is connected, the NVMe SSD being the destination.

Statement 62. An embodiment of the inventive concept includes the method according to statement 61, wherein the PCIe switch is in a first chassis and the second PCIe switch is in a second chassis.

Statement 63. An embodiment of the inventive concept includes the method according to statement 45, further comprising initializing at least one NVMe SSD connected to the PCIe switch for use with Erasure Coding.

Statement 64. An embodiment of the inventive concept includes the method according to statement 45, further comprising:

detecting that a new NVMe SSD is connected to the PCIe switch; and adding the new NVMe SSD to the capacity of a virtual storage device.

Statement 65. An embodiment of the inventive concept includes the method according to statement 64, further comprising initializing the new NVMe SSD for use with Erasure Coding.

Statement 66. An embodiment of the inventive concept includes the method according to statement 45, further comprising:

detecting a failed NVMe SSD connected to the PCIe switch; and performing Erasure Coding recovery of data stored on the failed NVMe SSD.

Statement 67. An embodiment of the inventive concept includes the method according to statement 66, further comprising:

detecting a replacement NVMe SSD for the failed NVMe SSD; and rebuilding the failed NVMe SSD using the replacement NVMe SSD.

Statement 68. An embodiment of the inventive concept includes the method according to statement 45, further comprising:

detecting that only NVMe SSDs without Erasure Coding functionality are connected to the PCIe switch; and enabling the Erasure Coding logic in the PCIe switch.

Statement 69. An embodiment of the inventive concept includes the method according to statement 68, further comprising terminating PCIe bus enumeration downstream from the PCIe switch.

Statement 70. An embodiment of the inventive concept includes the method according to statement 68, further comprising reporting to a host a virtual storage device whose capacity is based at least in part on capacities of NVMe SSDs connected to the PCIe switch and an Erasure Coding scheme.

Statement 71. An embodiment of the inventive concept includes the method according to statement 45, further comprising:

detecting that at least one non-storage device or at least one NVMe SSD with Erasure Coding functionality is connected to the PCIe switch; and disabling the Erasure Coding logic in the PCIe switch.

Statement 72. An embodiment of the inventive concept includes the method according to statement 45, further comprising:

detecting that at least one non-storage device or at least one NVMe SSD with Erasure Coding functionality is connected to the PCIe switch;

enabling the Erasure Coding logic in the PCIe switch; and disabling the at least one non-storage device or the at least one NVMe SSD with Erasure Coding functionality.

Statement 73. An embodiment of the inventive concept includes the method according to statement 72, further comprising terminating PCIe bus enumeration downstream from the PCIe switch.

Statement 74. An embodiment of the inventive concept includes the method according to statement 72, further comprising reporting to a host a virtual storage device whose capacity is based at least in part on capacities of NVMe SSDs connected to the PCIe switch and an Erasure Coding scheme.

Statement 75. An embodiment of the inventive concept includes the method according to statement 45, further comprising configuring the PCIe switch with Erasure Coding logic to use an Erasure Coding scheme.

Statement 76. An embodiment of the inventive concept includes the method according to statement 75, wherein configuring the PCIe switch with Erasure Coding logic to use an Erasure Coding scheme includes configuring the PCIe switch with Erasure Coding logic to use the Erasure Coding scheme using a Baseboard Management Controller (BMC).

Statement 77. An embodiment of the inventive concept includes an article, comprising a non-transitory storage medium, the non-transitory storage medium having stored thereon instructions that, when executed by a machine, result in:

receiving a transmission at a Peripheral Component Interconnect Express (PCIe) switch with Erasure Coding logic;

processing the transmission using a snooping logic in the Erasure Coding logic; and delivering the transmission to its destination by the PCIe switch.

Statement 78. An embodiment of the inventive concept includes the article according to statement 77, wherein the Erasure Coding logic is comprising at least one of a Look-Aside Erasure Coding logic and a Look-Through Erasure Coding logic.

Statement 79. An embodiment of the inventive concept includes the article according to statement 77, wherein:

processing the transmission using a snooping logic in the Erasure Coding logic includes determining that the transmission includes a control transmission by the snooping logic; and delivering the transmission to its destination by the PCIe switch includes delivering the transmission to a Power Processing Unit (PPU).

Statement 80. An embodiment of the inventive concept includes the article according to statement 77, wherein processing the transmission using a snooping logic in the Erasure Coding logic includes processing the transmission using the snooping logic based at least in part on the Erasure Coding logic being active.

Statement 81. An embodiment of the inventive concept includes the article according to statement 77, wherein:

receiving a transmission at a Peripheral Component Interconnect Express (PCIe) switch with Erasure Coding logic includes receiving a read request from a host;

processing the transmission using a snooping logic in the Erasure Coding logic includes replacing a host Logical Block Address (LBA) with a device LBA in the read request; and delivering the transmission to its destination by the PCIe switch includes delivering the read request to a Non-Volatile Memory Express (NVMe) Solid State Drive (SSD).

Statement 82. An embodiment of the inventive concept includes the article according to statement 81, wherein processing the transmission using a snooping logic in the Erasure Coding logic further includes identifying the NVMe SSD to which the read request should be delivered.

Statement 83. An embodiment of the inventive concept includes the article according to statement 81, wherein:

processing the transmission using a snooping logic in the Erasure Coding logic further includes accessing a data requested by the host in the read request from a cache based at least in part on the data being resident in the cache;

replacing a host Logical Block Address (LBA) with a device LBA in the read request includes replacing the host LBA with the device LBA in the read request based at least in part on the data not being resident in the cache; and delivering the transmission to its destination by the PCIe switch includes delivering the read request to an NVMe SSD based at least in part on the data not being resident in the cache.

Statement 84. An embodiment of the inventive concept includes the article according to statement 77, wherein:

receiving a transmission at a Peripheral Component Interconnect Express (PCIe) switch with Erasure Coding logic includes receiving a write request from a host;

processing the transmission using a snooping logic in the Erasure Coding logic includes replacing a host LBA with a device LBA in the write request; and delivering the transmission to its destination by the PCIe switch includes delivering the write request to an NVMe SSD.

Statement 85. An embodiment of the inventive concept includes the article according to statement 84, wherein processing the transmission using a snooping logic in the Erasure Coding logic further includes identifying the NVMe SSD to which the write request should be delivered.

Statement 86. An embodiment of the inventive concept includes the article according to statement 84, the non-transitory storage medium having stored thereon further instructions that, when executed by the machine, result in:

reading a stripe of blocks from at least one NVMe SSD;

merging data in the write request with the stripe of blocks to form an updated stripe of blocks; and writing the updated stripe of blocks to the at least one NVMe SSD.

Statement 87. An embodiment of the inventive concept includes the article according to statement 86, wherein merging data in the write request includes computing additional data to write to the at least one NVMe SSD in addition to the data in the write request.

Statement 88. An embodiment of the inventive concept includes the article according to statement 86, wherein:

the non-transitory storage medium has stored thereon further instructions that, when executed by the machine, result in reading the stripe of blocks from a cache based at least in part on the stripe of blocks being resident in the cache; and reading a stripe of blocks from at least one NVMe SSD includes reading a stripe of blocks from the at least one NVMe SSD based at least in part on the stripe of blocks not being resident in the cache.

Statement 89. An embodiment of the inventive concept includes the article according to statement 86, wherein writing the updated stripe of blocks to the at least one NVMe SSD includes writing the updated stripe of blocks to a write buffer.

Statement 90. An embodiment of the inventive concept includes the article according to statement 89, the non-transitory storage medium having stored thereon further instructions that, when executed by the machine, result in responding to the host that the write has completed after the updated stripe of blocks is written to the write buffer and before the updated stripe of blocks is written to the at least one NVMe SSD.

Statement 91. An embodiment of the inventive concept includes the article according to statement 77, wherein:

receiving a transmission at a Peripheral Component Interconnect Express (PCIe) switch with Erasure Coding logic includes receiving a response from an NVMe SSD;

processing the transmission using a snooping logic in the Erasure Coding logic includes replacing a device LBA in the response with a host LBA; and delivering the transmission to its destination by the PCIe switch includes delivering the response to a host.

Statement 92. An embodiment of the inventive concept includes the article according to statement 91, wherein processing the transmission using a snooping logic in the Erasure Coding logic further includes replacing an identifier of the NVMe SSD with an identifier of a virtual storage device.

Statement 93. An embodiment of the inventive concept includes the article according to statement 77, wherein delivering the transmission to its destination by the PCIe switch includes delivering the transmission to a second PCIe switch to which an NVMe SSD is connected, the NVMe SSD being the destination.

Statement 94. An embodiment of the inventive concept includes the article according to statement 93, wherein the PCIe switch is in a first chassis and the second PCIe switch is in a second chassis.

Statement 95. An embodiment of the inventive concept includes the article according to statement 77, the non-transitory storage medium having stored thereon further instructions that, when executed by the machine, result in initializing at least one NVMe SSD connected to the PCIe switch for use with Erasure Coding.

Statement 96. An embodiment of the inventive concept includes the article according to statement 77, the non-transitory storage medium having stored thereon further instructions that, when executed by the machine, result in:

detecting that a new NVMe SSD is connected to the PCIe switch; and adding the new NVMe SSD to the capacity of a virtual storage device.

Statement 97. An embodiment of the inventive concept includes the article according to statement 96, the non-transitory storage medium having stored thereon further instructions that, when executed by the machine, result in initializing the new NVMe SSD for use with Erasure Coding.

Statement 98. An embodiment of the inventive concept includes the article according to statement 77, the non-transitory storage medium having stored thereon further instructions that, when executed by the machine, result in:

detecting a failed NVMe SSD connected to the PCIe switch; and performing Erasure Coding recovery of data stored on the failed NVMe SSD.

Statement 99. An embodiment of the inventive concept includes the article according to statement 98, the non-transitory storage medium having stored thereon further instructions that, when executed by the machine, result in:

detecting a replacement NVMe SSD for the failed NVMe SSD; and rebuilding the failed NVMe SSD using the replacement NVMe SSD.

Statement 100. An embodiment of the inventive concept includes the article according to statement 77, the non-transitory storage medium having stored thereon further instructions that, when executed by the machine, result in:

detecting that only NVMe SSDs without Erasure Coding functionality are connected to the PCIe switch; and enabling the Erasure Coding logic in the PCIe switch.

Statement 101. An embodiment of the inventive concept includes the article according to statement 100, the non-transitory storage medium having stored thereon further instructions that, when executed by the machine, result in terminating PCIe bus enumeration downstream from the PCIe switch.

Statement 102. An embodiment of the inventive concept includes the article according to statement 100, the non-transitory storage medium having stored thereon further instructions that, when executed by the machine, result in reporting to a host a virtual storage device whose capacity is based at least in part on capacities of NVMe SSDs connected to the PCIe switch and an Erasure Coding scheme.

Statement 103. An embodiment of the inventive concept includes the article according to statement 77, the non-transitory storage medium having stored thereon further instructions that, when executed by the machine, result in:

detecting that at least one non-storage device or at least one NVMe SSD with Erasure Coding functionality is connected to the PCIe switch; and disabling the Erasure Coding logic in the PCIe switch.

Statement 104. An embodiment of the inventive concept includes the article according to statement 77, the non-transitory storage medium having stored thereon further instructions that, when executed by the machine, result in:

detecting that at least one non-storage device or at least one NVMe SSD with Erasure Coding functionality is connected to the PCIe switch;

enabling the Erasure Coding logic in the PCIe switch; and disabling the at least one non-storage device or the at least one NVMe SSD with Erasure Coding functionality.

Statement 105. An embodiment of the inventive concept includes the article according to statement 104, the non-transitory storage medium having stored thereon further instructions that, when executed by the machine, result in terminating PCIe bus enumeration downstream from the PCIe switch.

Statement 106. An embodiment of the inventive concept includes the article according to statement 104, the non-transitory storage medium having stored thereon further instructions that, when executed by the machine, result in reporting to a host a virtual storage device whose capacity is based at least in part on capacities of NVMe SSDs connected to the PCIe switch and an Erasure Coding scheme.

Statement 107. An embodiment of the inventive concept includes the article according to statement 77, the non-transitory storage medium having stored thereon further instructions that, when executed by the machine, result in configuring the PCIe switch with Erasure Coding logic to use an Erasure Coding scheme.

Statement 108. An embodiment of the inventive concept includes the article according to statement 107, wherein configuring the PCIe switch with Erasure Coding logic to use an Erasure Coding scheme includes configuring the PCIe switch with Erasure Coding logic to use the Erasure Coding scheme using a Baseboard Management Controller (BMC).

Statement 109. An embodiment of the inventive concept includes a system, comprising:
a Non-Volatile Memory Express (NVMe) Solid State Drive (SSD);
a Field Programmable Gate Array (FPGA), the FPGA implementing one or more functions supporting the NVMe SSD, the functions comprising at least one of data acceleration, data deduplication, data integrity, data encryption, and data compression; and
a Peripheral Component Interconnect Express (PCIe) switch;
wherein the PCIe switch communicates with the FPGA and the NVMe SSD.

Statement 110. An embodiment of the inventive concept includes the system according to statement 109, wherein the FPGA and the NVMe SSD are internal to a common housing.

Statement 111. An embodiment of the inventive concept includes the system according to statement 110, wherein the PCIe switch is external to the common housing including the FPGA and the NVMe SSD.

Statement 112. An embodiment of the inventive concept includes the system according to statement 109, wherein:
the PCIe switch is connected to the FPGA; and
the FPGA is connected to the NVMe SSD.

Statement 113. An embodiment of the inventive concept includes the system according to statement 109, wherein:
the PCIe switch is connected to the NVMe SSD; and
the NVMe SSD is connected to the FPGA.

Statement 114. An embodiment of the inventive concept includes the system according to statement 109, wherein the PCIe switch includes an Erasure Coding logic, the Erasure Coding logic including an Erasure Coding controller.

Statement 115. An embodiment of the inventive concept includes the system according to statement 114, wherein the Erasure Coding logic is comprising at least one of a Look-Aside Erasure Coding logic and a Look-Through Erasure Coding logic.

Statement 116. An embodiment of the inventive concept includes the system according to statement 114, wherein the Erasure Coding logic is operative to return a response to a read request from a host based at least in part on a data requested in the read request is present in a cache.

Statement 117. An embodiment of the inventive concept includes the system according to statement 116, wherein the Erasure Coding logic further includes the cache.

Statement 118. An embodiment of the inventive concept includes the system according to statement 116, wherein:
the PCIe switch is located in a chassis; and
the chassis includes a memory used as the cache by the Erasure Coding logic.

Statement 119. An embodiment of the inventive concept includes the system according to statement 114, wherein the Erasure Coding logic is operative to return a response to a write request to a host before completing the write request.

Statement 120. An embodiment of the inventive concept includes the system according to statement 119, wherein:
the PCIe switch further comprises a write buffer; and
the Erasure Coding controller is operative to store a data in the write request in the write buffer.

Statement 121. An embodiment of the inventive concept includes the system according to statement 114, wherein the Erasure Coding logic includes a Look-Aside Erasure Coding logic, the Look-Aside Erasure Coding logic including a snooping logic.

Statement 122. An embodiment of the inventive concept includes the system according to statement 114, wherein the Erasure Coding logic is operative to intercept a control transmission received at the PCIe switch and forward the control transmission to a Power Processing Unit (PPU).

Statement 123. An embodiment of the inventive concept includes the system according to statement 114, wherein the Erasure Coding logic is operative to intercept a data transmission received at the PCIe switch from a host and replace a host Logical Block Address (LBA) used by the host in the data transmission with a device LBA used by the NVMe SSD.

Statement 124. An embodiment of the inventive concept includes the system according to statement 123, wherein the Erasure Coding logic is further operative to direct the data transmission to the NVMe SSD.

Statement 125. An embodiment of the inventive concept includes the system according to statement 114, wherein the Erasure Coding logic is operative to intercept a data transmission received at the PCIe switch from the NVMe SSD and replace a device LBA used by the NVMe SSD in the data transmission with a host LBA used by a host.

Statement 126. An embodiment of the inventive concept includes the system according to statement 114, wherein the Erasure Coding logic defines a virtual storage device spanning the NVMe SSD and a second NVMe SSD.

Statement 127. An embodiment of the inventive concept includes the system according to statement 114, wherein the PCIe switch is operative to enable the Erasure Coding logic based at least in part on the NVMe SSD being usable with the Erasure Coding logic.

Statement 128. An embodiment of the inventive concept includes the system according to statement 114, further comprising a second device connected to the PCIe switch with Erasure Coding logic.

Statement 129. An embodiment of the inventive concept includes the system according to statement 128, wherein the second device is comprising at least one of a storage device, an SSD with Field Programmable Gate Array (FPGA), and a Graphics Processing Unit (GPU).

Statement 130. An embodiment of the inventive concept includes the system according to statement 128, wherein:
the second device is not usable with the Erasure Coding logic; and
the PCIe switch is operative to disable the Erasure Coding logic based at least in part on the second device not being usable with the Erasure Coding logic.

Statement 131. An embodiment of the inventive concept includes the system according to statement 128, wherein:
the second device is not usable with the Erasure Coding logic; and
the PCIe switch is operative to enable the Erasure Coding logic based at least in part on NVMe SSD being usable with the Erasure Coding logic and to enable access to the second device without using the Erasure Coding logic.

Statement 132. An embodiment of the inventive concept includes the system according to statement 128, wherein:

the second device is not usable with the Erasure Coding logic; and the PCIe switch is operative to enable the Erasure Coding logic based at least in part on NVMe SSD being usable with the Erasure Coding logic and to disable access to the second device.

Statement 133. An embodiment of the inventive concept includes a system, comprising:

a Non-Volatile Memory Express (NVMe) Solid State Drive (SSD); and a Field Programmable Gate Array (FPGA), the FPGA including a first FPGA part and a second FPGA part, the first FPGA part implementing one or more functions supporting the NVMe SSD, the functions comprising at least one of data acceleration, data deduplication, data integrity, data encryption, and data compression, and the second FPGA part implementing a Peripheral Component Interconnect Express (PCIe) switch, wherein the PCIe switch communicates with the FPGA and the NVMe SSD, and wherein the FPGA and the NVMe SSD are internal to a common housing.

Statement 134. An embodiment of the inventive concept includes the system according to statement 133, wherein the PCIe switch includes an Erasure Coding logic, the Erasure Coding logic including an Erasure Coding controller.

Statement 135. An embodiment of the inventive concept includes the system according to statement 134, wherein the Erasure Coding logic defines a virtual storage device spanning at least two parts of the NVMe SSD.

Statement 136. An embodiment of the inventive concept includes the system according to statement 134, wherein the Erasure Coding logic defines a virtual storage device spanning the NVMe SSD and a second NVMe SSD.

Statement 137. An embodiment of the inventive concept includes the system according to statement 136, wherein the second NVMe SSD is internal to the common housing.

Statement 138. An embodiment of the inventive concept includes the system according to statement 136, wherein the second NVMe SSD is external to the common housing.

Statement 139. An embodiment of the inventive concept includes the system according to statement 134, wherein the Erasure Coding logic is comprising at least one of a Look-Aside Erasure Coding logic and a Look-Through Erasure Coding logic.

Statement 140. An embodiment of the inventive concept includes the system according to statement 134, wherein the Erasure Coding logic is operative to return a response to a read request from a host based at least in part on a data requested in the read request is present in a cache.

Statement 141. An embodiment of the inventive concept includes the system according to statement 140, wherein the FPGA further includes the cache.

Statement 142. An embodiment of the inventive concept includes the system according to statement 140, wherein:

the common housing is located in a chassis; and the chassis includes a memory used as the cache by the Erasure Coding logic.

Statement 143. An embodiment of the inventive concept includes the system according to statement 134, wherein the Erasure Coding logic is operative to return a response to a write request to a host before completing the write request.

Statement 144. An embodiment of the inventive concept includes the system according to statement 143, wherein:

the FPGA further comprises a write buffer; and the Erasure Coding controller is operative to store a data in the write request in the write buffer.

Statement 145. An embodiment of the inventive concept includes the system according to statement 134, wherein the Erasure Coding logic includes a Look-Aside Erasure Coding logic, the Look-Aside Erasure Coding logic including a snooping logic.

Statement 146. An embodiment of the inventive concept includes the system according to statement 145, wherein the snooping logic is operative to intercept a control transmission received at the PCIe switch and forward the control transmission to a Power Processing Unit (PPU).

Statement 147. An embodiment of the inventive concept includes the system according to statement 134, wherein the Erasure Coding logic is operative to intercept a data transmission received at the PCIe switch from a host and replace a host Logical Block Address (LBA) used by the host in the data transmission with a device LBA used by the NVMe SSD.

Statement 148. An embodiment of the inventive concept includes the system according to statement 147, wherein the Erasure Coding logic is further operative to direct the data transmission to the NVMe SSD.

Statement 149. An embodiment of the inventive concept includes the system according to statement 134, wherein the Erasure Coding logic is operative to intercept a data transmission received at the PCIe switch from the NVMe SSD and replace a device LBA used by the NVMe SSD in the data transmission with a host LBA used by a host.

Statement 150. An embodiment of the inventive concept includes the system according to statement 134, wherein the PCIe switch with Erasure Coding logic is operative to enable the Erasure Coding logic based at least in part on the NVMe SSD being usable with the Erasure Coding logic.

Statement 151. An embodiment of the inventive concept includes the system according to statement 134, wherein the PCIe switch with Erasure Coding logic is operative to disable the Erasure Coding logic based at least in part on the NVMe SSD not being usable with the Erasure Coding logic.

Statement 152. An embodiment of the inventive concept includes a system, comprising:

a Non-Volatile Memory Express (NVMe) Solid State Drive (SSD); and a Peripheral Component Interconnect Express (PCIe) switch with Erasure Coding logic, including:

an external connector to enable the PCIe switch to communicate with a processor;

at least one connector to enable the PCIe switch to communicate with the NVMe SSD;
a Power Processing Unit (PPU) to configure the PCIe switch; and
an Erasure Coding controller including circuitry to apply an Erasure Coding scheme to data stored on the NVMe SSD.

Statement 153. An embodiment of the inventive concept includes the system according to statement 152, wherein:
the system further comprises a second NVMe SSD; and
the PCIe switch with Erasure Coding logic includes a second connector to enable the PCIe switch with Erasure Coding logic to communicate with the second NVMe SSD.

Statement 154. An embodiment of the inventive concept includes the system according to statement 152, wherein:
the system further comprises:
a second NVMe SSD; and
a second PCIe switch including:
a second external connector to enable the second PCIe switch to communicate with the processor;
a second connector to enable the second PCIe switch to communicate with the second NVMe SSD; and
a third connector to enable the second PCIe switch to communicate with the PCIe switch with Erasure Coding logic; and
the PCIe switch with Erasure Coding logic includes a fourth connector to enable the PCIe switch with Erasure Coding logic to communicate with the second PCIe switch,
wherein the Erasure Coding scheme is applied to data stored on the NVMe SSD and the second NVMe SSD.

Statement 155. An embodiment of the inventive concept includes the system according to statement 154, wherein the second PCIe switch further includes a disabled second Erasure Coding logic.

Statement 156. An embodiment of the inventive concept includes the system according to statement 152, wherein the Erasure Coding logic is comprising at least one of a Look-Aside Erasure Coding logic and a Look-Through Erasure Coding logic.

Statement 157. An embodiment of the inventive concept includes the system according to statement 152, wherein the Erasure Coding logic is operative to return a response to a read request from a host based at least in part on a data requested in the read request is present in a cache.

Statement 158. An embodiment of the inventive concept includes the system according to statement 157, wherein the Erasure Coding logic further includes the cache.

Statement 159. An embodiment of the inventive concept includes the system according to statement 157, wherein:
the PCIe switch with Erasure Coding logic is located in a chassis; and
the chassis includes a memory used as the cache by the Erasure Coding logic.

Statement 160. An embodiment of the inventive concept includes the system according to statement 152, wherein the Erasure Coding logic is operative to return a response to a write request to a host before completing the write request.

Statement 161. An embodiment of the inventive concept includes the system according to statement 160, wherein:
the PCIe switch with Erasure Coding logic further comprises a write buffer; and
the Erasure Coding controller is operative to store a data in the write request in the write buffer.

Statement 162. An embodiment of the inventive concept includes the system according to statement 152, wherein the Erasure Coding logic includes a Look-Aside Erasure Coding logic, the Look-Aside Erasure Coding logic including a snooping logic.

Statement 163. An embodiment of the inventive concept includes the system according to statement 152, wherein the Erasure Coding logic is operative to intercept a control transmission received at the PCIe switch and forward the control transmission to a Power Processing Unit (PPU).

Statement 164. An embodiment of the inventive concept includes the system according to statement 152, wherein the Erasure Coding logic is operative to intercept a data transmission received at the PCIe switch from a host and replace a host Logical Block Address (LBA) used by the host in the data transmission with a device LBA used by the NVMe SSD.

Statement 165. An embodiment of the inventive concept includes the system according to statement 164, wherein the Erasure Coding logic is further operative to direct the data transmission to the NVMe SSD.

Statement 166. An embodiment of the inventive concept includes the system according to statement 152, wherein the Erasure Coding logic is operative to intercept a data transmission received at the PCIe switch from the NVMe SSD and replace a device LBA used by the NVMe SSD in the data transmission with a host LBA used by a host.

Statement 167. An embodiment of the inventive concept includes the system according to statement 152, wherein the Erasure Coding logic defines a virtual storage device spanning the NVMe SSD and a second NVMe SSD.

Statement 168. An embodiment of the inventive concept includes the system according to statement 152, wherein the PCIe switch with Erasure Coding logic is operative to enable the Erasure Coding logic based at least in part on the NVMe SSD being usable with the Erasure Coding logic.

Statement 169. An embodiment of the inventive concept includes the system according to statement 152, further comprising a second device connected to the PCIe switch with Erasure Coding logic.

Statement 170. An embodiment of the inventive concept includes the system according to statement 169, wherein the second device is comprising at least one of a storage device, an SSD with Field Programmable Gate Array (FPGA), and a Graphics Processing Unit (GPU).

Statement 171. An embodiment of the inventive concept includes the system according to statement 169, wherein:
the second device is not usable with the Erasure Coding logic; and
the PCIe switch with Erasure Coding logic is operative to disable the Erasure Coding logic based at least in part on the second device not being usable with the Erasure Coding logic.

Statement 172. An embodiment of the inventive concept includes the system according to statement 169, wherein:
the second device is not usable with the Erasure Coding logic; and
the PCIe switch with Erasure Coding logic is operative to enable the Erasure Coding logic based at least in part on NVMe SSD being usable with the Erasure Coding logic and to enable access to the second device without using the Erasure Coding logic.

Statement 173. An embodiment of the inventive concept includes the system according to statement 169, wherein:
the second device is not usable with the Erasure Coding logic; and
the PCIe switch with Erasure Coding logic is operative to enable the Erasure Coding logic based at least in part on NVMe SSD being usable with the Erasure Coding logic and to disable access to the second device.

Consequently, in view of the wide variety of permutations to the embodiments described herein, this detailed description and accompanying material is intended to be illustrative only, and should not be taken as limiting the scope of the inventive concept. What is claimed as the inventive concept, therefore, is all such modifications as may come within the scope and spirit of the following claims and equivalents thereto.

What is claimed is:

1. A system, comprising:
a first Non-Volatile Memory Express (NVMe) Solid State Drive (SSD);
a second NVMe SSD;
a Field Programmable Gate Array (FPGA), the FPGA implementing one or more functions supporting the first NVMe SSD, the functions comprising at least one of data acceleration, data deduplication, data integrity, data encryption, and data compression, and including a Peripheral Component Interconnect Express (PCIe) switch, the PCIe switch including a processing circuit configured to direct an NVMe storage command, sent to the system, to the FPGA;
wherein the PCIe switch communicates with the FPGA and is connected to the first NVMe SSD, and
wherein the PCIe switch receives the NVMe storage command sent to the system and delivers the NVME storage command to the FPGA based at least in part on the processing circuit.

2. The system according to claim 1, wherein the FPGA includes an Erasure Coding circuit, the Erasure Coding circuit including an Erasure Coding controller.

3. The system according to claim 2, wherein the Erasure Coding circuit is configured to return a response to a read request from the host based at least in part on a data requested in the read request is present in a cache.

4. The system according to claim 2, wherein the Erasure Coding circuit is configured to return a response to a write request to the host independent of completing the write request.

5. The system according to claim 2, wherein the Erasure Coding circuit includes a Look-Aside Erasure Coding circuit, the Look-Aside Erasure Coding circuit including the processing circuit.

6. The system according to claim 2, wherein the Erasure Coding circuit is configured to intercept a data transmission received at the FPGA from the host and replace a host Logical Block Address (LBA) used by the host in the data transmission with a device LBA used by the first NVMe SSD.

7. The system according to claim 2, wherein the FPGA is configured to enable the Erasure Coding circuit based at least in part on the NVMe SSD not including a native Erasure Coding circuit.

8. The system according to claim 2, further comprising a second device connected to the FPGA with Erasure Coding circuit.

9. The system according to claim 8, wherein:
the second device comprises at least one of a non-storage device and a storage device with a native Erasure Coding circuit; and
the FPGA is configured to disable the Erasure Coding circuit based at least in part on the second device.

10. The system according to claim 8, wherein:
the second device comprises at least one of a non-storage device and a storage device with a native Erasure Coding circuit; and
the FPGA is configured to enable the Erasure Coding circuit based at least in part on the first NVMe SSD not including a native Erasure Coding circuit and to enable access to the second device without using the Erasure Coding circuit.

11. A system, comprising:
a first Non-Volatile Memory Express (NVMe) Solid State Drive (SSD);
a second NVMe SSD; and
a Field Programmable Gate Array (FPGA), the FPGA including a first FPGA part and a second FPGA part, the first FPGA part implementing one or more functions supporting the first NVMe SSD, the functions comprising at least one of data acceleration, data deduplication, data integrity, data encryption, and data compression, and the second FPGA part implementing a Peripheral Component Interconnect Express (PCIe) switch, the PCIe switch including a processing circuit configured to direct an NVMe storage command, sent to the system, to the FPGA,
wherein the PCIe switch communicates with the first FPGA part and is connected to the first NVMe SSD,
wherein the PCIe switch receives the NVMe storage command sent to the system and delivers the NVMe storage command to the first FPGA part based at least in part on the processing circuit, and wherein the first FPGA part, the PCIe switch, the first NWMe SSD and the second NVMe SSD are internal to a common housing.

12. The system according to claim 11, wherein the FPGA includes an Erasure Coding circuit, the Erasure Coding circuit including an Erasure Coding controller.

13. The system according to claim 12, wherein the Erasure Coding includes at least one of a Look-Aside Erasure Coding or a Look-Through Erasure Coding circuit.

14. The system according to claim 12, wherein the Erasure Coding circuit is configured to return a response to a read request from the host based at least in part on a data requested in the read request is present in a cache.

15. The system according to claim 12, wherein the Erasure Coding circuit is configured to return a response to a write request to the host independent of completing the write request.

16. The system according to claim 12, wherein the Erasure Coding circuit includes a Look-Aside Erasure Coding circuit, the Look-Aside Erasure Coding circuit including the processing circuit.

17. The system according to claim 12, wherein the Erasure Coding circuit is configured to intercept a data transmission received at the FPGA from the host and replace a host Logical Block Address (LBA) used by the host in the data transmission with a device LBA used by the first NVMe SSD.

18. The system according to claim 12, wherein the Erasure Coding circuit is configured to intercept a data transmission received at the FPGA from the first NVMe SSD and replace a device LBA used by the first NVMe SSD in the data transmission with a host LBA used by the host.

19. The system according to claim 12, wherein the FPGA with Erasure Coding circuit is to enable the Erasure Coding circuit based at least in part on the first NVMe SSD not including a native Erasure Coding circuit.

20. The system according to claim 12, wherein the FPGA with Erasure Coding circuit is to disable the Erasure Coding circuit based at least in part on the first NVMe SSD including a native Erasure Coding circuit.

21. The system according to claim 8, wherein the NVMe SSD and the second device are in separate housings.

22. A system, comprising:
a first Non-Volatile Memory Express (NVMe) Solid State Drive (SSD);
a second NVMe SSD;
a Field Programmable Gate Array (FPGA), the FPGA implementing one or more functions supporting the first NVMe SSD, the functions comprising at least one of data deduplication, data encryption, and data compression, the FPGA including a Peripheral Component Interconnect Express (PCIe) switch, the PCIe switch including a processing circuit configured to direct an NVMe storage command, sent to the system, to the FPGA;
wherein the PCIe switch communicates with the FPGA and is connected to the first NVMe SSD, and wherein the PCIe switch receives the NVMe storage command sent to the first NVMe SSD and delivers the NVMe storage command to the FPGA based at least in part on the processing circuit.

23. The system according to claim 22, further comprising a common housing including the first NVMe SSD, the second NVMe SSD, the FPGA, and the PCIe switch.

24. The system according to claim 1, further comprising a common housing including the first NVMe SSD, the second NVMe SSD, the FPGA, and the PCIe switch.

25. The system according to claim 1, wherein the NVMe storage command is associated with a storage operation for data storage on the first NVMe SSD.

26. The system according to claim 1, wherein the FPGA the first NVMe SSD, and the second NVMe SSD are exposed to the host as a single device.

27. The system according to claim 26, wherein the single device is exposed to the host as an NVMe storage device.

28. The system according to claim 1, wherein the PCIe switch is configured to direct a second NVMe storage command to the first NVMe SSD based at least in part on the processing circuit.

* * * * *